US009917209B2

United States Patent
Endo et al.

(10) Patent No.: US 9,917,209 B2
(45) Date of Patent: Mar. 13, 2018

(54) MANUFACTURING METHOD OF SEMICONDUCTOR DEVICE INCLUDING STEP OF FORMING TRENCH OVER SEMICONDUCTOR

(71) Applicant: Semiconductor Energy Laboratory Co., Ltd., Atsugi-shi, Kanagawa-ken (JP)

(72) Inventors: Yuta Endo, Kanagawa (JP); Hideomi Suzawa, Kanagawa (JP); Sachiaki Tezuka, Kanagawa (JP); Tetsuhiro Tanaka, Tokyo (JP); Toshiya Endo, Kanagawa (JP); Mitsuhiro Ichijo, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/192,312

(22) Filed: Jun. 24, 2016

(65) Prior Publication Data

US 2017/0005203 A1    Jan. 5, 2017

(30) Foreign Application Priority Data

Jul. 3, 2015   (JP) ................. 2015-134341

(51) Int. Cl.
*H01L 29/78* (2006.01)
*H01L 29/786* (2006.01)
*H01L 29/66* (2006.01)

(52) U.S. Cl.
CPC .. *H01L 29/78696* (2013.01); *H01L 29/66742* (2013.01); *H01L 29/66969* (2013.01);
(Continued)

(58) Field of Classification Search
CPC ......... H01L 29/78696; H01L 29/66742; H01L 29/66969; H01L 29/78648;
(Continued)

(56) References Cited

U.S. PATENT DOCUMENTS 5,528,032 A   6/1996 Uchiyama
5,731,856 A   3/1998 Kim et al.
(Continued)

FOREIGN PATENT DOCUMENTS

EP   1737044 A   12/2006
EP   2226847 A    9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Scott B Geyer
(74) *Attorney, Agent, or Firm* — Fish & Richardson P.C.

(57) ABSTRACT

A miniaturized transistor is provided. A first layer is formed over a third insulator over a semiconductor; a second layer is formed over the first layer; an etching mask is formed over the second layer; the second layer is etched using the etching mask until the first layer is exposed to form a third layer; a selective growth layer is formed on a top surface and a side surface of the third layer; the first layer is etched using the third layer and the selective growth layer until the third insulator is exposed to form a fourth layer; and the third insulator is etched using the third layer, the selective growth layer, and the fourth layer until the semiconductor is exposed to form a first insulator.

10 Claims, 63 Drawing Sheets

(52) U.S. Cl.
CPC .... *H01L 29/7869* (2013.01); *H01L 29/78648* (2013.01); *H01L 29/78651* (2013.01)

(58) Field of Classification Search
CPC .......... H01L 29/78651; H01L 29/7869; H01L 21/02697; H01L 21/02107–21/02362
See application file for complete search history.

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2015/0372009 A1 | 12/2015 | Yamazaki |
| 2016/0218219 A1 | 7/2016 | Asami et al. |
| 2016/0218225 A1 | 7/2016 | Yamazaki |
| 2016/0233339 A1 | 8/2016 | Okazaki |
| 2016/0233340 A1 | 8/2016 | Shimomura et al. |
| 2016/0233343 A1 | 8/2016 | Miyairi |
| 2016/0240684 A1 | 8/2016 | Yamazaki et al. |
| 2016/0247832 A1 | 8/2016 | Suzawa et al. |
| 2016/0247929 A1 | 8/2016 | Noda |
| 2016/0260822 A1 | 9/2016 | Okamoto et al. |
| 2016/0260838 A1 | 9/2016 | Yamazaki |
| 2016/0268436 A1 | 9/2016 | Asami |
| 2016/0284862 A1 | 9/2016 | Yamazaki et al. |
| 2016/0300952 A1 | 10/2016 | Toriumi et al. |
| 2016/0336454 A1 | 11/2016 | Endo |
| 2017/0012139 A1 | 1/2017 | Sasagawa et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-086923 A | 4/2011 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

(56) References Cited

OTHER PUBLICATIONS

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2008, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

(56) References Cited

OTHER PUBLICATIONS

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amoprhous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

406a, 406b, 416

410, 420, 425

425 420 410

406a, 406b, 416       411, 426

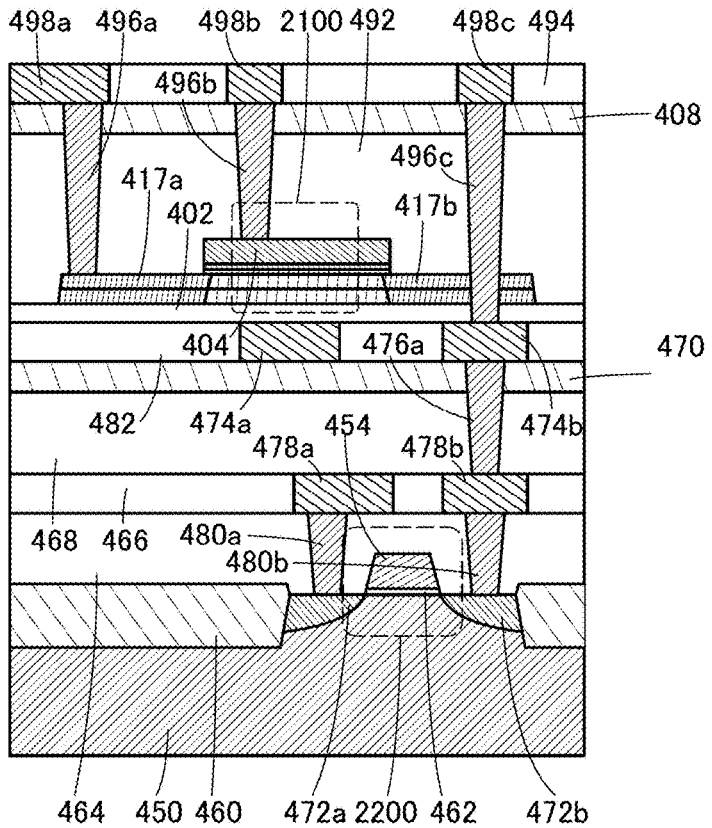
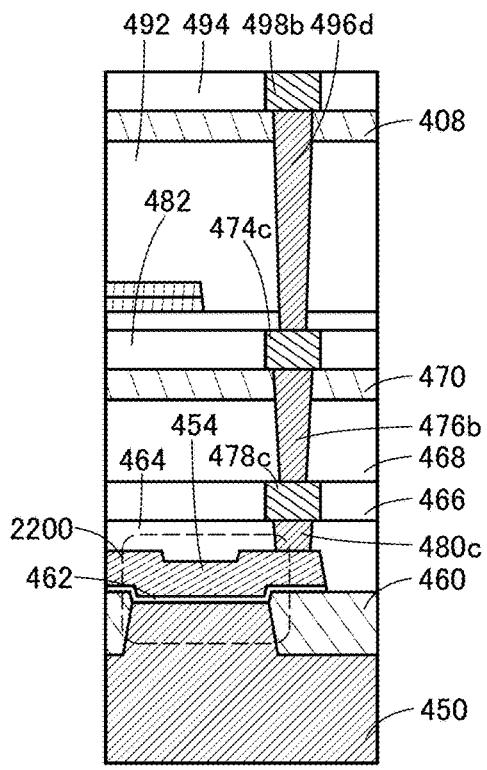
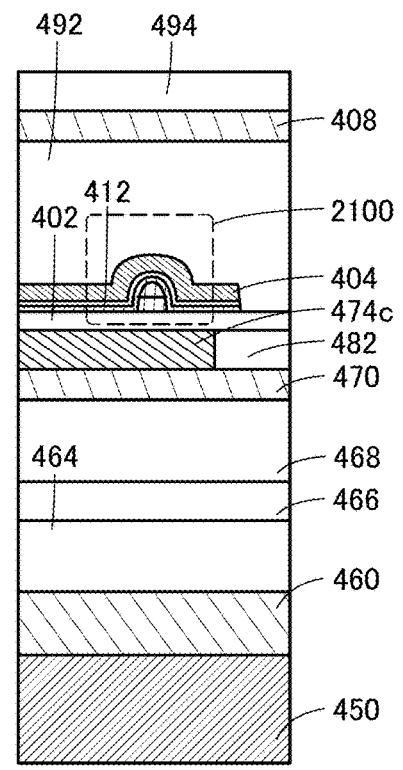
FIG. 38A
FIG. 38B
FIG. 38C

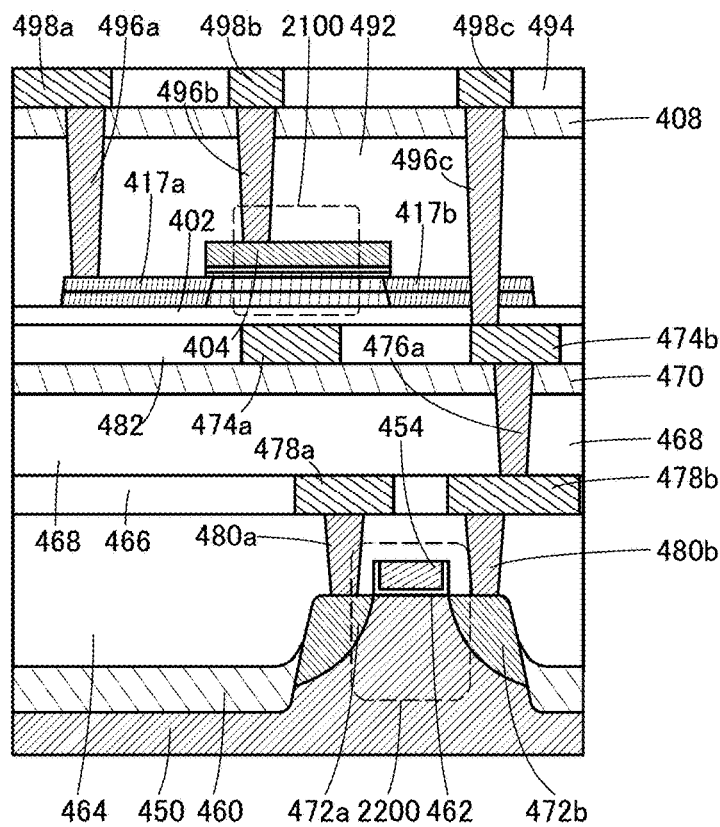
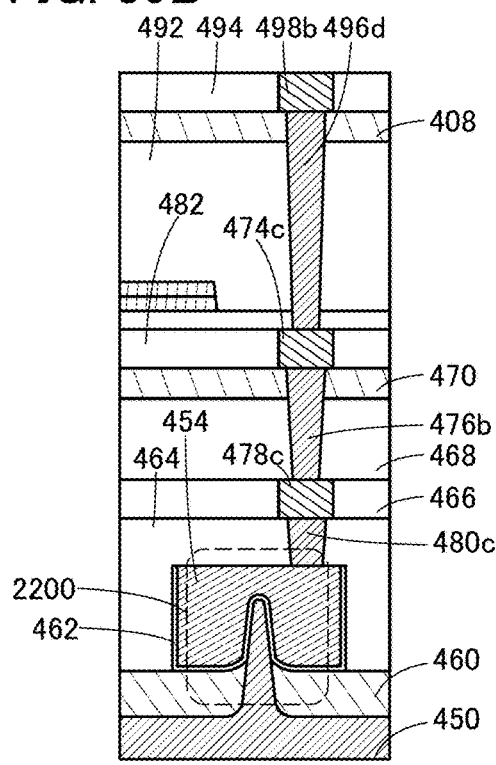
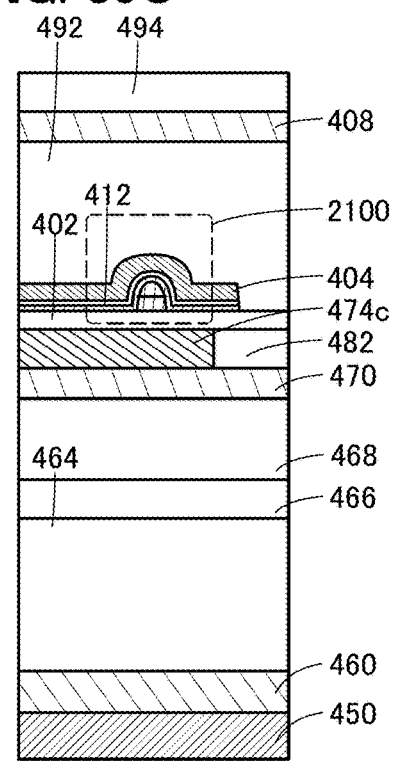
FIG. 39A
FIG. 39B
FIG. 39C

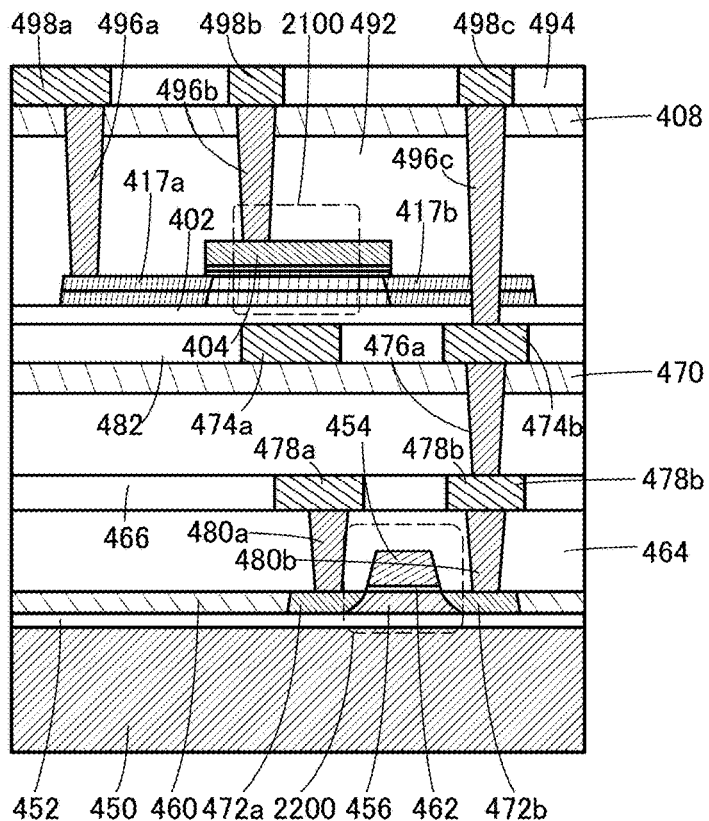
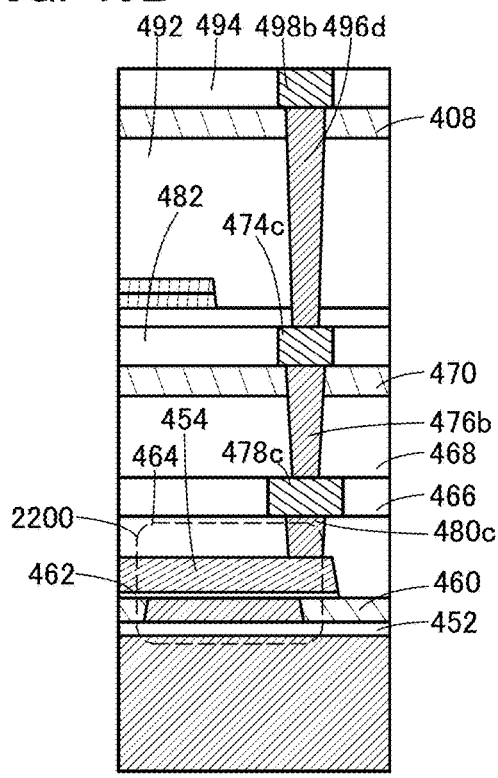
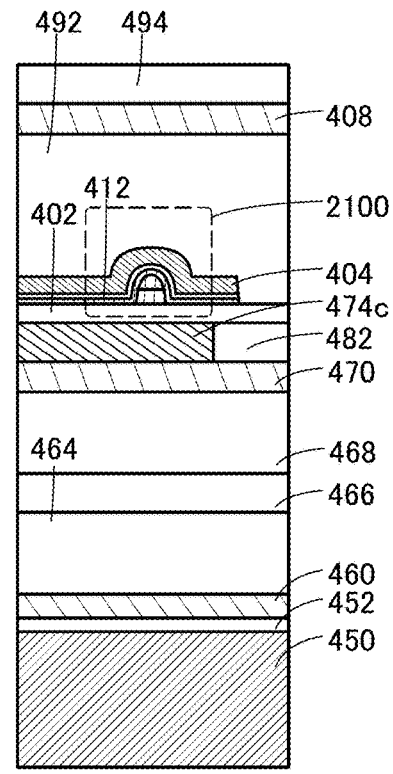
FIG. 40A
FIG. 40B
FIG. 40C

FIG. 50A1
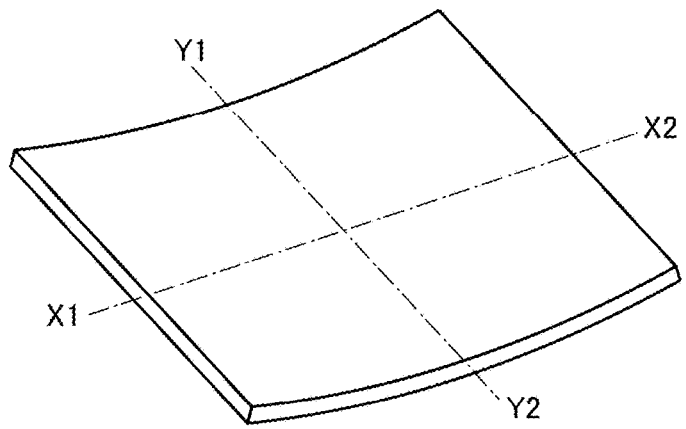
FIG. 50A2
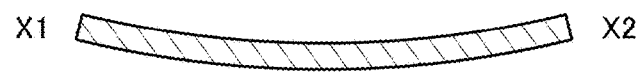
FIG. 50A3
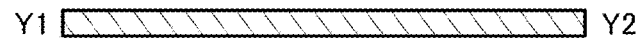
FIG. 50B1
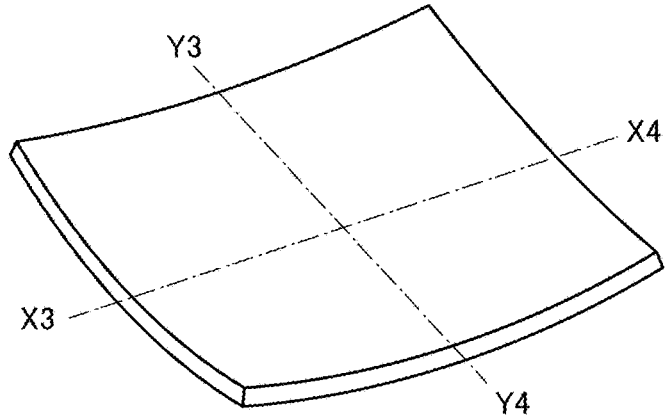
FIG. 50B2
FIG. 50B3
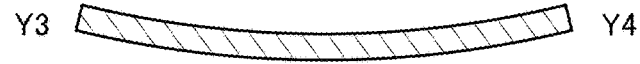

FIG. 58A1 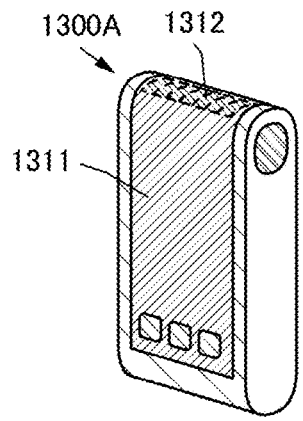
FIG. 58A2 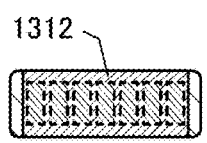
FIG. 58A3 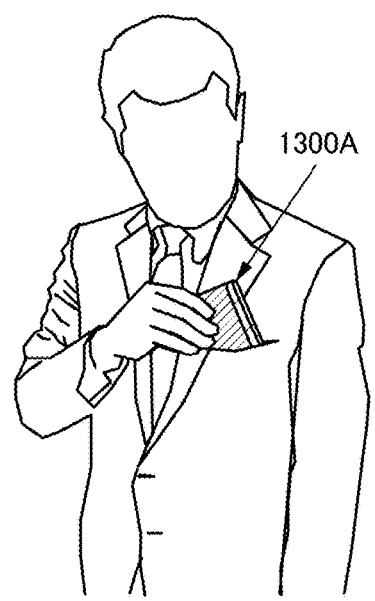
FIG. 58B1 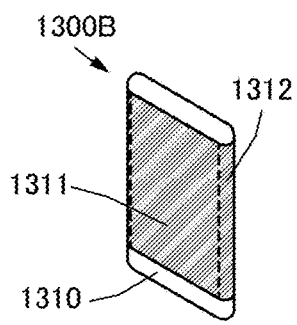
FIG. 58B2 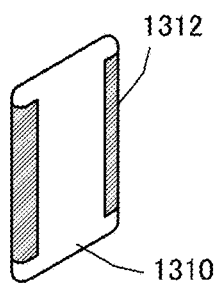
FIG. 58C1 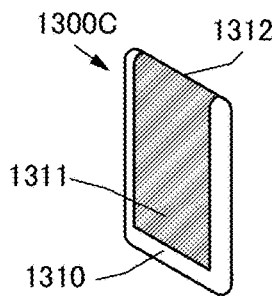
FIG. 58C2 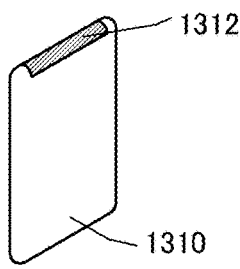

substrate derivation

MANUFACTURING METHOD OF SEMICONDUCTOR DEVICE INCLUDING STEP OF FORMING TRENCH OVER SEMICONDUCTOR

BACKGROUND OF THE INVENTION

1. Field of the Invention

One embodiment of the present invention relates to a semiconductor device and a manufacturing method thereof. The present invention relates to, for example, a transistor, a semiconductor device, and manufacturing methods thereof. The present invention relates to, for example, a display device, a light-emitting device, a lighting device, a power storage device, a memory device, an imaging device, a processor, or an electronic device. The present invention relates to a method for manufacturing a display device, a liquid crystal display device, a light-emitting device, a memory device, or an electronic device. The present invention relates to a driving method of a semiconductor device, a display device, a liquid crystal display device, a light-emitting device, a memory device, or an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an imaging device, an electro-optical device, a semiconductor circuit, and an electronic device include a semiconductor device in some cases.

2. Description of the Related Art

A technique for forming a transistor by using a semiconductor over a substrate having an insulating surface has attracted attention. The transistor is applied to a wide range of semiconductor devices such as an integrated circuit and a display device. Silicon is known as a semiconductor applicable to a transistor.

As silicon which is used as a semiconductor of a transistor, either amorphous silicon or polycrystalline silicon is used depending on the purpose. For example, in the case of a transistor included in a large display device, it is preferable to use amorphous silicon, which can be used to form a film on a large substrate with the established technique. In the case of a transistor included in a high-performance display device where a driver circuit and a pixel circuit are formed over the same substrate, it is preferred to use polycrystalline silicon, which can form a transistor having high field-effect mobility. As a method for forming polycrystalline silicon, high-temperature heat treatment or laser light treatment which is performed on amorphous silicon has been known.

In recent years, transistors including oxide semiconductors (typically, In—Ga—Zn oxide) have been actively developed.

Oxide semiconductors have been researched since early times. In 1988, it was disclosed to use a crystal In—Ga—Zn oxide for a semiconductor element (see Patent Document 1). In 1995, a transistor including an oxide semiconductor was invented, and its electrical characteristics were disclosed (see Patent Document 2).

In 2010, a transistor containing a crystalline In—Ga—Zn oxide that has more excellent electrical characteristics and higher reliability than a transistor containing an amorphous In—Ga—Zn oxide has been developed (see Patent Document 3). The crystalline In—Ga—Zn oxide has c-axis alignment and thus is called a c-axis aligned crystalline oxide semiconductor (CAAC-OS) or the like.

REFERENCE

Patent Documents

[Patent Document 1] Japanese Published Patent Application No. S63-239117
[Patent Document 2] Japanese translation of PCT international application No. H11-505377
[Patent Document 3] Japanese Published Patent Application No. 2011-086923

SUMMARY OF THE INVENTION

An object is to provide a miniaturized transistor. Another object is to provide a transistor with favorable electrical characteristics. Another object is to provide a transistor with stable electrical characteristics. Another object is to provide a transistor with high frequency characteristics. Another object is to provide a transistor with low off-state current. Another object is to provide a semiconductor device including any of the transistors. Another object is to provide a module including the semiconductor device. Another object is to provide an electronic device including the semiconductor device or the module.

Note that the descriptions of these objects do not preclude the existence of other objects. In one embodiment of the present invention, there is no need to achieve all the objects. Other objects will be apparent from and can be derived from the descriptions of the specification, the drawings, the claims, and the like.

(1) One embodiment of the present invention is a method for manufacturing a semiconductor device including a semiconductor, a first insulator, a second insulator, a first conductor, and an opening. The method includes the steps of forming a first layer over a third insulator over the semiconductor, forming a second layer over the first layer, forming an etching mask over the second layer, etching the second layer using the etching mask until the first layer is exposed to form a third layer, forming a selective growth layer on a top surface and a side surface of the third layer, etching the first layer using the third layer and the selective growth layer until the third insulator is exposed to form a fourth layer, and etching the third insulator using the third layer, the selective growth layer, and the fourth layer until the semiconductor is exposed to form the first insulator. The first insulator is provided over the semiconductor; the opening overlaps with part of the semiconductor and penetrates the first insulator; the second insulator includes a region in contact with a side surface and a bottom surface of the opening; and the first conductor overlaps with the semiconductor with the second insulator positioned between the first conductor and the semiconductor.

(2) One embodiment of the present invention is a method for manufacturing a semiconductor device including a semiconductor, a first insulator, a second insulator, a first conductor, a second conductor, a third conductor, and an opening. The method includes the steps of forming a first layer over a fourth conductor over the semiconductor and a third insulator over the fourth conductor, forming a second layer over the first layer, forming an etching mask over the second layer, etching the second layer using the etching mask until the first layer is exposed to form a third layer, forming a selective growth layer on a top surface and a side surface of the third layer, etching the first layer using the third layer and the selective growth layer until the third insulator is exposed to form a fourth layer, and etching the third insulator and the fourth conductor using the third layer, the selective growth layer, and the fourth layer until the semiconductor is exposed to form the first insulator, the second conductor, and the third conductor. The first insulator is provided over the semiconductor; the opening overlaps with part of the semiconductor and penetrates the first insulator; the second insulator includes a region in contact with a side surface and a bottom surface of the opening; the first conductor overlaps with the semiconductor with the second insulator positioned between the first conductor and the semiconductor; and the second conductor and the third conductor are each provided between the semiconductor and the first insulator.

(3) One embodiment of the method for manufacturing a semiconductor device described in (1) or (2), in which the second layer includes silicon.

(4) One embodiment of the present invention is a method for manufacturing a semiconductor device including a semiconductor, a first insulator, a second insulator, a first conductor, a second conductor, a third conductor, and an opening. The method includes the steps of forming an etching mask over a fourth conductor provided over the semiconductor and over a third insulator provided over the fourth conductor, etching the third insulator using the etching mask until the fourth conductor is exposed to form a fifth insulator, forming a selective growth layer on a top surface and a side surface of the fifth insulator, and etching the fourth conductor using the fifth insulator and the selective growth layer until the semiconductor is exposed to form the second conductor and the third conductor. The first conductor is provided over the semiconductor; the opening overlaps with part of the semiconductor and penetrates the first insulator; the second insulator includes a region in contact with a side surface and a bottom surface of the opening; the first conductor overlaps with the semiconductor with the second insulator positioned between the first conductor and the semiconductor; and the second conductor and the third conductor are each provided between the semiconductor and the first insulator.

(5) One embodiment of the present invention is the method for manufacturing a semiconductor device described in (4), in which the third insulator includes silicon.

(6) One embodiment of the present invention is a method for manufacturing a semiconductor device including a semiconductor, a first insulator, a second insulator, a first conductor, a second conductor, a third conductor, and an opening. The method includes the steps of forming a first layer over a fourth conductor provided over the semiconductor and over a third insulator provided over the fourth conductor, forming a second layer over part of the first layer, exposing the first layer and the second layer to a silane gas to form a first region which is exposed to the silane gas and a second region which is not exposed to the silane gas in the first layer, etching the second layer, forming a selective growth layer over the first region, etching the second region of the first layer using the selective growth layer to form a third layer, and etching the third insulator and the fourth conductor using the third layer and the selective growth layer until the semiconductor is exposed to form the first insulator, the second conductor, and the third conductor. The first insulator is provided over the semiconductor; the opening overlaps with part of the semiconductor and penetrates the first insulator; the second insulator includes a region in contact with a side surface and a bottom surface of the opening; the first conductor overlaps with the semiconductor with the second insulator positioned between the first conductor and the semiconductor; and the second conductor and the third conductor are each positioned between the semiconductor and the first insulator.

(7) One embodiment of the present invention is the method for manufacturing a semiconductor device described in any one of (1) to (6), in which the selective growth layer is formed using a source gas including silicon and halogen.

(8) One embodiment of the present invention is the method for manufacturing a semiconductor device described in any one of (1) to (7), in which the semiconductor includes an oxide semiconductor.

(9) One embodiment of the present invention is the method for manufacturing a semiconductor device described in any one of (1) to (7), in which the semiconductor includes silicon.

A miniaturized transistor can be provided. A transistor with favorable electrical characteristics can be provided. A transistor with stable electrical characteristics can be provided. A transistor with high frequency characteristics can be provided. A transistor with low off-state current can be provided. A semiconductor device including any of the transistors can be provided. A module including the semiconductor device can be provided. An electronic device including the semiconductor device or the module can be provided.

Note that the description of these effects does not preclude the existence of other effects. One embodiment of the present invention does not necessarily have all the effects listed above. Other effects will be apparent from and can be derived from the description of the specification, the drawings, the claims, and the like.

BRIEF DESCRIPTION OF THE DRAWINGS

FIGS. 38A to 38C are cross-sectional views illustrating a semiconductor device of one embodiment of the present invention.

FIGS. 39A to 39C are cross-sectional views illustrating a semiconductor device of one embodiment of the present invention.

FIGS. 40A to 40C are cross-sectional views illustrating a semiconductor device of one embodiment of the present invention.

FIGS. 50A1, 50A2, 50A3, 50B1, 50B2, and 50B3 are perspective views and cross-sectional views illustrating semiconductor devices of embodiments of the present invention.

FIGS. 58A1, 58A2, 58A3, 58B1, 58B2, 58C1, and 58C2 are perspective views illustrating electronic devices of embodiments of the present invention.

DETAILED DESCRIPTION OF THE INVENTION

Figure 1A:
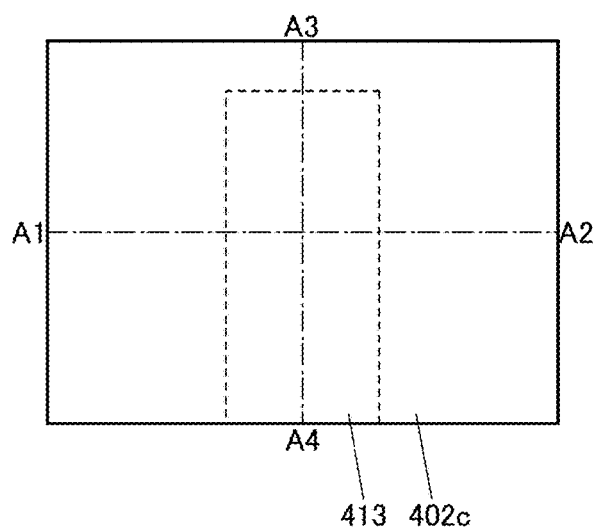
FIGS. 1A to 1C are a top view and cross-sectional views of a transistor of one embodiment of the present invention.

Hereinafter, embodiments and examples of the present invention will be described in detail with the reference to the drawings. However, the present invention is not limited to the description below, and it is easily understood by those skilled in the art that modes and details disclosed herein can be modified in various ways. Furthermore, the present invention is not construed as being limited to description of the embodiments. In describing structures of the present invention with reference to the drawings, common reference numerals are used for the same portions in different drawings. Note that the same hatched pattern is applied to similar parts, and the similar parts are not denoted by reference numerals in some cases. In the case where the description of a component denoted by a different reference numeral is referred to, the description of the thickness, composition, structure, shape, or the like of the component can be used as appropriate.

Note that the size, the thickness of films (layers), or regions in drawings is sometimes exaggerated for simplicity.

In this specification, the terms "film" and "layer" can be interchanged with each other.

A voltage usually refers to a potential difference between a given potential and a reference potential (e.g., a source potential or a ground potential (GND)). A voltage can be referred to as a potential. Note that in general, a potential (a voltage) is relative and is determined depending on the amount relative to a reference potential. Therefore, a potential that is represented as a "ground potential" or the like is not always 0 V. For example, the lowest potential in a circuit may be represented as a "ground potential." Alternatively, a substantially intermediate potential in a circuit may be represented as a "ground potential." In these cases, a positive potential and a negative potential are set using the potential as a reference.

Note that the ordinal numbers such as "first" and "second" are used for convenience and do not denote the order of steps or the stacking order of layers. Therefore, for example, the term "first" can be replaced with the term "second," "third," or the like as appropriate. In addition, the ordinal numbers in this specification and the like do not correspond to the ordinal numbers which specify one embodiment of the present invention in some cases.

Note that impurities in a semiconductor refer to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is silicon, examples of an impurity which changes characteristics of the semiconductor include oxygen, Group 1 elements except hydrogen, Group 2 elements, Group 13 elements, and Group 15 elements. Note that as well as the impurity, a main component element that is excessively contained might cause DOS. In that case, DOS can be lowered in some cases by a slight amount of an additive (e.g., greater than or equal to 0.001 atomic % and less than 3 atomic %). The above-described element that might serve as an impurity can be used as the additive.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on a transistor structure, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values might be different from those calculated by using an effective channel width.

In this specification, the expression "A has a shape such that an end portion extends beyond an end portion of B" may indicate the case where at least one end portion of A is positioned on an outer side than at least one end portion of B in a top view or a cross-sectional view. Therefore, the expression "A has a shape such that an end portion extends beyond an end portion of B" can also be expressed as "an end portion of A is positioned on an outer side than an end portion of B in a top view," for example.

In this specification, the term "parallel" indicates that the angle formed between two straight lines is greater than or equal to −10° and less than or equal to 10°, and accordingly also includes the case where the angle is greater than or equal to 5° and less than or equal to 5°. A term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

In this specification, the term "semiconductor" can be replaced with any term for various semiconductors in some cases. For example, the term "semiconductor" can be replaced with the term for a Group 14 semiconductor such as silicon or germanium; an oxide semiconductor; a compound semiconductor such as silicon carbide, germanium silicide, gallium arsenide, indium phosphide, zinc selenide, or cadmium sulfide; or an organic semiconductor.

Here, an example of a method for etching part of a component when the semiconductor device of one embodiment of the present invention is manufactured is described. First, a layer of a photosensitive organic or inorganic substance is formed over the component by a spin coating method or the like. Then, the layer of the photosensitive organic or inorganic substance is irradiated with light with the use of a photomask. As such light, KrF excimer laser light, ArF excimer laser light, extreme ultraviolet (EUV) light, or the like may be used. Alternatively, a liquid immersion technique may be employed in which a portion between a substrate and a projection lens is filled with liquid (e.g., water) to perform light exposure. The layer of the photosensitive organic or inorganic substance may be irradiated with an electron beam or an ion beam instead of the above light. Note that no photomask is needed in the case of using an electron beam or an ion beam. After that, a region of the layer of the photosensitive organic or inorganic substance that has been exposed to light is removed or left with the use of a developer, so that an etching mask including a resist is formed.

Note that a bottom anti-reflective coating (BARC) may be formed under the etching mask. In the case where the BARC is used, first, the BARC is etched using the etching mask. Next, the component is etched using the etching mask and the BARC. Note that an organic or inorganic substance which does not function as an anti-reflective layer may be used instead of the BARC.

After the etching of the component, the etching mask or the like is removed. For the removal of the etching mask or the like, plasma treatment and/or wet etching are/is used. Note that as the plasma treatment, plasma ashing is preferable. In the case where the removal of the etching mask or the like is not enough, the remaining etching mask or the like may be removed using ozone water and/or hydrofluoric acid at a concentration higher than or equal to 0.001 volume % and lower than or equal to 1 volume %, and the like.

In this specification, the conductors, the insulators, and the semiconductors can be formed by a sputtering method, a chemical vapor deposition (CVD) method, a molecular beam epitaxy (MBE) method, a pulsed laser deposition (PLD) method, an atomic layer deposition (ALD) method, a thermal oxidation method, a plasma oxidation method, or the like.

CVD methods can be classified into a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

In the case of a plasma CVD method, a high quality film can be obtained at relatively low temperature. Furthermore, a thermal CVD method does not use plasma and thus causes less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. Such plasma damage is not caused in the case of using a thermal CVD method, and thus the yield of a semiconductor device can be increased. In addition, since plasma damage does not occur in the deposition by a thermal CVD method, a film with few defects can be obtained.

An ALD method also causes less plasma damage to an object. An ALD method does not cause plasma damage during deposition, so that a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening portion with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by the CVD method or the ALD method, a film with a desired composition can be formed by adjusting the flow ratio of a source gas. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the deposition can be reduced because time taken for transfer and pressure adjustment is omitted. Thus, semiconductor devices can be manufactured with improved productivity.

<Method 1 for Manufacturing Transistor>

A method for manufacturing a transistor included in a semiconductor device of one embodiment of the present invention is described below with reference to FIGS. 1A to 1C, FIGS. 2A to 2C, FIGS. 3A to 3C, FIGS. 4A to 4C, FIGS. 5A to 5C, FIGS. 6A to 6C, FIGS. 7A to 7C, FIGS. 8A to 8C, FIGS. 9A to 9C, and FIGS. 10A to 10C.

First, a substrate 400 is prepared.

Next, an insulator that is to be an insulator 401 is formed. Then, part of the insulator to be the insulator 401 is etched, whereby the insulator 401 having a groove is formed.

Next, a conductor that is to be a conductor 413 is formed to fill the groove of the insulator 401. Subsequently, the conductor to be the conductor 413 is processed by a chemical mechanical polishing (CMP) method or the like to remove a portion of the conductor 413 above the top surface of the insulator 401; as a result, the conductor 413 is formed. Instead of a CMP method, a dry etching method, a mechanical polishing (MP) method, or the like may be used. Alternatively, two or more of these methods may be combined to be employed.

Note that the insulator to be the insulator 401 is not necessarily provided in some cases. In such cases, the conductor 413 may be formed by etching part of the conductor to be the conductor 413 by using an etching mask. Furthermore, the conductor to be the conductor 413 is not necessarily provided in some cases. In such cases, a process relating to formation of the conductor 413 in the manufacturing method that will be described below can be omitted.

Figure 1C:
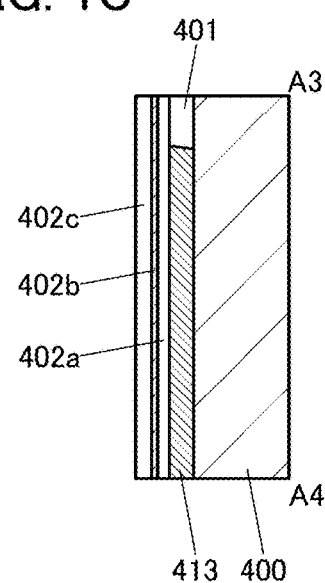
Figure 1B:
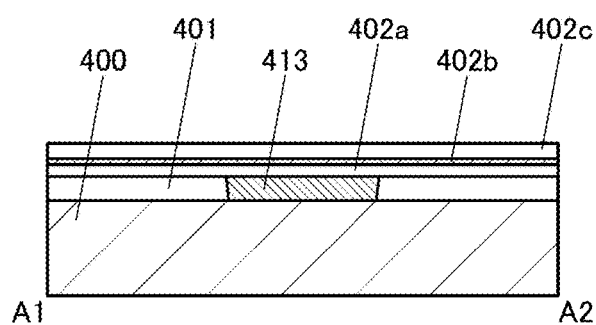

Next, an insulator 402a, an insulator 402b, and an insulator 402c are formed in this order (see FIGS. 1A to 1C). Note that FIG. 1A is a top view, FIG. 1B is a cross-sectional view taken along dashed-dotted line A1-A2 in FIG. 1A, and FIG. 1C is a cross-sectional view taken along dashed-dotted line A3-A4 in FIG. 1A.

Note that one or more of the insulators 402a, 402b, and 402c are not necessarily formed in some cases. In such cases, a process relating to formation of one or more of the insulators 402a, 402b, and 402c in the manufacturing methods that will be described below can be omitted.

Next, first heat treatment is preferably performed. The first heat treatment can be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, impurities such as hydrogen and water can be removed, for example.

Next, an insulator that is to be an insulator 406a, a semiconductor that is to be a semiconductor 406b, and a conductor that is to be a conductor 416 are formed in this order. Here, the insulator to be the insulator 406a and/or the conductor to be the conductor 416 are/is not necessarily formed in some cases. In such cases, a process relating to formation of the insulator 406a and/or the conductor 416 in the manufacturing methods that will be described below can be omitted.

Figure 2A:
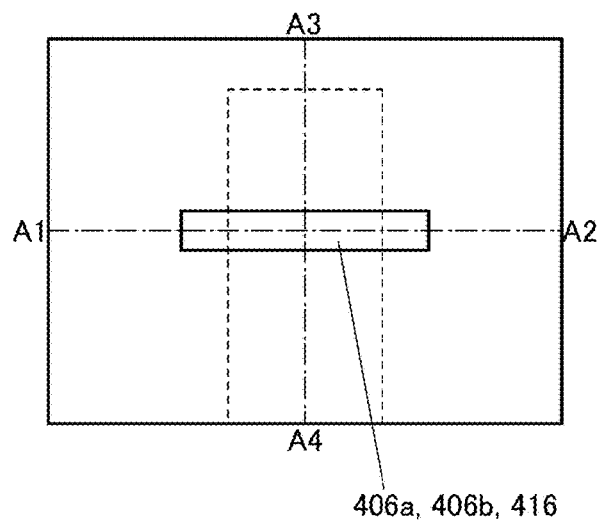
FIGS. 2A to 2C are a top view and cross-sectional views of the transistor of one embodiment of the present invention.
Figure 2C:
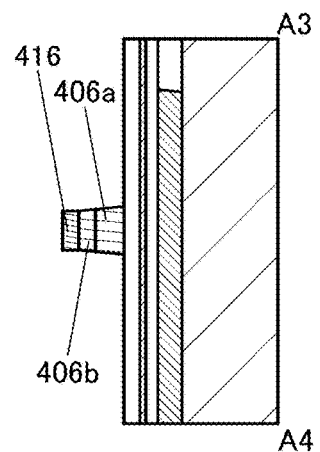
Figure 2B:
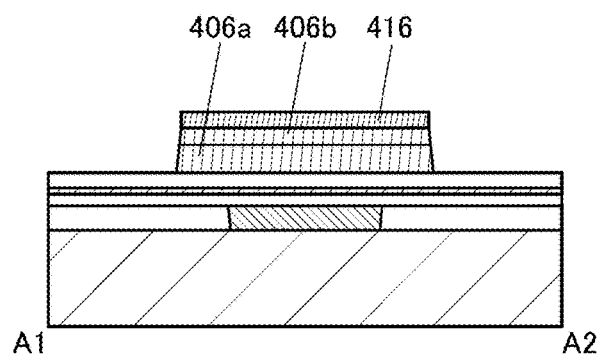

Subsequently, part of the conductor to be the conductor 416 is etched to form the island-shaped conductor 416. Then, part of the semiconductor to be the semiconductor 406b and part of the insulator to be the insulator 406a are etched using the conductor 416, whereby the semiconductor 406b and the insulator 406a are formed (see FIGS. 2A to 2C). Note that FIG. 2A is a top view, FIG. 2B is a cross-sectional view taken along dashed-dotted line A1-A2 in FIG. 2A, and FIG. 2C is a cross-sectional view taken along dashed-dotted line A3-A4 in FIG. 2A.

Use of the conductor 416 for etching of the semiconductor to be the semiconductor 406b and the insulator to be the insulator 406a can stabilize the shapes of the obtained semiconductor 406b and insulator 406a, as compared to the case of using a resist. That is, the obtained semiconductor 406b and insulator 406a can have minute shapes. Note that in the case where the conductor to be the conductor 416 is not formed, a resist may be used for etching for forming the semiconductor 406b and/or etching for forming the insulator 406a.

After that, second heat treatment may be performed. For the method of the second heat treatment, the description of the method of the first heat treatment is referred to. The second heat treatment may remove impurities including hydrogen and the like that have been mixed at the time of etching. Furthermore, the second heat treatment may increase the crystallinity of the semiconductor 406b and/or the crystallinity of the insulator 406a.

Next, an insulator 410 is formed.

Next, third heat treatment may be performed. For the method of the third heat treatment, the description of the method of the first treatment is referred to. The third heat treatment may remove impurities including hydrogen and the like. Furthermore, the third heat treatment may increase the crystallinity of the semiconductor 406b and/or the crystallinity of the insulator 406a.

Figure 3A:
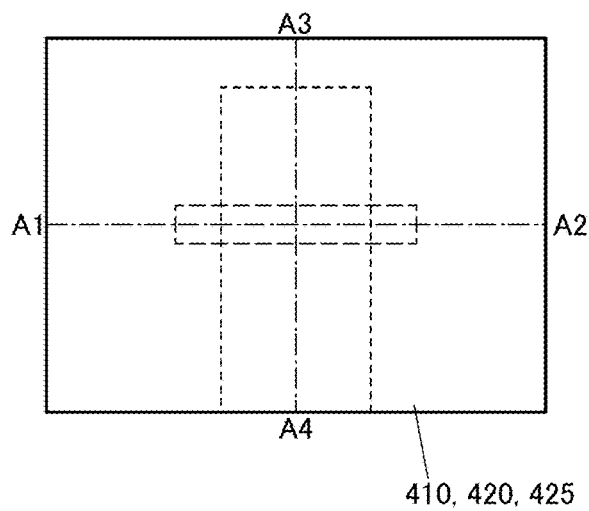
FIGS. 3A to 3C are a top view and cross-sectional views of the transistor of one embodiment of the present invention.
Figure 3C:
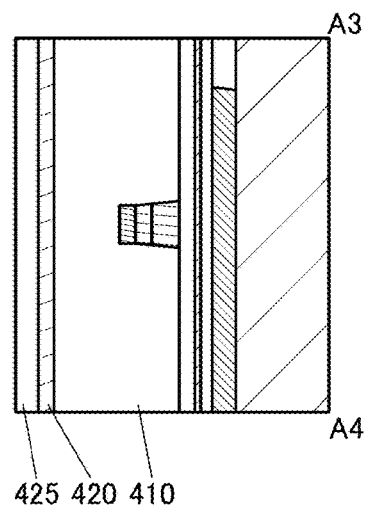
Figure 3B:
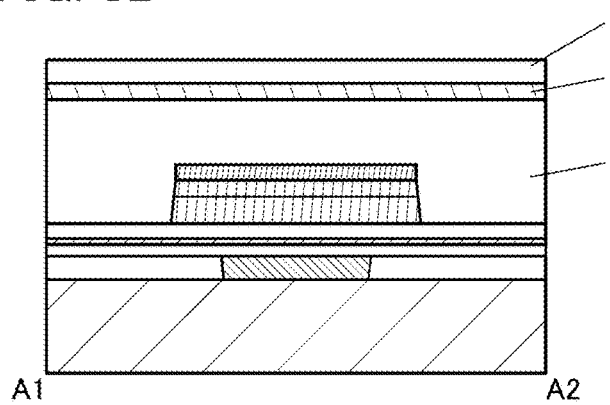

Next, a layer 420 and a layer 425 are formed in this order (see FIGS. 3A to 3C). Note that FIG. 3A is a top view, FIG. 3B is a cross-sectional view taken along dashed-dotted line A1-A2 in FIG. 3A, and FIG. 3C is a cross-sectional view taken along dashed-dotted line A3-A4 in FIG. 3A.

Figure 4A:
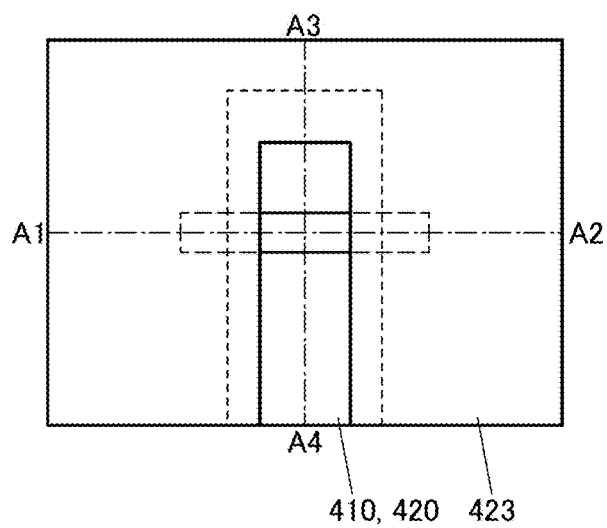
FIGS. 4A to 4C are a top view and cross-sectional views of the transistor of one embodiment of the present invention.
Figure 4C:
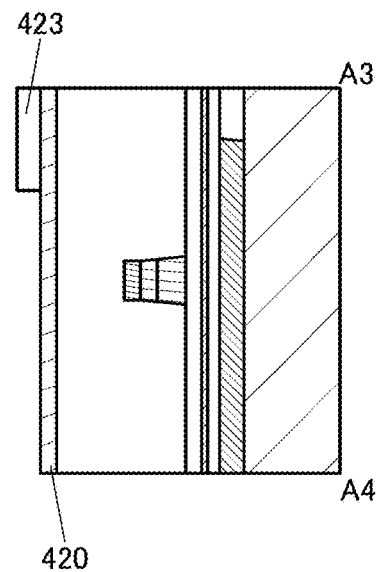
Figure 4B:
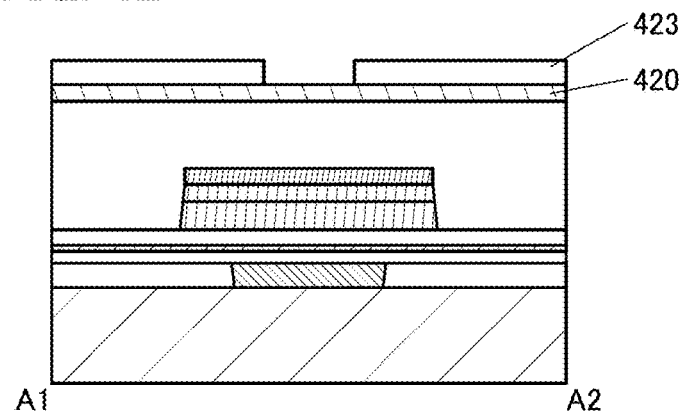

Next, part of the layer 425 is etched, whereby a layer 423 having a groove is formed (see FIGS. 4A to 4C). Note that FIG. 4A is a top view, FIG. 4B is a cross-sectional view taken along dashed-dotted line A1-A2 in FIG. 4A, and FIG. 4C is a cross-sectional view taken along dashed-dotted line A3-A4 in FIG. 4A.

Figure 5A:
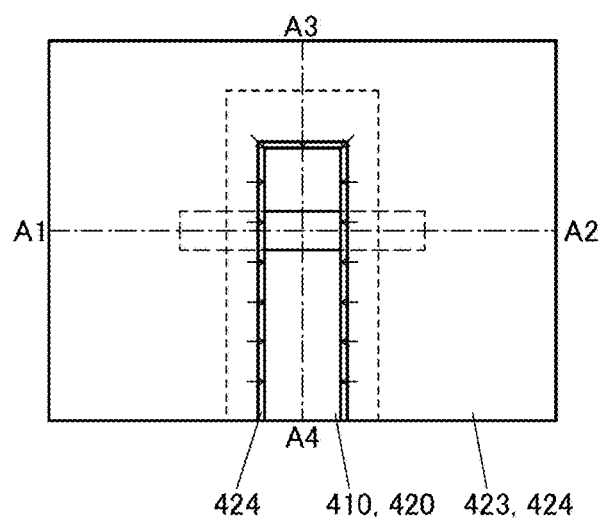
FIGS. 5A to 5C are a top view and cross-sectional views of the transistor of one embodiment of the present invention.
Figure 5C:
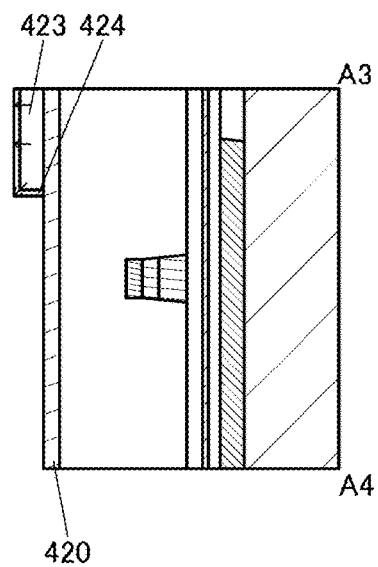
Figure 5B:
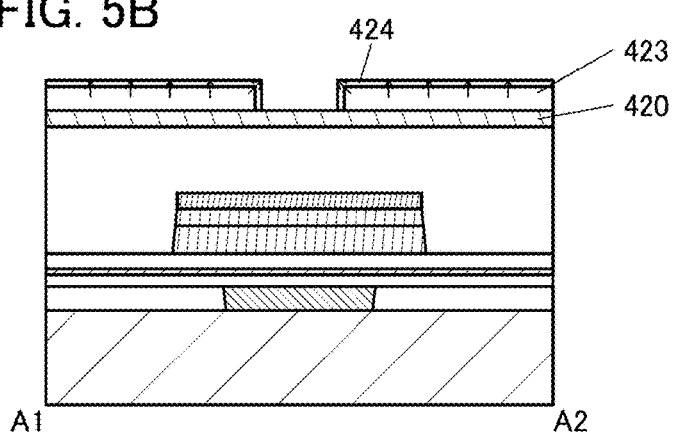

Then, a layer 424 is formed on top and side surfaces of the layer 423 (see FIGS. 5A to 5C). Note that FIG. 5A is a top view, FIG. 5B is a cross-sectional view taken along dashed-dotted line A1-A2 in FIG. 5A, and FIG. 5C is a cross-sectional view taken along dashed-dotted line A3-A4 in FIG. 5A.

The layer 424 is selectively formed on the surfaces (the top and side surfaces and the like) of the layer 423, and preferably it is not formed on surfaces (a top surface and the like) of the layer 420. For example, in the case where the layer 423 contains silicon, the layer 424 can be formed by a CVD method using a source gas containing silicon and halogen. In that case, it is preferable that at least an exposed surface of the layer 420 do not contain silicon. Even if the exposed surface contains silicon, it is acceptable as long as the silicon concentration is low enough not to cause selective growth of the layer. That is, the layer 420 and the layer 423 are preferably different kinds of layers.

Alternatively, the layer 424 may be formed by oxidation or nitriding of the surface of the layer 423. Part of the layer 423 which expands by being oxidized or nitrided serves as the layer 424. In that case, it is preferable that the layer 420 not be oxidized or nitrided. Even if the oxidation or nitriding is caused, it is acceptable as long as the oxidized or nitrided portion is small. Furthermore, it is preferable that expansion of the layer 420 be not caused by oxidation or nitriding. Even if the expansion is caused, it is acceptable as long as the volume of the expanded portion of the layer 420 is smaller than that of the layer 423. Note that the expansion of the layer 423 may be performed by another method other than oxidation or nitriding.

Figure 6A:
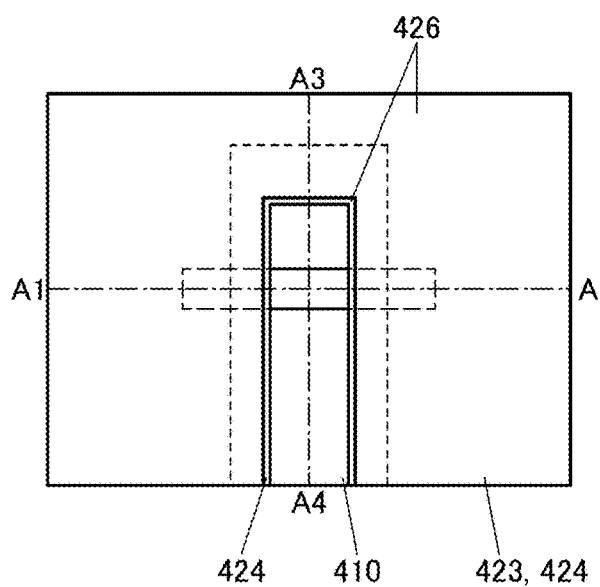
FIGS. 6A to 6C are a top view and cross-sectional views of the transistor of one embodiment of the present invention.
Figure 6C:
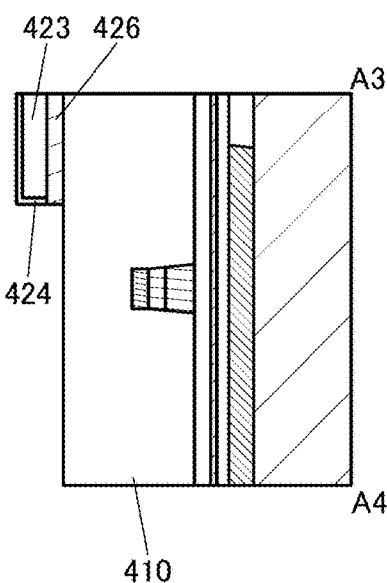
Figure 6B:
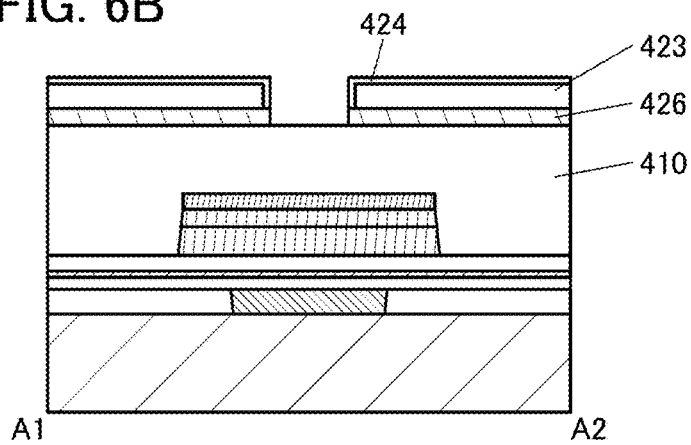

Next, part of the layer 420 is etched using the layer 423 and the layer 424, whereby a layer 426 having a groove is formed (see FIGS. 6A to 6C). Note that FIG. 6A is a top view, FIG. 6B is a cross-sectional view taken along dashed-dotted line A1-A2 in FIG. 6A, and FIG. 6C is a cross-sectional view taken along dashed-dotted line A3-A4 in FIG. 6A.

The width of the groove formed in the layer 426 is smaller than the width of the groove formed in the layer 423 by the thickness of the layer 424. Therefore, the width of the groove of the layer 426 can be smaller than the resolution limit of an exposure apparatus. For example, when the width of the groove of the layer 423 is 20 nm and the thickness of the layer 424 is 5 nm (the total thickness of the layer 424 formed on both side surfaces is 10 nm), the width of the groove of the layer 426 can be reduced to 10 nm.

Since the layer 424 functions as an etching mask as described above, it is preferable that the layer 424 not be formed over the surface of the layer 420. Note that when the thickness of the layer 424 is smaller than that of the layer 423, the layer 424 may be formed over the surface of the layer 420 in some cases. At that time, part of the layer 424 provided over the surface of the layer 420 can be etched by an anisotropy etching method, and part of the layer 424 provided on the side surface of the layer 423 can remain. Thus, use of the layer 424 remaining on the side surface of the layer 423 makes it possible to form the layer 426 having a groove whose width is smaller than that of the layer 423.

Figure 7A:
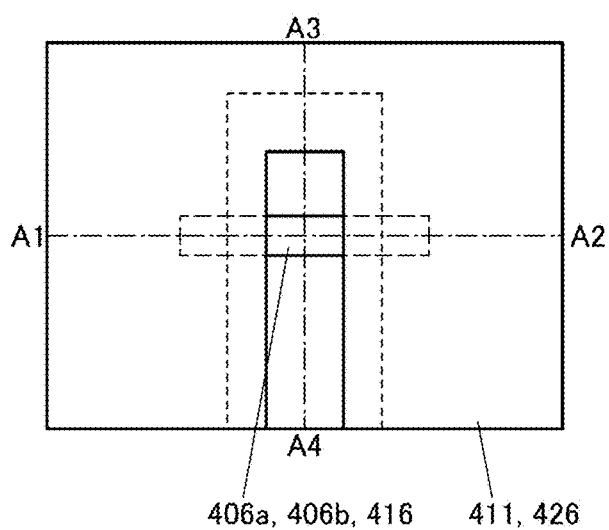
FIGS. 7A to 7C are a top view and cross-sectional views of the transistor of one embodiment of the present invention.
Figure 7C:
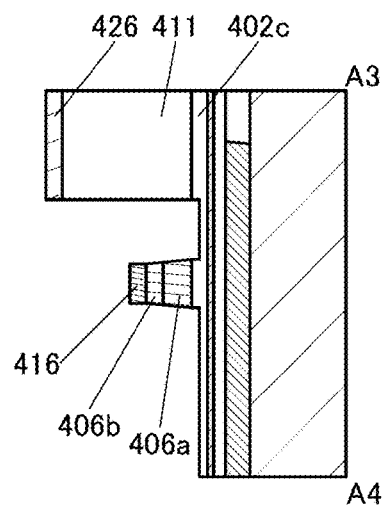
Figure 7B:
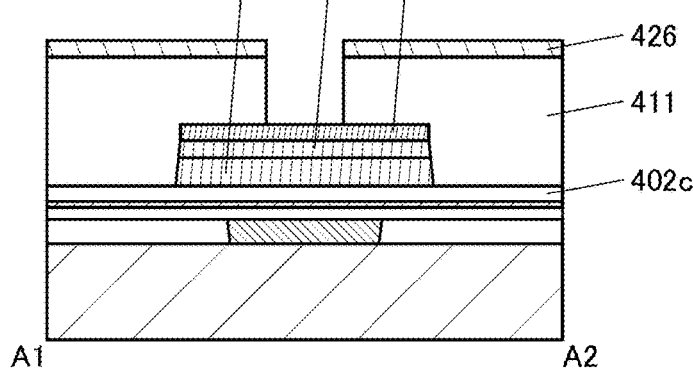

Next, part of the insulator 410 is etched using the layer 423, the layer 424, and the layer 426, whereby an insulator 411 having a groove is formed. At that time, the layer 423 and the layer 424 can also be etched (see FIGS. 7A to 7C). Note that FIG. 7A is a top view, FIG. 7B is a cross-sectional view taken along dashed-dotted line A1-A2 in FIG. 7A, and FIG. 7C is a cross-sectional view taken along dashed-dotted line A3-A4 in FIG. 7A. For example, in the case where the insulator 410 is a silicon oxide, the layer 426 is preferably a layer which is unlikely to be etched by an etching gas containing fluorine (e.g., $CF_4$, $C_2F_6$, $C_4F_8$ or $CHF_3$).

Note that part of the conductor 416, part of the semiconductor 406b, part of the insulator 406a, and part of insulator 402c are exposed by the etching of part of the insulator 410. At that time, the thickness of part of the insulator 402c or the like is reduced by etching in some cases.

Figure 8A:
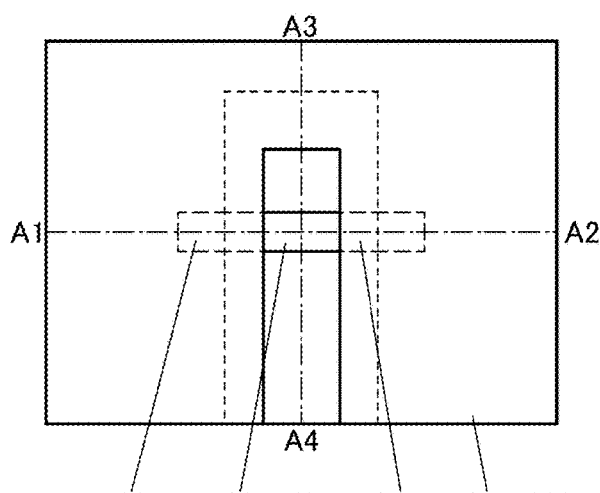
FIGS. 8A to 8C are a top view and cross-sectional views of the transistor of one embodiment of the present invention.
Figure 8C:
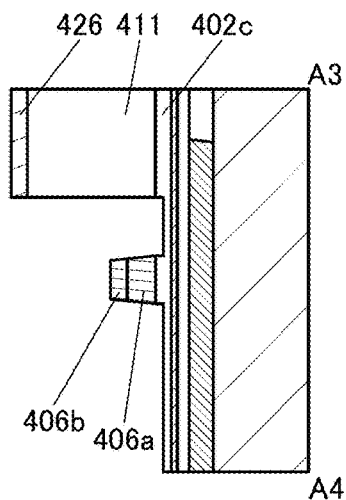
Figure 8B:
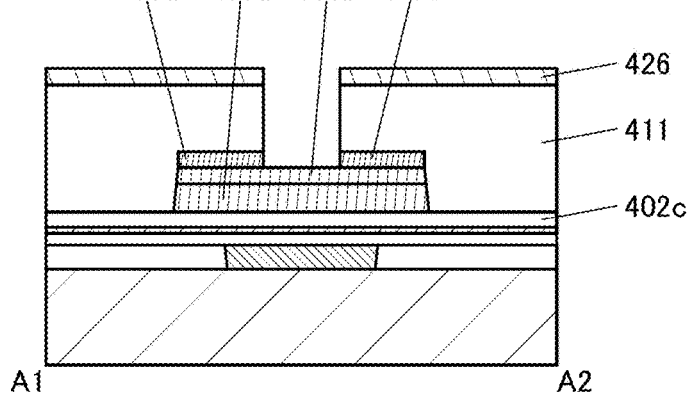

Next, part of the conductor 416 is etched using the layer 426 and the insulator 411, whereby a conductor 416a and a conductor 416b are formed (see FIGS. 8A to 8C). Note that FIG. 8A is a top view, FIG. 8B is a cross-sectional view taken along dashed-dotted line A1-A2 in FIG. 8A, and FIG. 8C is a cross-sectional view taken along dashed-dotted line A3-A4 in FIG. 8A.

The distance between the conductor 416a and the conductor 416b can be almost the same as the width of the groove of the layer 426. Although not illustrated, in the case where an edge portion of the conductor 416a and an edge portion of the conductor 416b each have a taper angle, the distance between the conductor 416a and the conductor 416b can be smaller than the width of the groove of the layer 426.

Figure 9A:
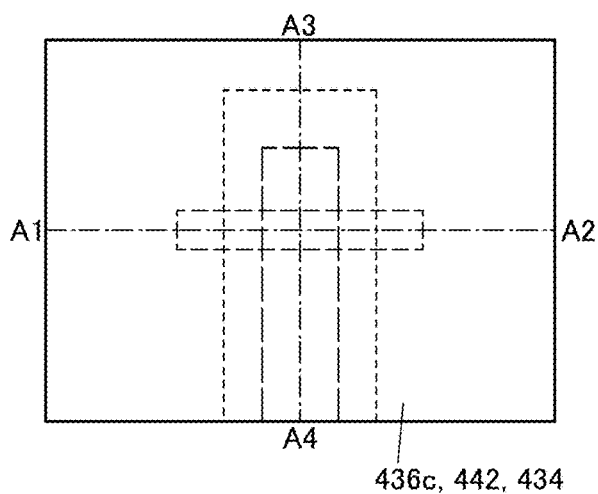
FIGS. 9A to 9C are a top view and cross-sectional views of the transistor of one embodiment of the present invention.
Figure 9C:
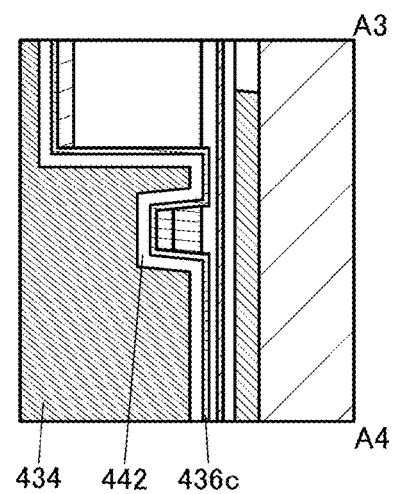
Figure 9B:
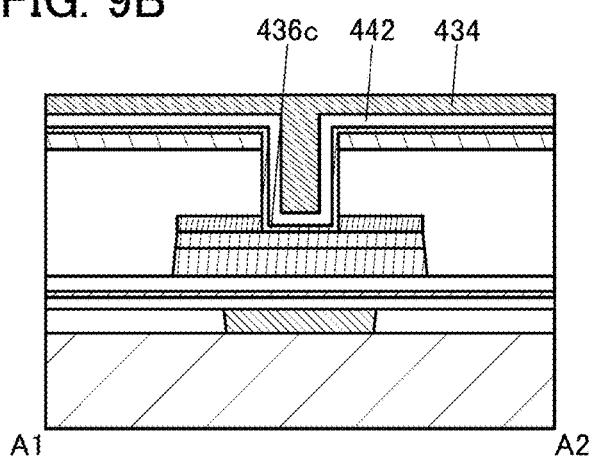

Next, an insulator 436c, an insulator 442, and a conductor 434 are formed in this order (see FIGS. 9A to 9C). Note that FIG. 9A is a top view, FIG. 9B is a cross-sectional view taken along dashed-dotted line A1-A2 in FIG. 9A, and FIG. 9C is a cross-sectional view taken along dashed-dotted line A3-A4 in FIG. 9A.

Here, the insulator 436c is not necessarily formed in some cases. In that case, a process relating to formation of the insulator 436c in the manufacturing methods that will be described below can be omitted.

It is preferable that the thickness of the insulator 436c and/or insulator 442 be set so that the insulator 436c and/or the insulator 442 do/does not completely fill the groove of the insulator 411. For example, in the case where the width of the groove of the insulator 411 is 12 nm, the total thickness of the insulator 436c and the insulator 442 is preferably less than 6 nm (the total thickness of the insulator 436c and the insulator 442 on both side surfaces of the groove of the insulator 411 is preferably less than 12 nm). Note that the thickness of the insulator 436c and/or the insulator 442 in a region which is in contact with the semiconductor 406b may be different from the thickness of the insulator 436c and/or the insulator 442 in a region in contact with the side surface of the groove of the insulator 411. In that case, the total thickness of the insulator 436c and the insulator 442 in the region in contact with the side surface of the groove of the insulator 411 is preferably smaller than the width of the groove of the insulator 411. Meanwhile, the conductor 434 preferably has a thickness large enough to fill the groove of the insulator 411 completely.

Next, the conductor 434, the insulator 442, and the insulator 436c are processed by a CMP method or the like to remove a portion above the top surface of the insulator 411; as a result, a conductor 404, an insulator 412, and an insulator 406c are formed. At that time, the thickness of the insulator 411 may be reduced. Instead of a CMP method, a dry etching method, an MP method, or the like may be used. Alternatively, two or more of these methods may be combined to be employed. Alternatively, part of the conductor 434, part of the insulator 442, and part of the insulator 436c may be etched using an etching mask.

Figure 10A:
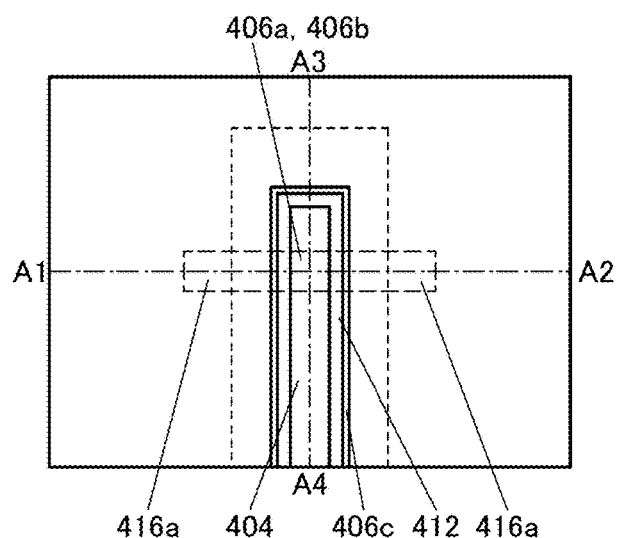
FIGS. 10A to 10C are a top view and cross-sectional views of the transistor of one embodiment of the present invention.
Figure 10C:
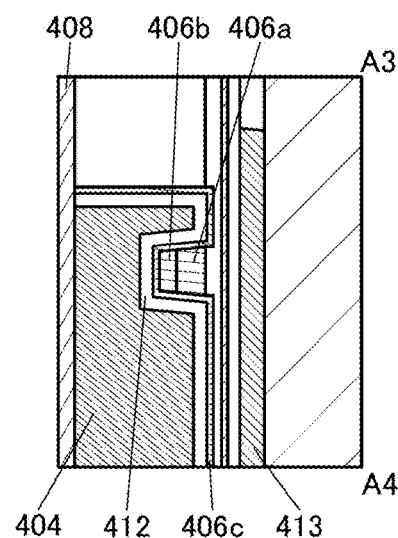
Figure 10B:
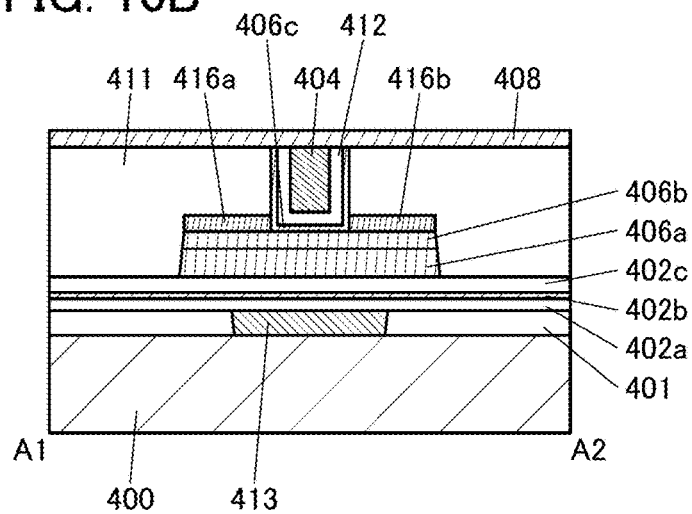

Then, an insulator 408 is formed. Thus, a transistor can be manufactured (see FIGS. 10A to 10C). Note that FIG. 10A is a top view, FIG. 10B is a cross-sectional view taken along dashed-dotted line A1-A2 in FIG. 10A, and FIG. 10C is a cross-sectional view taken along dashed-dotted line A3-A4 in FIG. 10A.

Formation of the insulator 408 is preferably performed under an atmosphere containing oxygen. In particular, formation of the insulator 408 is preferably performed by a sputtering method using an oxygen gas. Such a method enables excess oxygen to be added to, for example, the insulator 411 when the insulator 408 is formed. The excess oxygen is used to reduce defect states when an oxide semiconductor is used as the semiconductor 406b. High density of defect states of the semiconductor 406b causes degradation of the electrical characteristics of the transistor.

Here, the insulator 408 is not necessarily formed in some cases.

Next, the fourth heat treatment may be performed. For the method of the fourth heat treatment, the description of the method of the first heat treatment is referred to. The fourth heat treatment may remove impurities including hydrogen and the like. Furthermore, the fourth heat treatment may increase the crystallinity of the semiconductor 406b and/or the crystallinity of the insulator 406a. In the case where excess oxygen is added to the insulator 411 and the like at the time of formation of the insulator 408, the fourth heat treatment can diffuse the excess oxygen.

In the transistor illustrated in FIGS. 10A to 10C, the conductor 404 functions as a first gate electrode (also referred to as a front gate electrode), the insulator 412 functions as a first gate insulator (also referred to as a front gate insulator), the semiconductor 406b functions as a channel formation region, the conductor 416a functions as a source electrode, the conductor 416b functions as a drain electrode, the conductor 413 functions as a second gate electrode (also referred to as a back gate electrode), the insulators 402a, 402b, and 402c function as second gate insulators (also referred to as back gate insulators), and the insulator 408 functions as a barrier layer for preventing impurities from entering the transistor and/or has a function of preventing outward diffusion of excess oxygen.

The insulators 406a and 406c function as protective layers for the semiconductor 406b. For example, the insulators 406a and 406c, which are formed to surround the semiconductor 406b as illustrated in the cross-sectional view shown in FIG. 10C, can prevent formation of parasitic channel, carrier traps, and the like. Details of the insulator 406a, the semiconductor 406b, and the insulator 406c will be described later.

As illustrated in FIG. 10C, the transistor has a structure in which the semiconductor 406b and the like are electrically surrounded by the electric field of the conductor 404 functioning as a first gate electrode. A structure in which a semiconductor is electrically surrounded by an electric field of a gate electrode is referred to as a surrounded channel (s-channel) structure. Therefore, a channel is formed in the whole of the semiconductor 406b and the like (bulk) in some cases. In the s-channel structure, a large amount of current can flow between a source and a drain of the transistor, so that an on-state current can be increased. Furthermore, a current in an off state (off-state current) can be reduced.

It is preferable that the insulator 402a, the insulator 402b, and the insulator 402c include a layer or a region which traps charge, e.g., electrons (also referred to as a charge trap layer or a charge trap region). For example, the whole insulator 402b may be a charge trap layer, or a region in the vicinity of the interface between the insulator 402a and the insulator 402b or a region in the vicinity of the interface between the insulator 402b and the insulator 402c may be a charge trap region. Electrons can be injected to the charge trap layer or the charge trap region when a certain potential is applied to the conductor 413, for example. At that time, the amount of injected electrons can be adjusted by changing the level of the potential applied to the conductor 413 or a time for the application of the potential. The amount of electrons to be injected may be determined in accordance with required specifications. For example, the threshold voltage of the transistor can be increased by 0.3 V, 0.5 V, 0.8 V, 1 V, 1.5 V, or 2 V by adjusting the amount of electrons to be injected. As a result, a transistor having normally-off electrical characteristics can be obtained.

Note that the charge trap layer or the change trap region is not necessarily provided below the semiconductor 406b. For example, the insulator 412 may have a stacked-layer structure, and the charge trap layer or the charge trap region may be formed in part of the insulator 412. In that case, electrons can be injected by application of a certain potential to the conductor 404.

In the transistor illustrated in FIGS. 10A to 10C, parasitic capacitance between the first gate electrode and the source and drain electrodes is small. Accordingly, the transistor can exhibit high frequency characteristics. Furthermore, the line width of the first gate electrode can be smaller than the resolution limit of the exposure apparatus; therefore, the transistor can be miniaturized.

As the substrate 400, an insulator substrate, a semiconductor substrate, or a conductor substrate may be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include single material semiconductor substrates of silicon, germanium, and the like and compound semiconductor substrates of silicon carbide, silicon germanium, gallium arsenide, indium phosphide, zinc oxide, gallium oxide, and the like. The semiconductor substrate may be a silicon on insulator (SOI) substrate in which an insulating region is provided in any of the above semiconductor substrates. Examples of the conductor substrate include a graphite substrate, a metal substrate, an alloy substrate, and a conductive resin substrate. Alternatively, the conductor substrate may be a substrate including a metal nitride, a substrate including a metal oxide, or the like. Examples of the conductor substrate further include an insulator substrate provided with a conductor or a semiconductor, a semiconductor substrate provided with a conductor or an insulator, and a conductor substrate provided with a semiconductor or an insulator. Alternatively, any of these substrates over which an element is provided may be used. As the element provided over the substrate, a capacitor, a resistor, a switching element, a light-emitting element, a memory element, or the like is used.

A flexible substrate may be used as the substrate 400. As a method for providing the transistor over a flexible substrate, there is a method in which the transistor is formed over a non-flexible substrate and then the transistor is separated and transferred to the substrate 400 which is a flexible substrate. In that case, a separation layer is preferably provided between the non-flexible substrate and the transistor. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The substrate 400 has a region with a thickness of, for example, greater than or equal to 5 μm and less than or equal to 700 μm, preferably greater than or equal to 10 μm and less than or equal to 500 μm, more preferably greater than or equal to 15 μm and less than or equal to 300 μm. When the substrate 400 has a small thickness, the weight of the semiconductor device including the transistor can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a durable semiconductor device can be provided.

For the substrate 400 which is a flexible substrate, metal, an alloy, resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

For the semiconductor 406b, a Group 14 semiconductor such as silicon or germanium; a compound semiconductor such as silicon carbide, germanium silicide, gallium arsenide, indium phosphide, zinc selenide, cadmium sulfide, or an oxide semiconductor; or an organic semiconductor can be used, for example. In particular, amorphous silicon, polycrystalline silicon, single crystal silicon, or an oxide semiconductor is preferably used.

The insulator 401 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 401 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide. Note that in this specification, "silicon oxynitride" refers to a material that contains oxygen at a higher proportion than nitrogen, and "silicon nitride oxide" refers to a material that contains nitrogen at a higher proportion than oxygen.

The conductor 413 may be formed to have a single-layer structure or a stacked-layer structure using a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten, for example. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used. In particular, a conductor containing copper is preferable because it has high conductivity. For example, in the case where a conductor which is formed in the same process as that of the conductor 413 is used for a wiring of a semiconductor device, the conductor is preferably a conductor containing copper, which exhibits high conductivity.

The insulator 402a may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 402a may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator 402b may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 402b may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator 402c may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 402c may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

For example, when an oxide containing aluminum, zirconium, or hafnium, or a nitride containing silicon is used as the insulator 402b, a charge accumulation layer or a charge accumulation region can be formed in some cases. At that time, an insulator which has a larger energy gap than the insulator 402b is used as the insulator 402a and the insulator 402c, in which case electrons that have been injected to the insulator 402b can be held stably. For example, silicon oxide may be used as the insulator 402a and the insulator 402c.

In the case where the semiconductor 406b is an oxide semiconductor, one or more of the insulators 402a, 402b, and 402c are preferably insulators including excess oxygen. Furthermore, it is preferable that one or more of the insulators 402a, 402b, and 402c be insulators having a low oxygen-transmitting property (also referred to as insulators having an oxygen-barrier property). In particular, it is preferable that the insulator 402b have an oxygen-barrier property and the insulator 402c include excess oxygen. In that case, outward diffusion of excess oxygen of the insulator 402c can be inhibited. Examples of the insulator having a low oxygen-transmitting property include magnesium oxide, aluminum oxide, yttrium oxide, zirconium oxide, hafnium oxide, and silicon nitride.

Here, an insulator including excess oxygen may release oxygen, the amount of which is higher than or equal to $1\times10^{18}$ atoms/cm$^3$, higher than or equal to $1\times10^{19}$ atoms/cm$^3$, or higher than or equal to $1\times10^{20}$ atoms/cm$^3$ (converted into the number of oxygen atoms) in thermal desorption spectroscopy (TDS) analysis in the range of a surface temperature of 100° C. to 700° C. or 100° C. to 500° C.

A method for measuring the amount of released oxygen using TDS is described below.

The total amount of released gas from a measurement sample in TDS analysis is proportional to the integral value of the ion intensity of the released gas. Then, comparison with a reference sample is made, whereby the total amount of released gas can be calculated.

For example, the amount of released oxygen molecules ($N_{O2}$) from a measurement sample can be calculated according to the following formula using the TDS results of a silicon substrate containing hydrogen at a predetermined density, which is a reference sample, and the TDS results of the measurement sample. Here, all gases having a mass-to-charge ratio of 32 which are obtained in the TDS analysis are assumed to originate from an oxygen molecule. Note that $CH_3OH$, which is a gas having the mass-to-charge ratio of 32, is not taken into consideration because it is unlikely to be present. Furthermore, an oxygen molecule including an oxygen atom having a mass number of 17 or 18 which is an isotope of an oxygen atom is also not taken into consideration because the proportion of such a molecule in the natural world is minimal.

$$N_{O2}=N_{H2}/S_{H2}\times S_{O2}\times \alpha$$

The value $N_{H2}$ is obtained by conversion of the amount of hydrogen molecules desorbed from the standard sample into densities. The value $S_{H2}$ is the integral value of ion intensity in the case where the standard sample is subjected to the TDS analysis. Here, the reference value of the standard sample is set to $N_{H2}/S_{H2}$. $S_{O2}$ is the integral value of ion intensity when the measurement sample is analyzed by TDS. The value a is a coefficient affecting the ion intensity in the TDS analysis. Refer to Japanese Published Patent Application No. H6-275697 for details of the above formula. The amount of released oxygen was measured with a thermal desorption spectroscopy apparatus produced by ESCO Ltd., EMD-WA1000S/W, using a silicon substrate containing a certain amount of hydrogen atoms as the reference sample.

Furthermore, in the TDS analysis, oxygen is partly detected as an oxygen atom. The ratio between oxygen molecules and oxygen atoms can be calculated from the ionization rate of the oxygen molecules. Note that, since the above a includes the ionization rate of the oxygen molecules, the amount of the released oxygen atoms can also be estimated through the evaluation of the amount of the released oxygen molecules.

Note that $N_{O2}$ is the amount of the released oxygen molecules. The amount of released oxygen in the case of being converted into oxygen atoms is twice the amount of the released oxygen molecules.

Furthermore, the insulator from which oxygen is released by heat treatment may contain a peroxide radical. Specifically, the spin density attributed to the peroxide radical is greater than or equal to $5\times 10^{17}$ spins/cm$^3$. Note that the insulator containing a peroxide radical may have an asymmetric signal with a g factor of approximately 2.01 in electron spin resonance (ESR).

One or more of the insulators 402a, 402b, and 402c are preferably insulators having a low hydrogen-transmitting property.

Because the hydrogen atomic radius or the like is small, hydrogen is likely to be diffused in an insulator (i.e., the diffusion coefficient of hydrogen is large). For example, a low-density insulator has a high hydrogen-transmitting property. In other words, a high-density insulator has a low hydrogen-transmitting property. The density of a low-density insulator is not always low throughout the insulator; an insulator including a low-density part is also referred to as a low-density insulator. This is because the low-density part serves as a hydrogen path. Although a density that allows hydrogen to be transmitted is not limited, it is typically lower than 2.6 g/cm$^3$. Examples of a low-density insulator include inorganic insulators such as silicon oxide or silicon oxynitride and organic insulators such as polyester, polyolefin, polyamide (e.g., nylon or aramid), polyimide, polycarbonate, or acrylic. Examples of a high-density insulator include magnesium oxide, aluminum oxide, germanium oxide, gallium oxide, yttrium oxide, zirconium oxide, lanthanum oxide, neodymium oxide, hafnium oxide, and tantalum oxide. Note that a low-density insulator and a high-density insulator are not limited to these insulators. For example, the insulators may contain one or more of boron, nitrogen, fluorine, neon, phosphorus, chlorine, and argon.

An insulator containing crystal grain boundaries can have a high hydrogen-transmitting property. In other words, hydrogen is less likely transmitted through an insulator containing no grain boundaries or few grain boundaries. For example, a non-polycrystalline insulator (e.g., an amorphous insulator) has a lower hydrogen-transmitting property than a polycrystalline insulator.

An insulator having a high hydrogen-bonding energy has a low hydrogen-transmitting property in some cases. For example, when an insulator which forms a hydrogen compound by bonding with hydrogen has bonding energy at which hydrogen is not released at temperatures in fabrication and operation of the device, the insulator can be in the category of an insulator having a low hydrogen-transmitting property. For example, an insulator which forms a hydrogen compound at higher than or equal to 200° C. and lower than or equal to 1000° C., higher than or equal to 300° C. and lower than or equal to 1000° C., or higher than or equal to 400° C. and lower than or equal to 1000° C. has a low hydrogen-transmitting property in some cases. An insulator which forms a hydrogen compound and which releases hydrogen at higher than or equal to 200° C. and lower than or equal to 1000° C., higher than or equal to 300° C. and lower than or equal to 1000° C., or higher than or equal to 400° C. and lower than or equal to 1000° C. has a low hydrogen-transmitting property in some cases. An insulator which forms a hydrogen compound and which releases hydrogen at higher than or equal to 20° C. and lower than or equal to 400° C., higher than or equal to 20° C. and lower than or equal to 300° C., or higher than or equal to 20° C. and lower than or equal to 200° C. has a high hydrogen-transmitting property in some cases. Hydrogen which is released easily and liberated can be referred to as excess hydrogen.

Each of the conductor 416a and the conductor 416b may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 412 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 412 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator 412 preferably contains excess oxygen in the case where the semiconductor 406b is an oxide semiconductor.

The conductor 404 may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

It is preferable that an oxide conductor be used as the conductor 404 in some cases. For example, in the case where an oxide containing indium and zinc, an oxide containing indium and tin, or an oxide containing indium, gallium, and zinc is used, excess oxygen can be added to the insulator 411, the insulator 442 that is to be the insulator 412, and the like when the conductor 434 that is to be the conductor 404 is formed. In general, when a deposition gas containing an oxidizing gas at a high proportion is used for forming an oxide containing indium, gallium, and zinc, the conductivity of the oxide is significantly low. Therefore, after the formation, the resistance of the oxide is preferably reduced by addition of a dopant or the like. To effectively reduce the resistance by addition of a dopant or the like, the oxide may have a stacked-layer structure in which a layer which is formed using a deposition gas with a high proportion of an oxidizing gas, and a layer which is formed using a deposition gas with a low proportion of an oxidizing gas or with no oxidizing gas are stacked in this order.

For the dopant addition, an ion implantation method by which an ionized source gas is subjected to mass separation and then added, an ion doping method by which an ionized source gas is added without mass separation, or the like can be used. In the case of performing mass separation, ion species to be added and its concentration can be controlled properly. On the other hand, in the case of not performing mass separation, ions at a high concentration can be added in a short time. Alternatively, an ion implantation method or an ion doping method in which atomic or molecular clusters are generated and ionized may be employed. Instead of the term "dopant," the term "ion," "donor," "acceptor," "impurity," or "element" may be used.

The dopant addition may be controlled by setting the addition conditions such as the acceleration voltage and the dose as appropriate. The dose of the dopant is, for example, greater than or equal to $1 \times 10^{12}$ ions/cm$^2$ and less than or equal to $1 \times 10^{16}$ ions/cm$^2$, and preferably greater than or equal to $1 \times 10^{13}$ ions/cm$^2$ and less than or equal to $1 \times 10^{15}$ ions/cm$^2$. The acceleration voltage at the time of addition of the dopant is higher than or equal to 2 kV and lower than or equal to 50 kV, preferably higher than or equal to 5 kV and lower than or equal to 30 kV.

The dopant may be added while heating at, for example, higher than or equal to 200° C. and lower than or equal to 700° C., preferably higher than or equal to 300° C. and lower than or equal to 500° C., and further preferably higher than or equal to 350° C. and lower than or equal to 450° C.

Examples of th dopant include helium, neon, argon, krypton, xenon, nitrogen, fluorine, phosphorus, chlorine, arsenic, boron, magnesium, aluminum, silicon, titanium, vanadium, chromium, nickel, zinc, gallium, germanium, yttrium, zirconium, niobium, molybdenum, indium, tin, lanthanum, cerium, neodymium, hafnium, tantalum, and tungsten. Among these elements, helium, argon, krypton, xenon, nitrogen, phosphorus, and boron are preferable because these elements can be added with high controllability for the resistance by an ion implantation method, an ion doping method, or the like.

The method of dopant addition is not limited to an ion doping method and an ion implantation method. For example, dopant addition may be performed in such a manner that an object is exposed to plasma including a dopant. Alternatively, for example, an insulator or the like which includes a dopant may be formed and the dopant may be diffused by heating or the like. In particular, two or more of the methods of dopant addition are preferably combined.

Heat treatment may be performed after the dopant addition. The heat treatment may be performed at higher than or equal to 250° C. and lower than or equal to 650° C., preferably higher than or equal to 350° C. and lower than or equal to 450° C. in a nitrogen atmosphere, or under reduced pressure or air (ultra dry air), for example.

The insulator 411 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 411 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator 408 may be formed to have, for example, a single-layer structure or a stacked-layer structure including an insulator including boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 408 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator 408 is preferably an insulator having a low oxygen-transmitting property. Alternatively, the insulator 408 is preferably an insulator having a low hydrogen-transmitting property.

The insulator 406a, the semiconductor 406b, and the insulator 406c are described below.

Placing the insulator 406a under the semiconductor 406b and placing the insulator 406c over the semiconductor 406b can increase electrical characteristics of the transistor in some cases.

The insulator 406a preferably includes a CAAC-OS. The semiconductor 406b preferably includes a CAAC-OS. The insulator 406c preferably includes a CAAC-OS.

The semiconductor 406b is an oxide containing indium, for example. The semiconductor 406b has high carrier mobility (electron mobility) by containing indium, for example. The semiconductor 406b preferably contains an element M The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, and the like. Note that two or more of the above elements may be used in combination as the element M The element M is an element having a high bonding energy with oxygen, for example.

The element M is an element whose bonding energy with oxygen is higher than that of indium. The element M is an element that can increase the energy gap of the oxide, for example. Furthermore, the semiconductor 406b preferably contains zinc. When the oxide contains zinc, the oxide semiconductor is easily crystallized, in some cases.

Note that the semiconductor 406b is not limited to the oxide containing indium. The semiconductor 406b may be, for example, an oxide which does not contain indium and contains zinc, an oxide which does not contain indium and contains gallium, or an oxide which does not contain indium and contains tin, e.g., a zinc tin oxide or a gallium tin oxide.

For the semiconductor 406b, an oxide with a wide energy gap may be used. For example, the energy gap of the semiconductor 406b is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

For example, the insulator 406a and the insulator 406c are oxides including one or more elements, or two or more elements other than oxygen included in the semiconductor 406b. Since the insulator 406a and the insulator 406c each include one or more elements, or two or more elements other than oxygen included in the semiconductor 406b, a defect state is less likely to be formed at the interface between the insulator 406a and the semiconductor 406b and the interface between the semiconductor 406b and the insulator 406c.

The insulator 406a, the semiconductor 406b, and the insulator 406c preferably contain at least indium. In the case of using an In-M-Zn oxide as the insulator 406a, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case of using an In-M-Zn oxide as the semiconductor 406b, when the summation of In and M is assumed to be 100 atomic %, the proportions of In and M are preferably set to be greater than 25 atomic % and less than 75 atomic %, respectively, more preferably greater than 34 atomic % and less than 66 atomic %, respectively. In the case of using an In-M-Zn oxide as the insulator 406c, when the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. Note that the insulator 406c may be an oxide that is a type the same as that of the insulator 406a. Note that the insulator 406a and/or the insulator 406c do/does not necessarily contain indium in some cases. For example, the insulator 406a and/or the insulator 406c may be gallium oxide. Note that the atomic ratios of the elements included in the insulator 406a, the semiconductor 406b, and the insulator 406c are not necessarily simple ratios of integers.

As the semiconductor 406b, an oxide having an electron affinity higher than those of the insulators 406a and 406c is used. For example, as the semiconductor 406b, an oxide having an electron affinity higher than those of the insulators 406a and 406c by 0.07 eV or higher and 1.3 eV or lower, preferably 0.1 eV or higher and 0.7 eV or lower, or further preferably 0.15 eV or higher and 0.4 eV or lower is used. Note that the electron affinity refers to an energy gap between the vacuum level and the bottom of the conduction band.

An indium gallium oxide has a small electron affinity and a high oxygen-blocking property. Therefore, the insulator 406c preferably includes an indium gallium oxide. The gallium atomic ratio [Ga/(In+Ga)] is, for example, higher than or equal to 70%, preferably higher than or equal to 80%, further preferably higher than or equal to 90%.

At this time, when a gate voltage is applied, a channel is formed in the semiconductor 406b having the highest electron affinity in the insulator 406a, the semiconductor 406b, and the insulator 406c.

Figure 11:
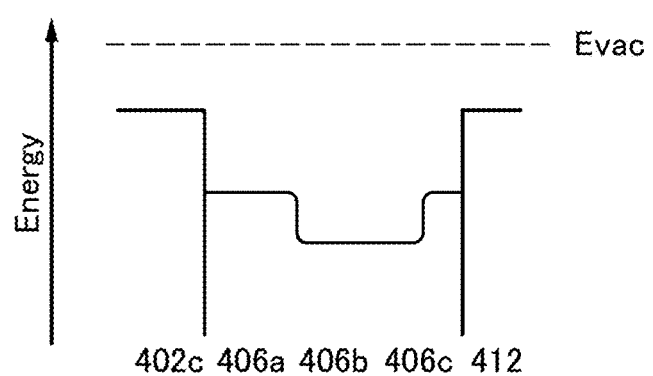
FIG. 11 shows a band diagram of a channel formation region and the vicinity of the channel formation region in a transistor of one embodiment of the present invention.

Here, in some cases, there is a mixed region of the insulator 406a and the semiconductor 406b between the insulator 406a and the semiconductor 406b. Furthermore, in some cases, there is a mixed region of the semiconductor 406b and the insulator 406c between the semiconductor 406b and the insulator 406c. The mixed region has a low density of defect states. For that reason, in a band diagram of a stack including the insulator 406a, the semiconductor 406b, and the insulator 406c (see FIG. 11), energy changes continuously at each interface and in the vicinity of the interface (continuous junction). Note that boundaries of the insulator 406a, the semiconductor 406b, and the insulator 406c are not clear in some cases.

At this time, electrons move mainly in the semiconductor 406b, not in the insulators 406a and 406c. Note that the insulator 406a and the insulator 406c can exhibit a property of any of a conductor, a semiconductor, and an insulator when existing alone. When the transistor operates, however, they each have a region where a channel is not formed. Specifically, a channel is formed only in a region near the interface between the insulator 406a and the semiconductor 406b and a region near the interface between the insulator 406c and the semiconductor 406b, whereas a channel is not formed in the other region. Therefore, the insulator 406a and the insulator 406c can be called insulators when the transistor operates, and are thus referred to as, not semiconductors or conductors, but insulators in this specification. The insulator 406a, the semiconductor 406b, and the insulator 406c are separately called semiconductor or insulator only because of the relative difference in physical property. Therefore, for example, an insulator that can be used as the insulator 406a or the insulator 406c can be used as the semiconductor 406b in some cases. As described above, when the density of defect states at the interface between the insulator 406a and the semiconductor 406b and the density of defect states at the interface between the semiconductor 406b and the insulator 406c are decreased, electron movement in the semiconductor 406b is less likely to be inhibited and the on-state current of the transistor can be increased.

As factors in inhibiting electron movement are decreased, the on-state current of the transistor can be increased. For example, in the case where there is no factor of inhibiting electron movement, electrons are assumed to be moved efficiently. Electron movement is inhibited, for example, in the case where physical unevenness in a channel formation region is large.

To increase the on-state current of the transistor, for example, root mean square (RMS) roughness with a measurement area of 1 μm×1 μm of the top or bottom surface of the semiconductor 406b (a formation surface; here, the top surface of the insulator 406a) is less than 1 nm, preferably less than 0.6 nm, further preferably less than 0.5 nm, still further preferably less than 0.4 nm. The average surface roughness (also referred to as Ra) with the measurement area of 1 μm×1 μm is less than 1 nm, preferably less than 0.6 nm, more preferably less than 0.5 nm, still more preferably less than 0.4 nm. The maximum difference (P–V) with the measurement area of 1 μm×1 μm is less than 10 nm, preferably less than 9 nm, further preferably less than 8 nm, still further preferably less than 7 nm. RMS roughness, Ra, and P-V can be measured using a scanning probe microscope SPA-500 manufactured by SII Nano Technology Inc.

Moreover, the thickness of the insulator 406c is preferably as small as possible to increase the on-state current of the transistor. The thickness of the insulator 406c is less than 10 nm, preferably less than or equal to 5 nm, further preferably less than or equal to 3 nm, for example. Meanwhile, the insulator 406c has a function of blocking entry of elements other than oxygen (such as hydrogen and silicon) included in the adjacent insulator into the semiconductor 406b where a channel is formed. For this reason, it is preferable that the insulator 406c have a certain thickness. The thickness of the insulator 406c is greater than or equal to 0.3 nm, preferably greater than or equal to 1 nm, further preferably greater than or equal to 2 nm, for example. The insulator 406c preferably has an oxygen-blocking property to prevent outward diffusion of oxygen released from other insulators.

To improve reliability, preferably, the thickness of the insulator 406a is large and the thickness of the insulator 406c is small. For example, the insulator 406a has a region with a thickness, for example, greater than or equal to 10 nm, preferably greater than or equal to 20 nm, further preferably greater than or equal to 40 nm, still further preferably greater than or equal to 60 nm. When the thickness of the insulator 406a is made large, a distance from an interface between the adjacent insulator and the insulator 406a to the semiconductor 406b in which a channel is formed can be large. Since the productivity of the semiconductor device might be decreased, the insulator 406a has a region with a thickness, for example, less than or equal to 200 nm, preferably less than or equal to 120 nm, further preferably less than or equal to 80 nm.

A region with a silicon concentration measured by secondary ion mass spectrometry (SIMS) of higher than or equal to $1 \times 10^{16}$ atoms/cm$^3$ and lower than or equal to $1 \times 10^{19}$ atoms/cm$^3$, preferably higher than or equal to $1 \times 10^{16}$ atoms/cm$^3$ and lower than or equal to $5 \times 10^{18}$ atoms/cm$^3$, further preferably higher than or equal to $1 \times 10^{16}$ atoms/cm$^3$ and lower than or equal to $2 \times 10^{18}$ atoms/cm$^3$ is provided between the semiconductor 406b and the insulator 406a, for example. A region with a silicon concentration measured by SIMS of higher than or equal to $1 \times 10^{16}$ atoms/cm$^3$ and lower than or equal to $1 \times 10^{19}$ atoms/cm$^3$, preferably higher than or equal to $1 \times 10^{16}$ atoms/cm$^3$ and lower than or equal to $5 \times 10^{18}$ atoms/cm$^3$, further preferably higher than or equal to $1 \times 10^{16}$ atoms/cm$^3$ and lower than or equal to $2 \times 10^{18}$ atoms/cm$^3$ is provided between the semiconductor 406b and the insulator 406c.

The semiconductor 406b has a region in which the hydrogen concentration measured by SIMS is greater than or equal to $1 \times 10^{16}$ atoms/cm$^3$ and less than or equal to $2 \times 10^{20}$ atoms/cm$^3$, preferably greater than or equal to $1 \times 10^{16}$ atoms/cm$^3$ and less than or equal to $5 \times 10^{19}$ atoms/cm$^3$, further preferably greater than or equal to $1 \times 10^{16}$ atoms/cm$^3$ and less than or equal to $1 \times 10^{19}$ atoms/cm$^3$, or still further preferably greater than or equal to $1 \times 10^{16}$ atoms/cm$^3$ and less than or equal to $5 \times 10^{18}$ atoms/cm$^3$. It is preferable to reduce the hydrogen concentrations of the insulator 406a and the insulator 406c in order to reduce the hydrogen concentration of the semiconductor 406b. The insulator 406a and the insulator 406c each include a region with a hydrogen concentration measured by SIMS of higher than or equal to $1 \times 10^{16}$ atoms/cm$^3$ and lower than or equal to $2 \times 10^{20}$ atoms/cm$^3$, preferably higher than or equal to $1 \times 10^{16}$ atoms/cm$^3$ and lower than or equal to $5 \times 10^{19}$ atoms/cm$^3$, further preferably higher than or equal to $1 \times 10^{16}$ atoms/cm$^3$ and lower than or equal to $1 \times 10^{19}$ atoms/cm$^3$, or still further preferably higher than or equal to $1 \times 10^{16}$ atoms/cm$^3$ and lower than or equal to $5 \times 10^{18}$ atoms/cm$^3$. The semiconductor 406b has a region in which the nitrogen concentration measured by SIMS is greater than or equal to $1 \times 10^{15}$ atoms/cm$^3$ and less than or equal to $5 \times 10^{19}$ atoms/cm$^3$, preferably greater than or equal to $1 \times 10^{15}$ atoms/cm$^3$ and less than or equal to $5 \times 10^{18}$ atoms/cm$^3$, further preferably greater than or equal to $1 \times 10^{15}$ atoms/cm$^3$ and less than or equal to $1 \times 10^{18}$ atoms/cm$^3$, or still further preferably greater than or equal to $1 \times 10^{15}$ atoms/cm$^3$ and less than or equal to $5 \times 10^{17}$ atoms/cm$^3$. It is preferable to reduce the nitrogen concentrations of the insulator 406a and the insulator 406c in order to reduce the nitrogen concentration of the semiconductor 406b. The insulator 406a and the insulator 406c each include a region with a nitrogen concentration measured by SIMS of higher than or equal to $1 \times 10^{15}$ atoms/cm$^3$ and lower than or equal to $5 \times 10^{19}$ atoms/cm$^3$, preferably higher than or equal to $1 \times 10^{15}$ atoms/cm$^3$ and lower than or equal to $5 \times 10^{18}$ atoms/cm$^3$, further preferably higher than or equal to $1 \times 10^{15}$ atoms/cm$^3$ and lower than or equal to $1 \times 10^{18}$ atoms/cm$^3$, or still further preferably higher than or equal to $1 \times 10^{15}$ atoms/cm$^3$ and lower than or equal to $5 \times 10^{17}$ atoms/cm$^3$.

The above three-layer structure is an example. For example, a two-layer structure without the insulator 406a or the insulator 406c may be employed. A four-layer structure in which any one of the semiconductors described as examples of the insulator 406a, the semiconductor 406b, and the insulator 406c is provided below or over the insulator 406a or below or over the insulator 406c may be employed. An n-layer structure (n is an integer of 5 or more) may be employed in which one or more of the semiconductors described as examples of the insulator 406a, the semiconductor 406b, and the insulator 406c is provided at two or more of the following positions: over the insulator 406a, under the insulator 406a, over the insulator 406c, and under the insulator 406c.

<Composition>

The composition of an In-M-Zn oxide is described below. The element M is aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, and the like.

Figure 12:
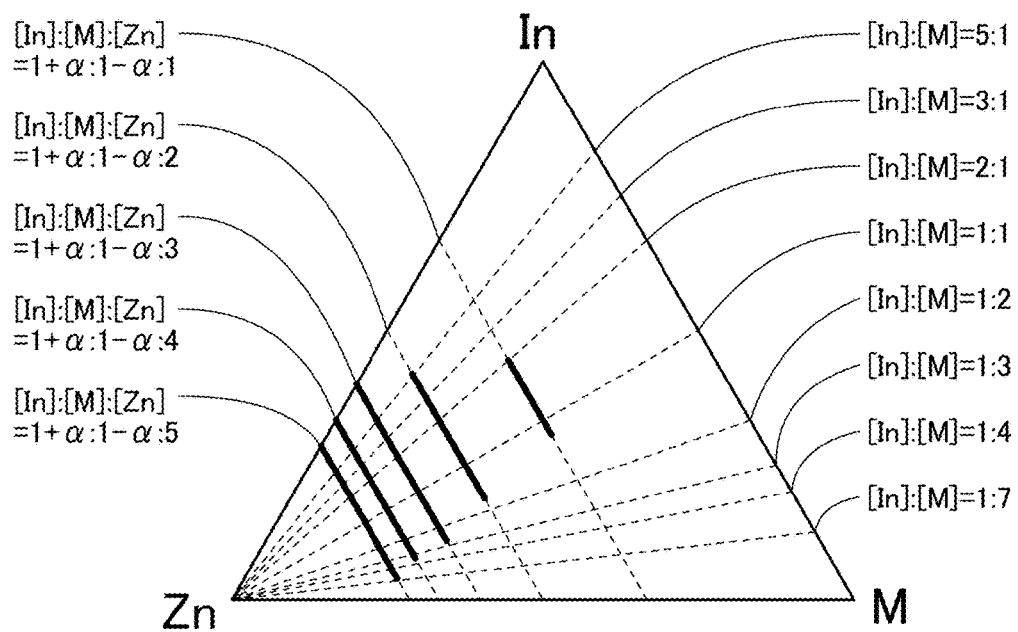
FIG. 12 is a ternary diagram for explaining composition of an In-M-Zn oxide.

FIG. 12 is a triangular diagram whose vertices represent In, M, and Zn. In the diagram, [In] means the atomic concentration of In, [M] means the atomic concentration of the element M, and [Zn] means the atomic concentration of Zn.

A crystal of an In-M-Zn oxide is known to have a homologous structure and is represented by $InMO_3(ZnO)_m$ (m is a natural number). Since In and M can be interchanged, the crystal can also be represented by $In_{1+\alpha}M_{1-\alpha}O_3(ZnO)_m$. This composition is represented by any of the dashed lines denoted as [In]:[M]:[Zn]=$1+\alpha:1-\alpha:1$, [In]:[M]:[Zn]=$1+\alpha:1-\alpha:2$, [In]:[M]:[Zn]=$1+\alpha:1-\alpha:3$, [In]:[M]:[Zn]=$1+\alpha:1-\alpha:4$, and [In]:[M]:[Zn]=$1+\alpha:1-\alpha:5$. Note that the bold line on the dashed line represents, for example, the composition that allows an oxide as a raw material mixed and subjected to baking at 1350° C. to be a solid solution.

Thus, when an oxide has a composition close to the above composition that allows the oxide to be a solid solution, the crystallinity can be increased. When an In-M-Zn oxide is deposited by a sputtering method, the composition of a target might be different from the composition of a deposited film. For example, using an In-M-Zn oxide in which an atomic ratio is 1:1:1, 1:1:1.2, 3:1:2, 4:2:4.1, 5:1:7, 1:3:2, 1:3:4, or 1:4:5 as a target results in a film having an atomic ratio of 1:1:0.7 (approximately 1:1:0.5 to 1:1:0.9), 1:1:0.9 (approximately 1:1:0.8 to 1:1:1.1), 3:1:1.5 (approximately 3:1:1 to 3:1:1.8), 4:2:3 (approximately 4:2:2.6 to 4:2:3.6), 5:1:6 (approximately 5:1:5.5 to 5:1:6.5), 1:3:1.5 (approximately 1:3:1 to 1:3:1.8), 1:3:3 (approximately 1:3:2.5 to 1:3:3.5), or 1:4:4 (approximately 1:4:3.4 to 1:4:4.4). Thus, in order to obtain a film with a desired composition, a composition of a target may be selected in consideration of a change in the composition.

<Structure of Oxide Semiconductor>

A structure of an oxide semiconductor is described below.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 59A:
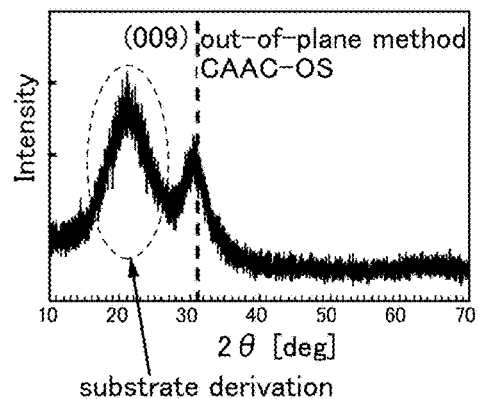
FIGS. 59A to 59E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 59A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 59B:
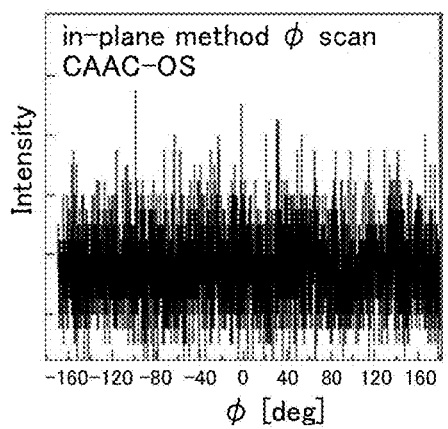
Figure 59C:
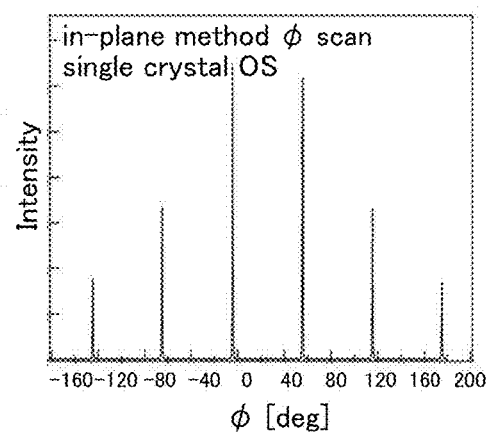

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (φ scan) is performed with 2θ fixed at around 56° and with the sample rotated using a normal vector to the sample surface as an axis (φ axis), as shown in FIG. 59B, a peak is not clearly observed. In contrast, in the case where single crystal InGaZnO$_4$ is subjected to φ scan with 2θ fixed at around 56°, as shown in FIG. 59C, six peaks that are derived from crystal planes equivalent to the (110) plane are observed. Accordingly, the structural analysis using XRD shows that the directions of a-axes and b-axes are irregularly oriented in the CAAC-OS.

Figure 59D:
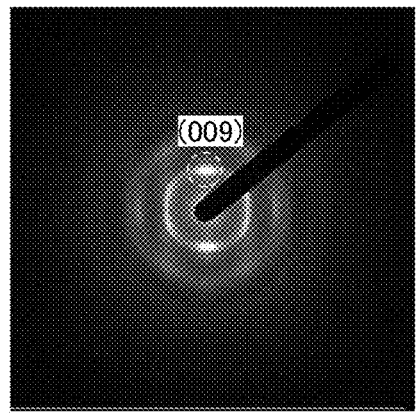
Figure 59E:
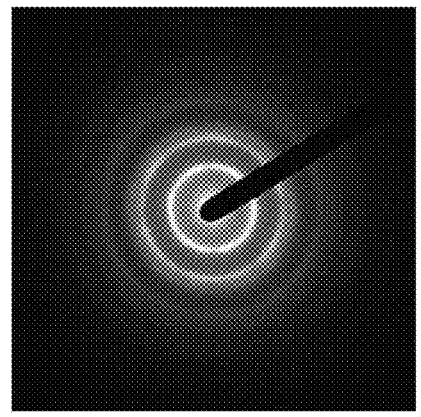

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 59D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 59E shows a diffraction pattern obtained in such a manner that an electron beam with a probe diameter of 300 nm is incident on the same sample in a direction perpendicular to the sample surface. As shown in FIG. 59E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 59E is considered to be derived from the (010) plane, the (100) plane, and the like of the InGaZnO$_4$ crystal. The second ring in FIG. 59E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 60A:
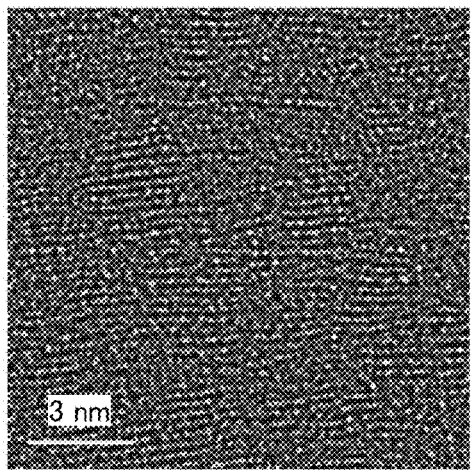
FIGS. 60A to 60E show a cross-sectional TEM image and plan-view TEM images of a CAAC-OS and images obtained through analysis thereof.

FIG. 60A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 60A shows pellets in which metal atoms are arranged in a layered manner. FIG. 60A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 60B:
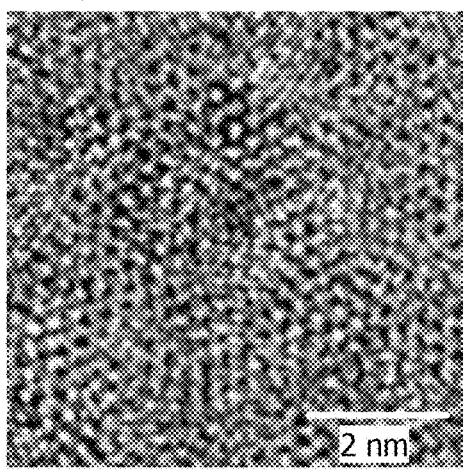
Figure 60C:
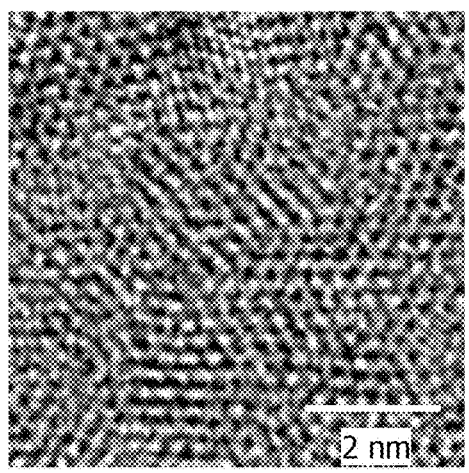

FIGS. 60B and 60C show Cs-corrected high-resolution TEM images of a plane of the CAAC-OS observed from a direction substantially perpendicular to the sample surface.

Figure 60D:
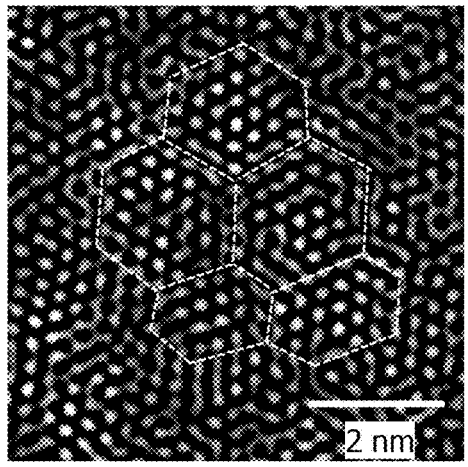
Figure 60E:
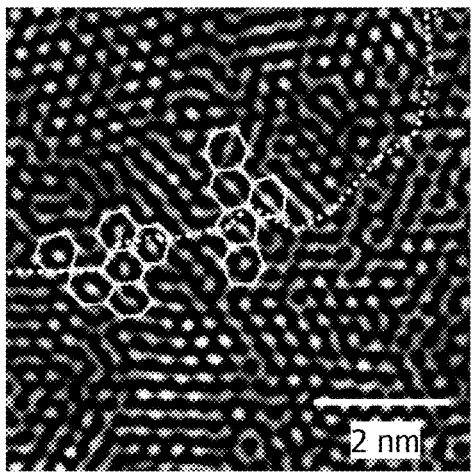

FIGS. 60D and 60E are images obtained through image processing of FIGS. 60B and 60C. The method of image processing is as follows. The image in FIG. 60B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 60D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 60E, a dotted line denotes a portion between a region where a lattice arrangement is well aligned and another region where a lattice arrangement is well aligned. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed. That is, a lattice arrangement is distorted so that formation of a crystal grain boundary is inhibited. This is probably because the CAAC-OS can tolerate distortion owing to a low density of the atomic arrangement in an a-b plane direction, the interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities included in the oxide semiconductor might serve as carrier traps or carrier generation sources, for example. For example, oxygen vacancy in the oxide semiconductor might serve as a carrier trap or serve as a carrier generation source when hydrogen is captured therein.

The CAAC-OS having small amounts of impurities and oxygen vacancy is an oxide semiconductor film with a low carrier density (specifically, lower than $8 \times 10^{11}/cm^3$, preferably lower than $1 \times 10^{11}/cm^3$, and further preferably lower than $1 \times 10^{10}/cm^3$ and higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 61A:
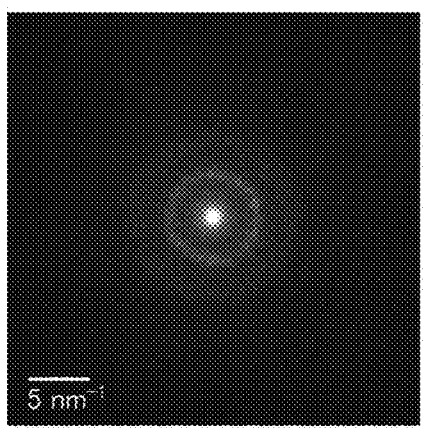
FIGS. 61A to 61D show electron diffraction patterns and a cross-sectional TEM image of an nc-OS.
Figure 61B:
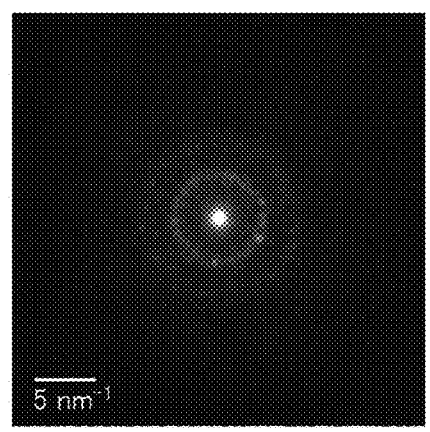

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 61A is observed. FIG. 61B shows a diffraction pattern obtained when an electron beam with a probe diameter of 1 nm is incident on the same sample. As shown in FIG. 61B, a plurality of spots are observed in a ring-like region. In other words, ordering in an nc-OS is not observed with an electron beam with a probe diameter of 50 nm but is observed with an electron beam with a probe diameter of 1 nm.

Figure 61C:
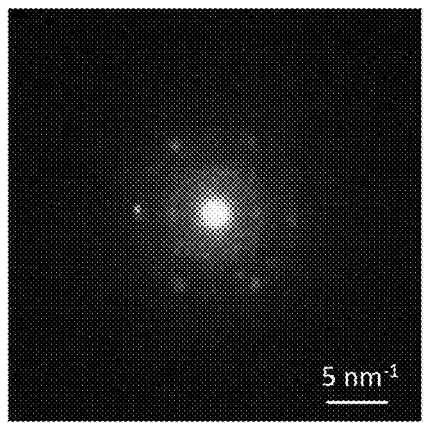

Furthermore, an electron diffraction pattern in which spots are arranged in an approximately hexagonal shape is observed in some cases as shown in FIG. 61C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 61D:
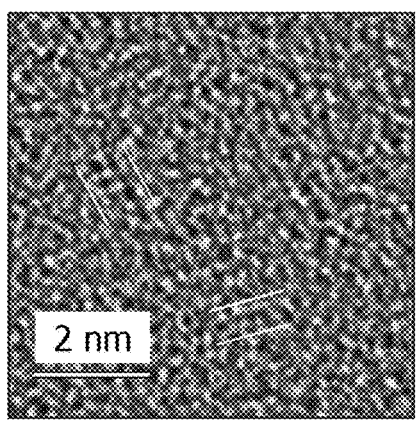

FIG. 61D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 61D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure between those of the nc-OS and the amorphous oxide semiconductor.

Figure 62A:
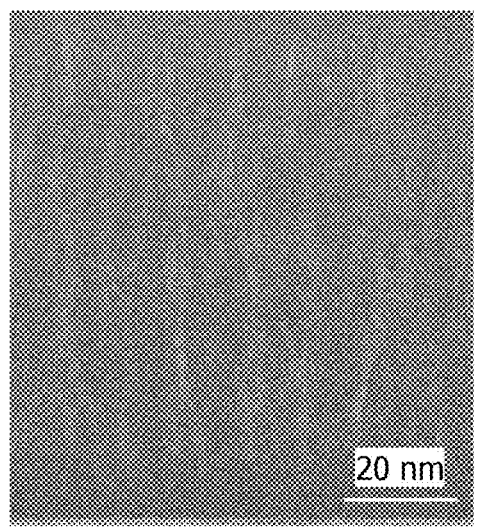
FIGS. 62A and 62B show cross-sectional TEM images of an a-like OS.
Figure 62B:
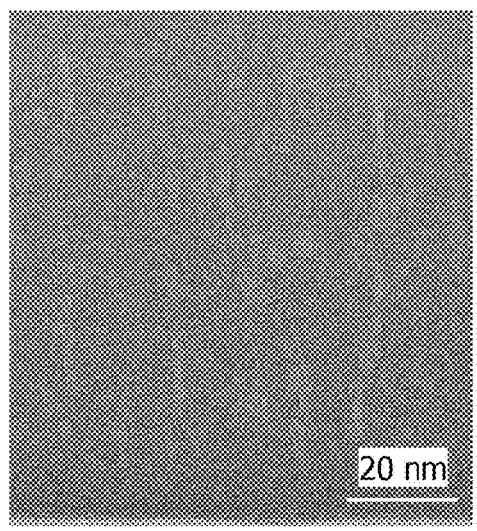

FIGS. 62A and 62B are high-resolution cross-sectional TEM images of an a-like OS. FIG. 62A is the high-resolution cross-sectional TEM image of the a-like OS at the start of the electron irradiation. FIG. 62B is the high-resolution cross-sectional TEM image of a-like OS after the electron (e) irradiation at $4.3 \times 10^8$ e$^-$/nm$^2$. FIGS. 62A and 62B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 63:
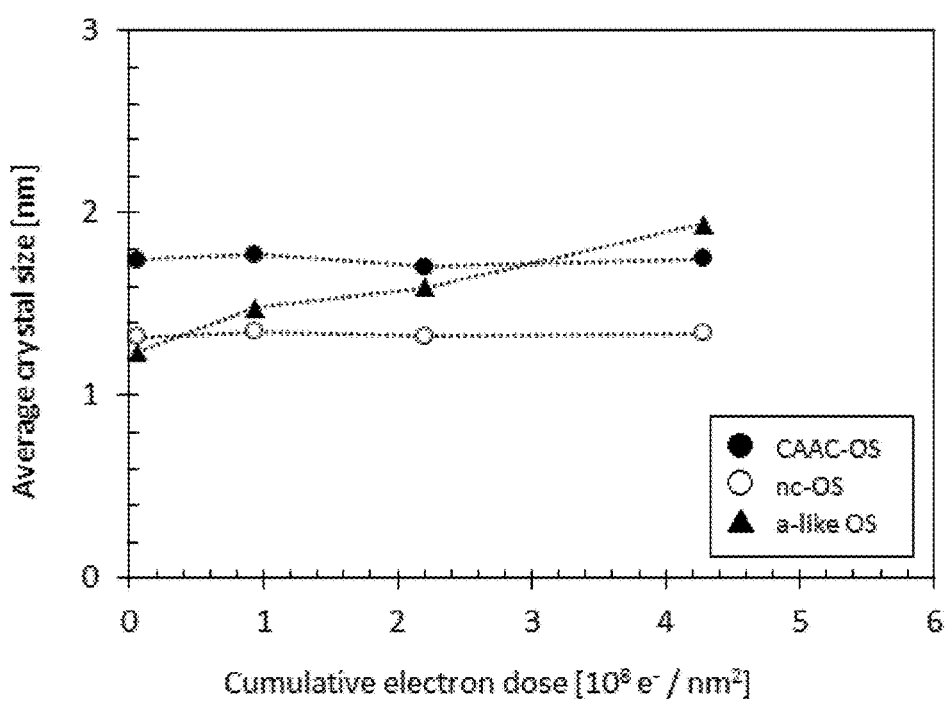
FIG. 63 shows a change of crystal parts of an In—Ga—Zn oxide due to electron irradiation.

FIG. 63 shows change in the average size of crystal parts (at 22 points to 30 points) in each sample. Note that the crystal part size corresponds to the length of a lattice fringe. FIG. 63 indicates that the crystal part size in the a-like OS increases with an increase in the cumulative electron dose in obtaining TEM images, for example. As shown in FIG. 63, a crystal part of approximately 1.2 nm (also referred to as an initial nucleus) at the start of TEM observation grows to a size of approximately 1.9 nm at a cumulative electron (e) dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e/nm$^2$. As shown in FIG. 63, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ e$^-$/(nm$^2$·s); and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

<Method 2 for Manufacturing Transistor>

A method for manufacturing a transistor included in a semiconductor device of one embodiment of the present invention is described below with reference to FIGS. 13A to 13C, FIGS. 14A to 14C, FIGS. 15A to 15C, FIGS. 16A to 16C, FIGS. 17A to 17C, FIGS. 18A to 18C, and FIGS. 19A to 19C. Note that the method for manufacturing a transistor illustrated in FIGS. 1A to 1C, FIGS. 2A to 2C, FIGS. 3A to 3C, FIGS. 4A to 4C, FIGS. 5A to 5C, FIGS. 6A to 6C, FIGS. 7A to 7C, FIGS. 8A to 8C, FIGS. 9A to 9C, and FIGS. 10A to 10C can be referred to.

First, the substrate 400 is prepared.

Next, an insulator that is to be the insulator 401 is formed. Then, part of the insulator to be the insulator 401 is etched, whereby the insulator 401 having a groove is formed.

Next, a conductor that is to be the conductor 413 is formed to fill the groove of the insulator 401. Subsequently, the conductor to be the conductor 413 is processed by a CMP method or the like to remove a portion of the conductor 413 above the top surface of the insulator 401; as a result, the conductor 413 is formed. Instead of a CMP method, a dry etching method, an MP method, or the like may be used. Alternatively, two or more of these methods may be combined to be employed.

Note that the insulator to be the insulator 401 is not necessarily provided in some cases. In such cases, the conductor 413 may be formed by etching part of the conductor to be the conductor 413 by using an etching mask. Furthermore, the conductor to be the conductor 413 is not necessarily provided in some cases. In such cases, a process relating to formation of the conductor 413 in manufacturing methods that will be described below can be omitted.

Next, the insulator 402a, the insulator 402b, and the insulator 402c are formed in this order.

Note that one or more of the insulators 402a, 402b, and 402c are not necessarily formed in some cases. In such cases, a process relating to formation of one or more of the insulators 402a, 402b, and 402c in the manufacturing methods that will be described below can be omitted.

Next, first heat treatment is preferably performed. The first heat treatment can be performed at a temperature higher than or equal to 50° C. and lower than or equal to 650° C., preferably higher than or equal to 450° C. and lower than or equal to 600° C., further preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, impurities such as hydrogen and water can be removed from the oxide semiconductor film, for example.

Next, an insulator that is to be the insulator 406a, a semiconductor that is to be the semiconductor 406b, and a conductor that is to be the conductor 416 are formed in this order. Here, the insulator to be the insulator 406a and/or the conductor to be the conductor 416 are/is not necessarily formed in some cases. In such cases, a process relating to formation of the insulator 406a and/or the conductor 416 in the manufacturing methods that will be described below can be omitted.

Figure 13A:
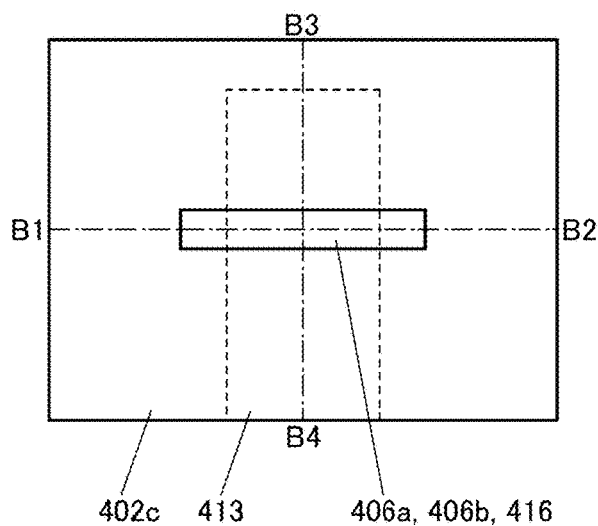
FIGS. 13A to 13C are a top view and cross-sectional views of a transistor of one embodiment of the present invention.
Figure 13C:
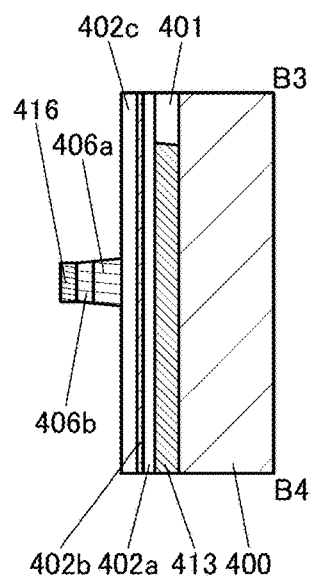
Figure 13B:
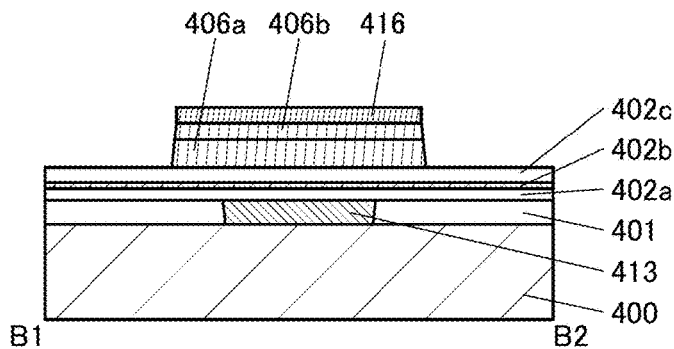

Subsequently, part of the conductor to be the conductor 416 is etched to form the island-shaped conductor 416. Then, part of the semiconductor to be the semiconductor 406b and part of the insulator to be the insulator 406a are etched using the conductor 416, whereby the semiconductor 406b and the insulator 406a are formed (see FIGS. 13A to 13C). Note that FIG. 13A is a top view, FIG. 13B is a cross-sectional view taken along dashed-dotted line B1-B2 in FIG. 13A, and FIG. 13C is a cross-sectional view taken along dashed-dotted line B3-B4 in FIG. 13A.

Use of the conductor 416 for etching of the semiconductor to be the semiconductor 406b and the insulator to be the insulator 406a can stabilize the shapes of the obtained semiconductor 406b and insulator 406a, as compared to the case of using a resist. That is, the obtained semiconductor 406b and insulator 406a can have minute shapes. Note that in the case where the conductor to be the conductor 416 is not formed, a resist may be used for etching for forming the semiconductor 406b and/or etching for forming the insulator 406a.

After that, second heat treatment may be performed. For the method of the second heat treatment, the description of the method of the first heat treatment is referred to. The second heat treatment may remove impurities including hydrogen and the like that have been mixed at the time of etching. Furthermore, the second heat treatment may increase the crystallinity of the semiconductor 406b and/or the crystallinity of the insulator 406a.

Figure 14A:
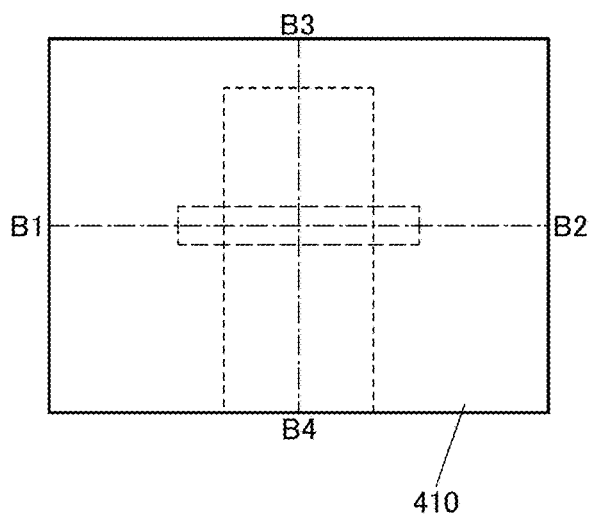
FIGS. 14A to 14C are a top view and cross-sectional views of the transistor of one embodiment of the present invention.
Figure 14C:
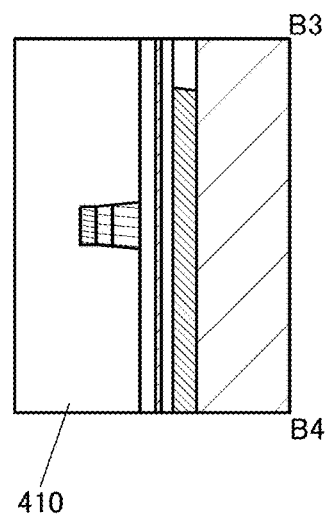
Figure 14B:
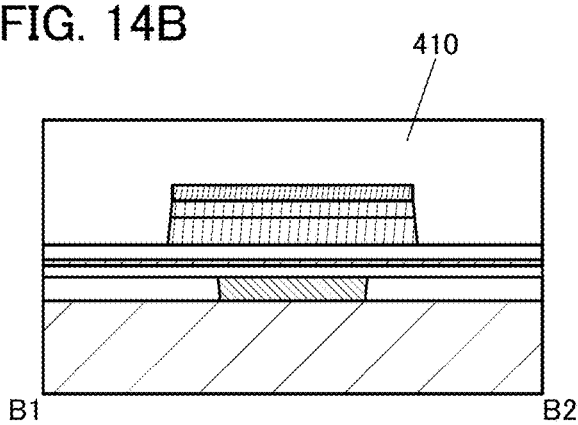

Next, the insulator 410 is formed (see FIGS. 14A to 14C). Note that FIG. 14A is a top view, FIG. 14B is a cross-sectional view taken along dashed-dotted line B1-B2 in FIG. 14A, and FIG. 14C is a cross-sectional view taken along dashed-dotted line B3-B4 in FIG. 14A.

Next, third heat treatment may be performed. For the method of the third heat treatment, the description of the method of the first heat treatment is referred to. The third heat treatment may remove impurities including hydrogen and the like. Furthermore, the third heat treatment may increase the crystallinity of the semiconductor 406b and/or the crystallinity of the insulator 406a.

Figure 15A:
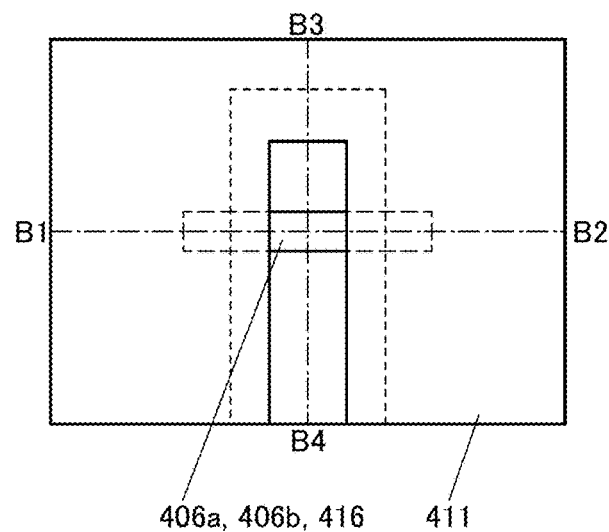
FIGS. 15A to 15C are a top view and cross-sectional views of the transistor of one embodiment of the present invention.
Figure 15C:
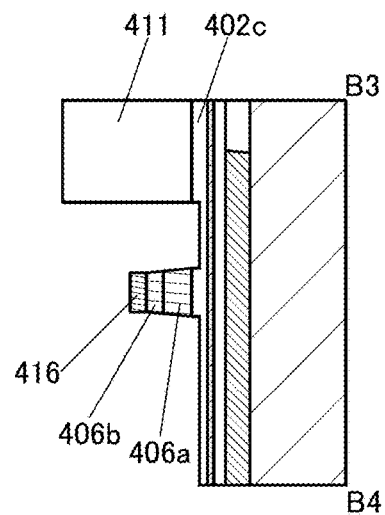
Figure 15B:
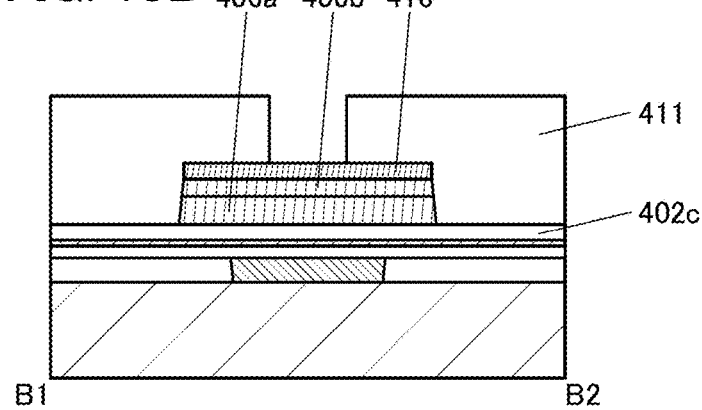

Next, the insulator 410 is partly etched, so that the insulator 411 having a groove is formed (see FIGS. 15A to 15C). Note that FIG. 15A is a top view, FIG. 15B is a cross-sectional view taken along dashed-dotted line B1-B2 in FIG. 15A, and FIG. 15C is a cross-sectional view taken along dashed-dotted line B3-B4 in FIG. 15A.

Part of the conductor 416, part of the semiconductor 406b, part of the insulator 406a, and part of the insulator 402c are exposed by the etching of part of the insulator 410. At that time, the thickness of part of the insulator 402c or the like is reduced by etching in some cases.

Figure 16A:
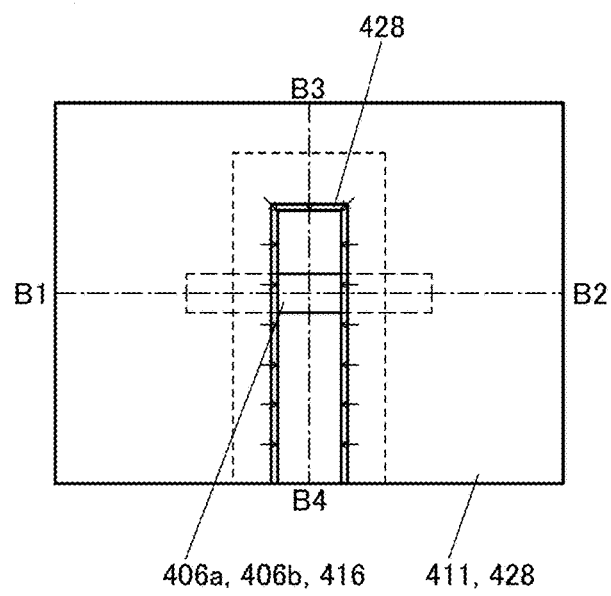
FIGS. 16A to 16C are a top view and cross-sectional views of the transistor of one embodiment of the present invention.
Figure 16C:
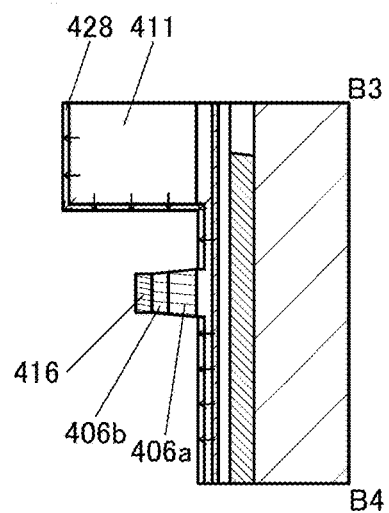
Figure 16B:
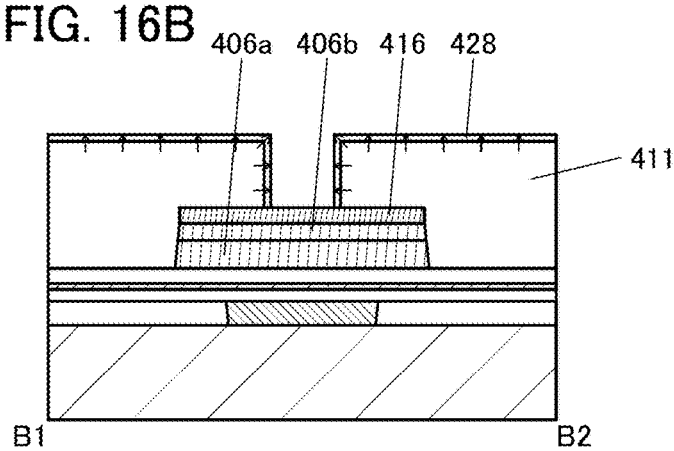

Next, a layer 428 is formed on top and side surfaces of the insulator 411 (see FIGS. 16A to 16C). Note that FIG. 16A is a top view, FIG. 16B is a cross-sectional view taken along dashed-dotted line B1-B2 in FIG. 16A, and FIG. 16C is a cross-sectional view taken along dashed-dotted line B3-B4 in FIG. 16A.

The layer 428 is selectively formed on the surfaces (the top and side surfaces and the like) of the insulator 411, and preferably it is not formed on surfaces (a top surface and the like) of the conductor 416. For example, in the case where the insulator 411 contains silicon, the layer 428 can be formed by a CVD method using a source gas containing silicon and halogen. In that case, it is preferable that at least an exposed surface of the conductor 416 do not contain silicon. Even if the exposed surface contains silicon, it is acceptable as long as the silicon concentration is low enough not to cause selective growth of the layer.

Figure 17A:
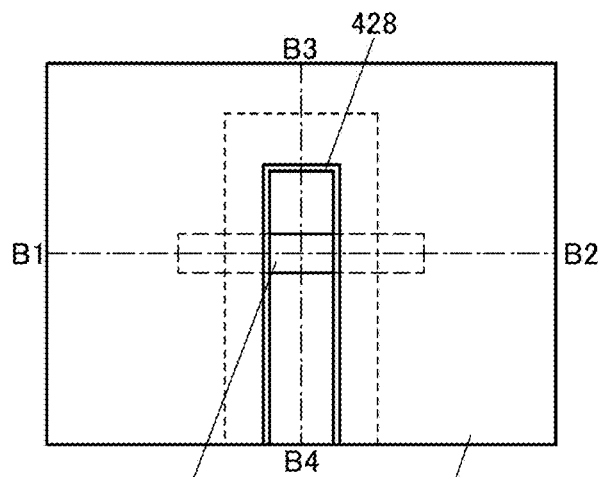
FIGS. 17A to 17C are a top view and cross-sectional views of the transistor of one embodiment of the present invention.
Figure 17C:
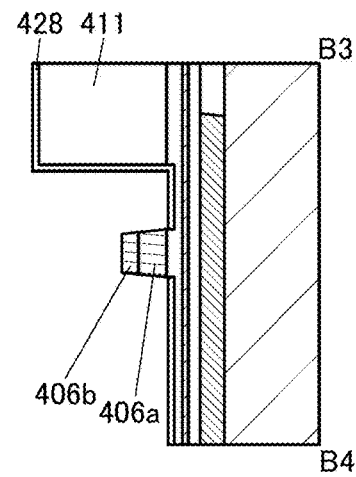
Figure 17B:
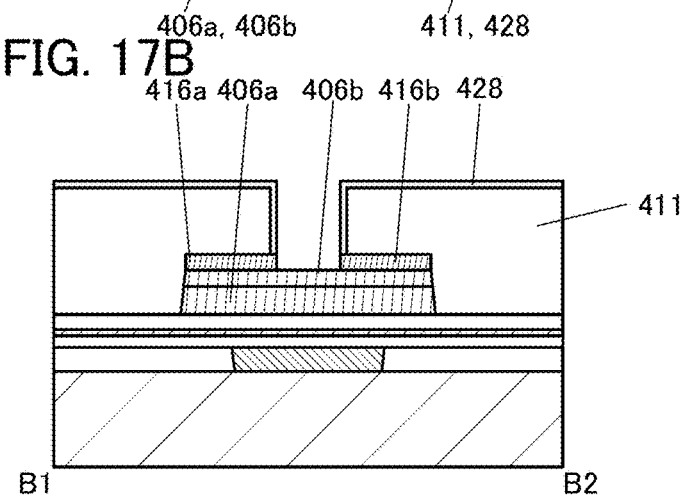

Next, part of the conductor 416 is etched using the insulator 411 and the layer 428, whereby the conductor 416a and the conductor 416b are formed (see FIGS. 17A to 17C). Note that FIG. 17A is a top view, FIG. 17B is a cross-sectional view taken along dashed-dotted line B1-B2 in FIG. 17A, and FIG. 17C is a cross-sectional view taken along dashed-dotted line B3-B4 in FIG. 17A.

The width of the exposed surface of the conductor 416 is reduced by the thickness of the layer 428. Therefore, the distance between the conductor 416a and the conductor 416b (corresponding to the channel length) can be smaller than the resolution limit of the exposure apparatus. For example, in the case where the width of the groove of the insulator 411 is 20 nm and the thickness of the layer 428 is 5 nm (the total thickness of the layer 428 on both side surfaces of the groove of the insulator 411 is 10 nm), the distance between the conductor 416a and the conductor 416b can be reduced to 10 nm.

Since the layer 428 functions as an etching mask as described above, it is preferable that the layer 428 not be formed over the surface of the conductor 416. Note that when the thickness of the layer 428 is smaller than that of the conductor 416, the layer 428 may be formed over the surface of the conductor 416 in some cases. At that time, part of the layer 428 provided over the surface of the conductor 416 can be etched by an anisotropy etching method, and part of the layer 428 provided on the side surface of the groove of the insulator 411 can remain. Therefore, the distance between the conductor 416a and the conductor 416b can be smaller than the width of the groove of the insulator 411 by using the layer 428 remaining on the side surface of the groove of the insulator 411.

After that, the remaining layer 428 may be removed.

Figure 18A:
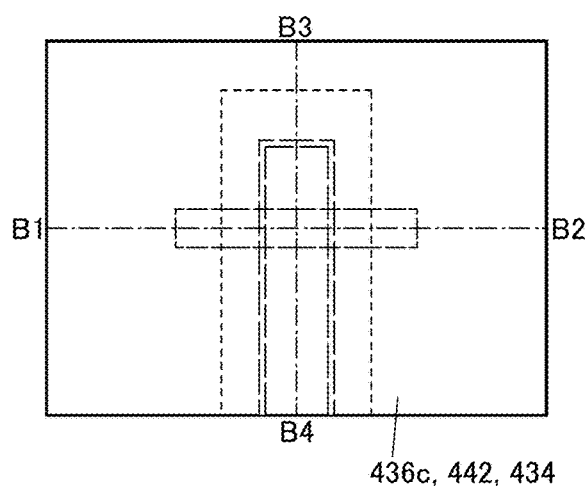
FIGS. 18A to 18C are a top view and cross-sectional views of the transistor of one embodiment of the present invention.
Figure 18C:
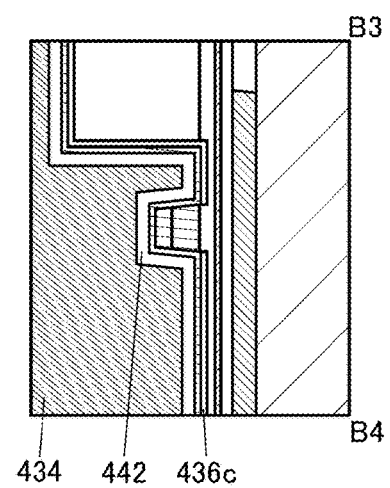
Figure 18B:
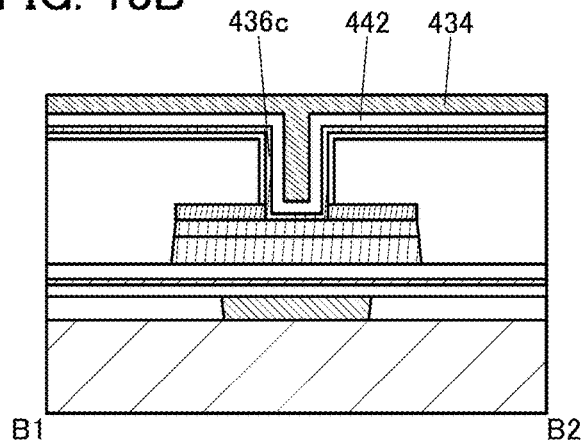

Next, the insulator 436c, the insulator 442, and the conductor 434 are stacked in this order (see FIGS. 18A to 18C). Note that FIG. 18A is a top view, FIG. 18B is a cross-sectional view taken along dashed-dotted line B1-B2 in FIG. 18A, and FIG. 18C is a cross-sectional view taken along dashed-dotted line B3-B4 in FIG. 18A.

Here, the insulator 436c is not necessarily formed in some cases. In such cases, a process relating to formation of the insulator 436c in the manufacturing methods that will be described below can be omitted.

It is preferable that the thickness of the insulator 436c and/or insulator 442 be set so that the insulator 436c and/or the insulator 442 do/does not completely fill the groove of the insulator 411 and the layer 428. For example, in the case where the width of the groove of the insulator 411 and the layer 428 is 12 nm, the total thickness of the insulator 436c and the insulator 442 is preferably less than 6 nm (the total thickness of the insulator 436c and the insulator 442 on both side surfaces of the groove of the insulator 411 is preferably less than 12 nm). Note that the thickness of the insulator 436c and/or the insulator 442 in a region which is in contact with the semiconductor 406b may be different from the thickness of the insulator 436c and/or the insulator 442 in a region in contact with the side surface of the groove of the insulator 411 and the layer 428. In that case, the total thickness of the insulator 436c and the insulator 442 in the region in contact with the side surface of the groove of the insulator 411 and the layer 428 is preferably smaller than the width of the groove of the insulator 411 and the layer 428. Meanwhile, the conductor 434 preferably has a thickness large enough to fill the groove of the insulator 411 and the layer 428 completely.

Next, the conductor 434, the insulator 442, the insulator 436c, and the layer 428 are processed by a CMP method or the like to remove a portion above the top surface of the insulator 411; as a result, the conductor 404, the insulator 412, the insulator 406c, and a layer 429 are formed. At that time, the thickness of the insulator 411 may be reduced. Instead of a CMP method, a dry etching method, an MP method, or the like may be used. Alternatively, two or more of these methods may be combined to be employed. Alternatively, part of the conductor 434, part of the insulator 442, part of the insulator 436c, and part of the layer 428 may be etched using an etching mask.

Figure 19A:
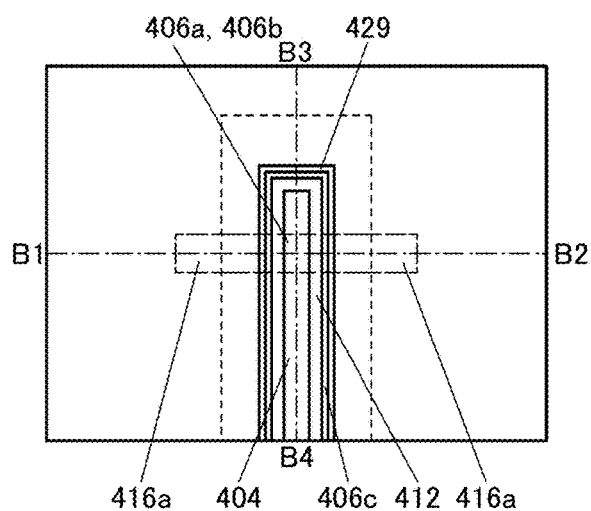
FIGS. 19A to 19C are a top view and cross-sectional views of the transistor of one embodiment of the present invention.
Figure 19C:
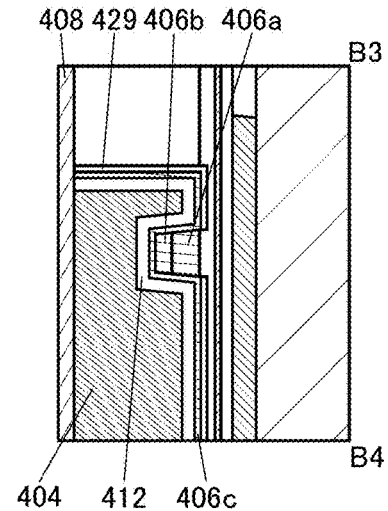
Figure 19B:
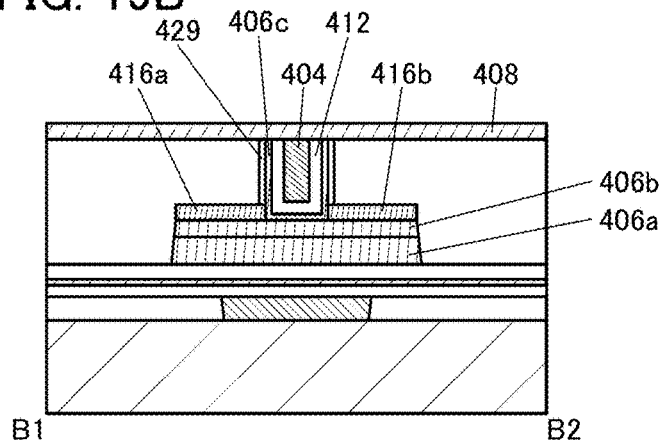

Then, the insulator 408 is formed. Thus, the transistor can be manufactured (see FIGS. 19A to 19C). Note that FIG. 19A is a top view, FIG. 19B is a cross-sectional view taken along dashed-dotted line B1-B2 in FIG. 19A, and FIG. 19C is a cross-sectional view taken along dashed-dotted line B3-B4 in FIG. 19A.

Formation of the insulator 408 is preferably performed under an atmosphere containing oxygen. In particular, formation of the insulator 408 is preferably performed by a sputtering method using an oxygen gas. Such a method enables excess oxygen to be added to, for example, the insulator 411 when the insulator 408 is formed.

Here, the insulator 408 is not necessarily formed in some cases.

After that, fourth heat treatment may be performed. For the method of the fourth heat treatment, the description of the method of the first heat treatment is referred to. The fourth heat treatment may remove impurities including hydrogen and the like. Furthermore, the fourth heat treatment may increase the crystallinity of the semiconductor 406b and/or the crystallinity of the insulator 406a. In the case where excess oxygen is added to the insulator 411 and the like at the time of formation of the insulator 408, the fourth heat treatment can diffuse the excess oxygen.

In the transistor illustrated in FIGS. 19A to 19C, the conductor 404 functions as a first gate electrode (also referred to as a front gate electrode), the insulator 412 functions as a first gate insulator (also referred to as a front gate insulator), the semiconductor 406b functions as a channel formation region, the conductor 416a functions as a source electrode, the conductor 416b functions as a drain electrode, the conductor 413 functions as a second gate electrode (also referred to as a back gate electrode), the insulators 402a, 402b, and 402c function as second gate insulators (also referred to as back gate insulators), and the insulator 408 functions as a barrier layer for preventing impurities from entering the transistor and/or has a function of preventing outward diffusion of excess oxygen.

The insulators 406a and 406c function as protective layers for the semiconductor 406b. For example, the insulators 406a and 406c, which are formed to surround the semiconductor 406b as illustrated in the cross-sectional view shown in FIG. 19C, can prevent formation of parasitic channel, carrier traps, and the like.

As illustrated in FIG. 19C, the transistor has a structure in which the semiconductor 406b and the like are electrically surrounded by the electric field of the conductor 404 functioning as a first gate electrode. A structure in which a semiconductor is electrically surrounded by an electric field of a gate electrode is referred to as an s-channel structure. Therefore, a channel is formed in the whole of the semiconductor 406b and the like (bulk) in some cases. In the s-channel structure, a large amount of current can flow between a source and a drain of the transistor, so that an on-state current can be increased. Furthermore, a current in an off state (off-state current) can be reduced.

It is preferable that the insulator 402a, the insulator 402b, and the insulator 402c include a layer or a region which traps charge, e.g., electrons (also referred to as a charge trap layer or a charge trap region). For example, the whole insulator 402b may be a charge trap layer, or a region in the vicinity of the interface between the insulator 402a and the insulator 402b or a region in the vicinity of the interface between the insulator 402b and the insulator 402c may be a charge trap region. Electrons can be injected to the charge trap layer or the charge trap region when a certain potential is applied to the conductor 413, for example. At that time, the amount of injected electrons can be adjusted by changing the level of the potential applied to the conductor 413 or a time for the application of the potential. The amount of electrons to be injected may be determined in accordance with required specifications. For example, the threshold voltage of the transistor can be increased by 0.3 V, 0.5 V, 0.8 V, 1 V, 1.5 V, or 2 V by adjusting the amount of electrons to be injected. As a result, a transistor having normally-off electrical characteristics can be obtained.

Note that the charge trap layer or the charge trap region is not necessarily provided below the semiconductor 406b. For example, the insulator 412 may have a stacked-layer structure, and the charge trap layer or the charge trap region may be formed in part of the insulator 412. In that case, electrons can be injected by application of a certain potential to the conductor 404.

In the transistor illustrated in FIGS. 19A to 19C, parasitic capacitance between the first gate electrode and the source and drain electrodes is small. Accordingly, the transistor can exhibit high frequency characteristics. Furthermore, the line width of the first gate electrode can be smaller than the resolution limit of the exposure apparatus; therefore, the transistor can be miniaturized.

<Method 3 for Manufacturing Transistor>

A method for manufacturing a transistor included in a semiconductor device of one embodiment of the present invention is described below with reference to FIGS. 20A to 20C, FIGS. 21A to 21C, FIGS. 22A to 22C, FIGS. 23A to 23C, FIGS. 24A to 24C, FIGS. 25A to 25C, FIGS. 26A to 26C, FIGS. 27A to 27C, and FIGS. 28A to 28C. Note that the method for manufacturing a transistor illustrated in FIGS. 1A to 1C, FIGS. 2A to 2C, FIGS. 3A to 3C, FIGS. 4A to 4C, FIGS. 5A to 5C, FIGS. 6A to 6C, FIGS. 7A to 7C, FIGS. 8A to 8C, FIGS. 9A to 9C, and FIGS. 10A to 10C, or the method for manufacturing a transistor illustrated in FIGS. 13A to 13C, FIGS. 14A to 14C, FIGS. 15A to 15C, FIGS. 16A to 16C, FIGS. 17A to 17C, FIGS. 18A to 18C, and FIGS. 19A to 19C can be referred to.

First, the substrate 400 is prepared.

Next, an insulator that is to be the insulator 401 is formed. Then, part of the insulator to be the insulator 401 is etched, whereby the insulator 401 having a groove is formed.

Next, a conductor that is to be the conductor 413 is formed to fill the groove of the insulator 401. Subsequently, the conductor to be the conductor 413 is processed by a CMP method or the like to remove a portion of the conductor 413 above the top surface of the insulator 401; as a result, the conductor 413 is formed. Instead of a CMP method, a dry etching method, an MP method, or the like may be used. Alternatively, two or more of these methods may be combined to be employed.

Note that the insulator to be the insulator 401 is not necessarily provided in some cases. In such cases, the conductor 413 may be formed by etching part of the conductor to be the conductor 413 by using an etching mask. Furthermore, the conductor to be the conductor 413 is not necessarily provided in some cases. In such cases, a process relating to formation of the conductor 413 in manufacturing methods that will be described below can be omitted.

Next, the insulator 402a, the insulator 402b, and the insulator 402c are formed in this order.

Note that one or more of the insulators 402a, 402b, and 402c are not necessarily formed in some cases. In such cases, a process relating to formation of one or more of the insulators 402a, 402b, and 4$^{02c\ in\ t}$he manufacturing methods that will be described below can be omitted.

Next, first heat treatment is preferably performed. The first heat treatment can be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, impurities such as hydrogen and water can be removed from the oxide semiconductor film, for example.

Next, an insulator that is to be the insulator 406a, a semiconductor that is to be the semiconductor 406b, and a conductor that is to be the conductor 416 are formed in this order. Here, the insulator to be the insulator 406a and/or the conductor to be the conductor 416 are/is not necessarily formed in some cases. In such cases, a process relating to formation of the insulator 406a and/or the conductor 416 in the manufacturing methods that will be described below can be omitted.

Subsequently, part of the conductor to be the conductor 416 is etched to form the island-shaped conductor 416. Then, part of the semiconductor to be the semiconductor 406b and part of the insulator to be the insulator 406a are etched using the conductor 416, whereby the semiconductor 406b and the insulator 406a are formed.

Use of the conductor 416 for etching of the semiconductor to be the semiconductor 406b and the insulator to be the insulator 406a can stabilize the shapes of the obtained semiconductor 406b and insulator 406a, as compared to the case of using a resist. That is, the obtained semiconductor 406b and insulator 406a can have minute shapes. Note that in the case where the conductor to be the conductor 416 is not formed, a resist may be used for etching for forming the semiconductor 406b and/or etching for forming the insulator 406a.

After that, second heat treatment may be performed. For the method of the second heat treatment, the description of the method of the first heat treatment is referred to. The second heat treatment may remove impurities including hydrogen and the like that have been mixed at the time of etching. Furthermore, the second heat treatment may increase the crystallinity of the semiconductor 406b and/or the crystallinity of the insulator 406a.

Next, the insulator 410 is formed.

Figure 20A:
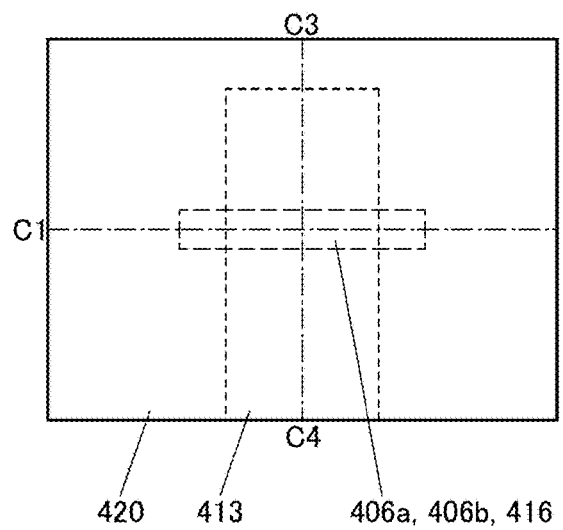
FIGS. 20A to 20C are a top view and cross-sectional views of a transistor of one embodiment of the present invention.
Figure 20C:
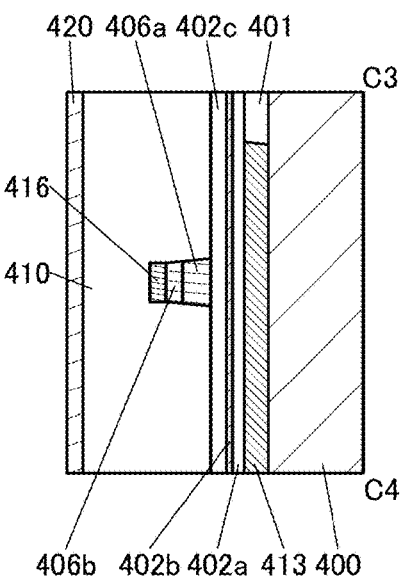
Figure 20B:
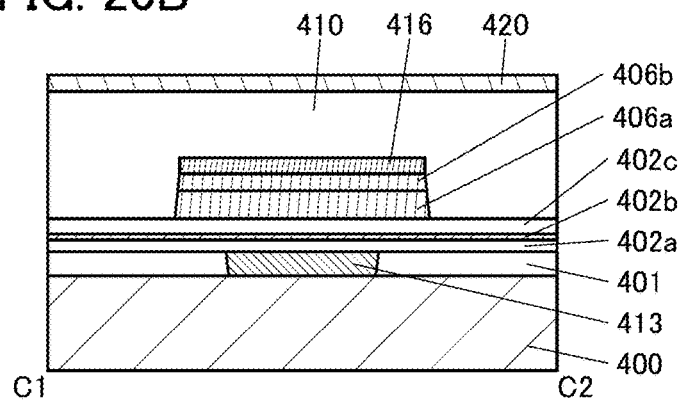

Next, the layer 420 is formed (see FIGS. 20A to 20C). Note that FIG. 20A is a top view, FIG. 20B is a cross-sectional view taken along dashed-dotted line C1-C2 in FIG. 20A, and FIG. 20C is a cross-sectional view taken along dashed-dotted line C3-C4 in FIG. 20A.

Next, third heat treatment may be performed. For the method of the third heat treatment, the description of the method of the first heat treatment is referred to. The third heat treatment may remove impurities including hydrogen and the like. Furthermore, the third heat treatment may increase the crystallinity of the semiconductor 406b and/or the crystallinity of the insulator 406a.

Figure 21A:
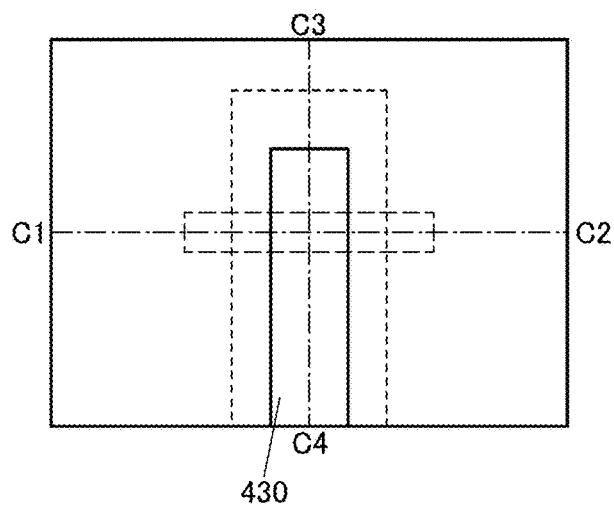
FIGS. 21A to 21C are a top view and cross-sectional views of the transistor of one embodiment of the present invention.
Figure 21C:
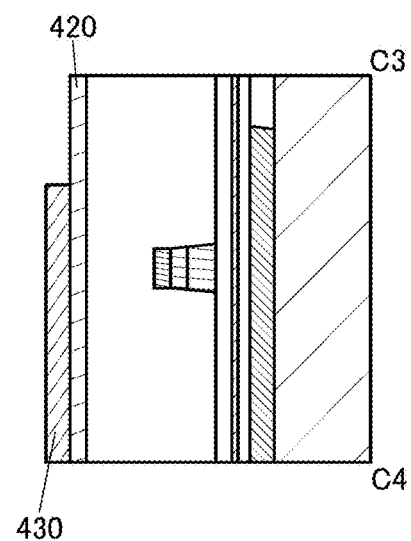
Figure 21B:
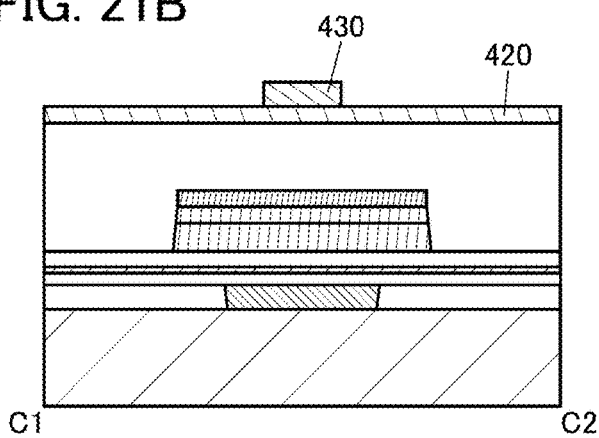

Next, a layer 430 is formed over part of the layer 420 (see FIGS. 21A to 21C). Note that FIG. 21A is a top view, FIG. 21B is a cross-sectional view taken along dashed-dotted line C1-C2 in FIG. 21A, and FIG. 21C is a cross-sectional view taken along dashed-dotted line C3-C4 in FIG. 21A.

Figure 22A:
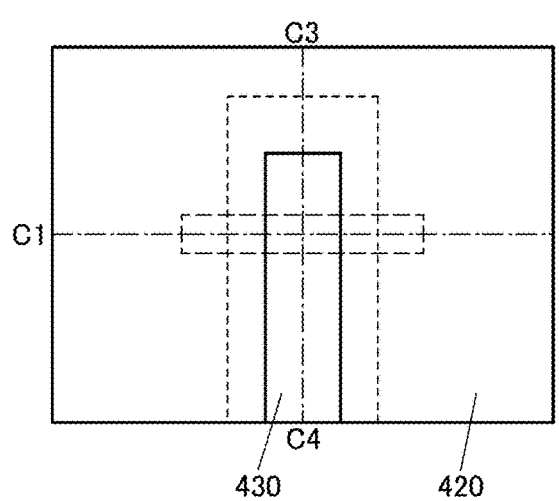
FIGS. 22A to 22C are a top view and cross-sectional views of the transistor of one embodiment of the present invention.
Figure 22C:
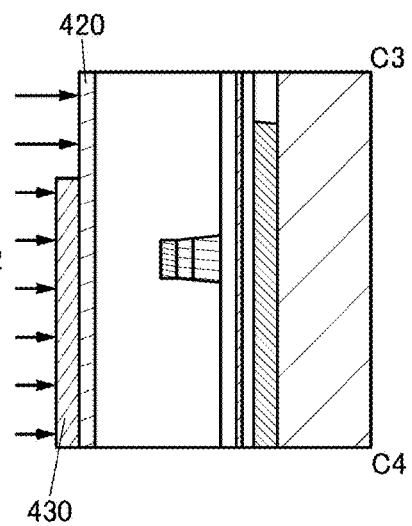
Figure 22B:
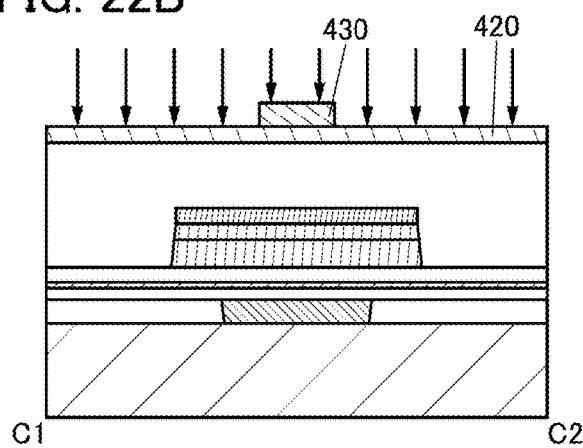

Then, the layer 420 and the layer 430 are exposed to a silane gas (see FIGS. 22A to 22C). Note that FIG. 22A is a top view, FIG. 22B is a cross-sectional view taken along dashed-dotted line C1-C2 in FIG. 22A, and FIG. 22C is a cross-sectional view taken along dashed-dotted line C3-C4 in FIG. 22A.

Next, the layer 430 is removed. By the exposure to a silane gas, a region 421 is formed in the layer 420 (see FIGS.

Figure 23A:
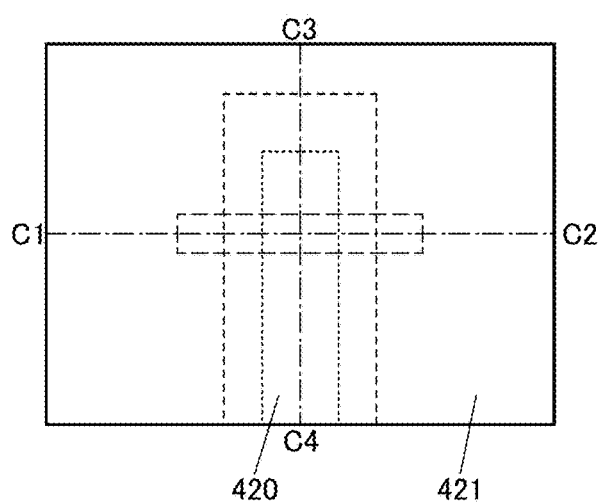
FIGS. 23A to 23C are a top view and cross-sectional views of the transistor of one embodiment of the present invention.
Figure 23C:
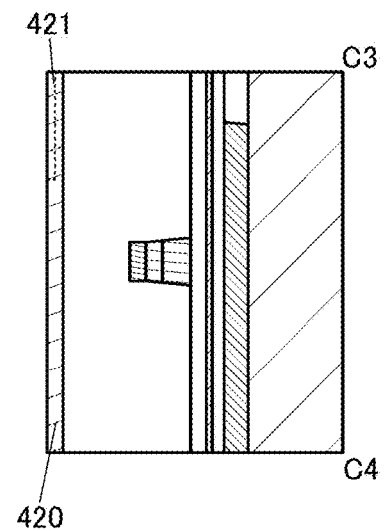
Figure 23B:
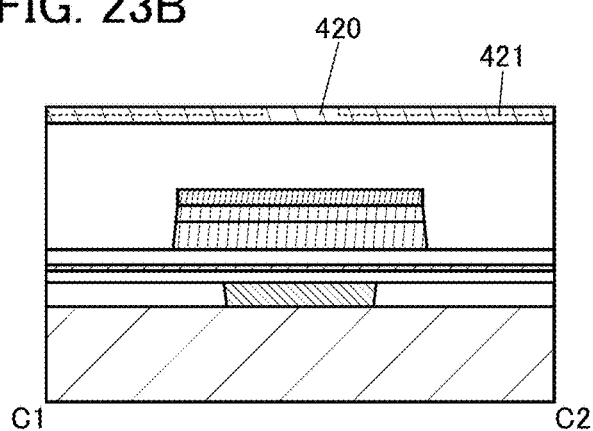

23A to 23C). Note that FIG. 23A is a top view, FIG. 23B is a cross-sectional view taken along dashed-dotted line C1-C2 in FIG. 23A, and FIG. 23C is a cross-sectional view taken along dashed-dotted line C3-C4 in FIG. 23A. Silicon (including an atomic group including silicon) is attached or bonded to the region 421. As the silane gas, $SiH_4$, $Si_2H_6$, $Si_3H_8$, or the like can be used. In order that silicon is attached to a surface only by exposure to a gas, a gas which is decomposed at a temperature lower than the process temperature is preferably used as the gas. From this point of view, instead of the silane gas, $SiCl_4$, $Si_2Cl_6$, $SiCl_2H_2$, $SiCl_3H$, $SiEt_2H_2$, $Si(OMe)_4$, $Si(OEt)_4$, $Si(OEt)_3((CH_2)_3NH_2)$, $Si(OtPe)_3OH$, $SiH(N(CH_3)_2)_3$, $SiH_2(N(CH_3)_2)_2$, $SiH_2(NH^tBu)_2$, $Si(NCO)_4$, $MeOSi(NCO)_3$, or the like may be used. Note that Me, Et, $^tBu$, and $^tPe$ represent a methyl group, an ethyl group, a tert-butyl group, and a tert-pentyl group, respectively. Note that it is preferable to use $SiH_4$ in terms of handiness.

The layer 430 preferably has high etching selectivity with respect to the layer 420, and may be formed using a photosensitive inorganic substance or organic substance, for example.

Figure 24A:
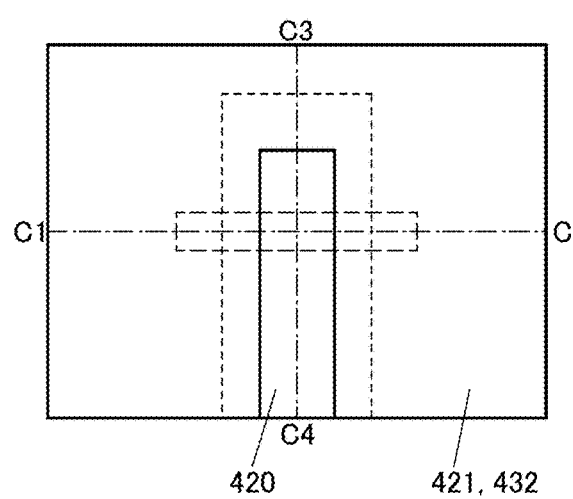
FIGS. 24A to 24C are a top view and cross-sectional views of the transistor of one embodiment of the present invention.
Figure 24C:
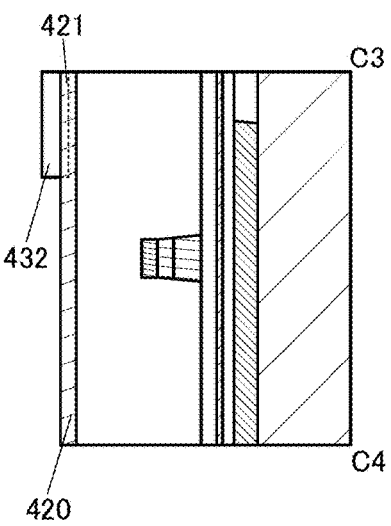
Figure 24B:
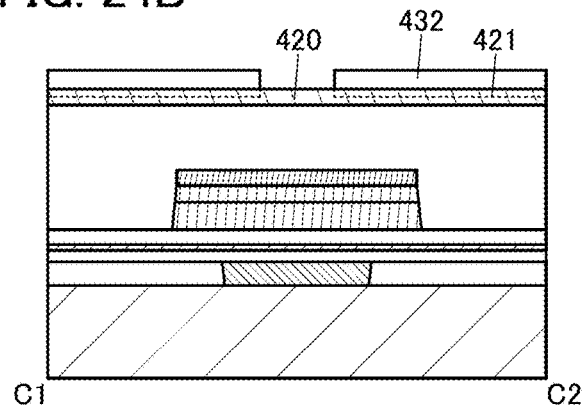

Next, a layer 432 is formed over the region 421 (see FIGS. 24A to 24C). Note that FIG. 24A is a top view, FIG. 24B is a cross-sectional view taken along dashed-dotted line C1-C2 in FIG. 24A, and FIG. 24C is a cross-sectional view taken along dashed-dotted line C3-C4 in FIG. 24A.

The layer 432 is selectively formed over the surface (the top surface or the like) of the region 421 and it is preferable that the layer 432 not be formed over the region other than the region 421. For example, the layer 432 can be formed by a CVD method using a source gas containing silicon and halogen. In that case, it is preferable that the surface of the region of layer 420 except the region 421 not include silicon. Even if silicon is included, it is acceptable as long as the silicon concentration is low enough not to cause selective growth of the layer.

Figure 25A:
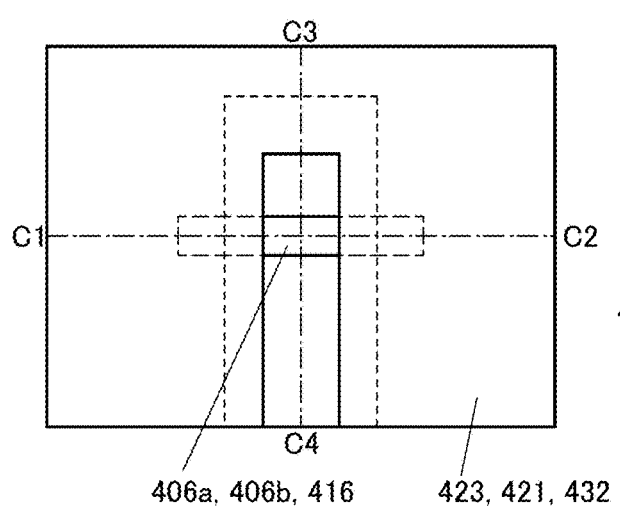
FIGS. 25A to 25C are a top view and cross-sectional views of the transistor of one embodiment of the present invention.
Figure 25C:
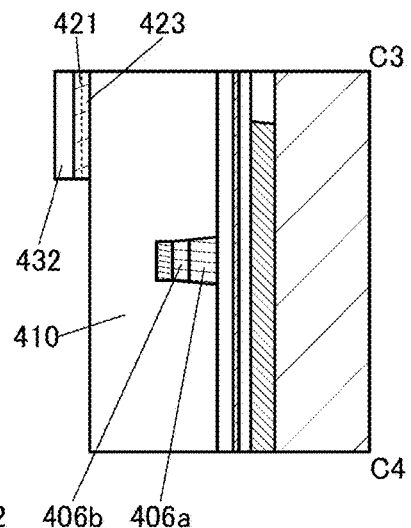
Figure 25B:
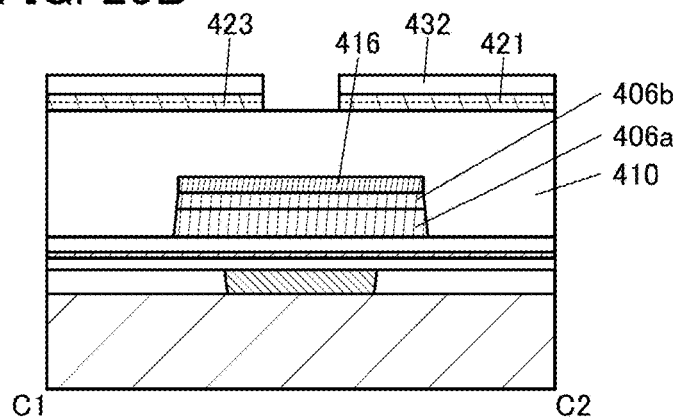

Next, part of the layer 420 is etched using the layer 432, whereby the layer 423 having a groove is formed (see FIGS. 25A to 25C). Note that FIG. 25A is a top view, FIG. 25B is a cross-sectional view taken along dashed-dotted line C1-C2 in FIG. 25A, and FIG. 25C is a cross-sectional view taken along dashed-dotted line C3-C4 in FIG. 25A.

Figure 26A:
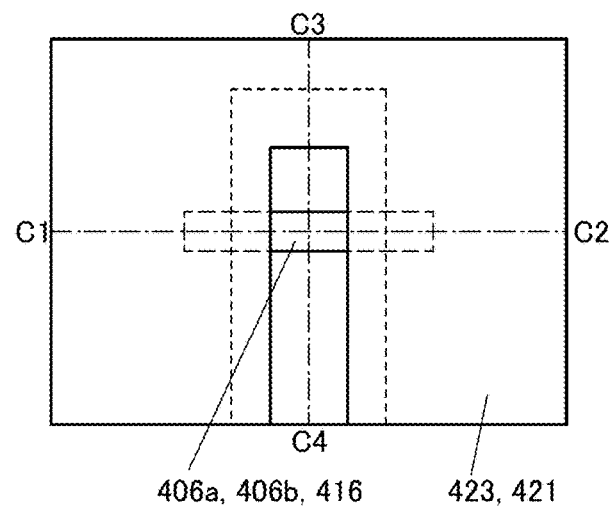
FIGS. 26A to 26C are a top view and cross-sectional views of the transistor of one embodiment of the present invention.
Figure 26C:
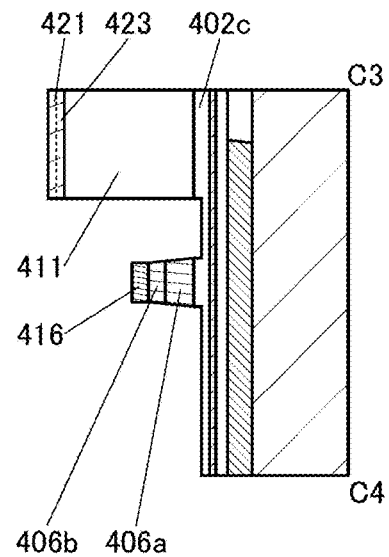
Figure 26B:
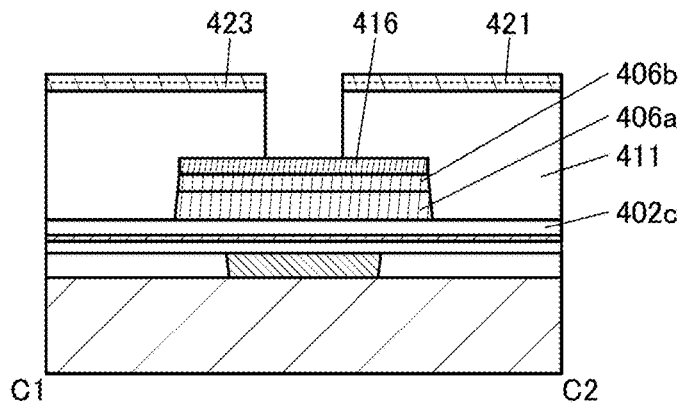

Then, part of the insulator 410 is etched using the layer 423 and the layer 432, whereby the insulator 411 having a groove is formed. At that time, the layer 432 can also be etched (see FIGS. 26A to 26C). Note that FIG. 26A is a top view, FIG. 26B is a cross-sectional view taken along dashed-dotted line C1-C2 in FIG. 26A, and FIG. 26C is a cross-sectional view taken along dashed-dotted line C3-C4 in FIG. 26A.

Note that when part of the insulator 410 is etched, part of the conductor 416, part of the semiconductor 406b, part of the insulator 406a, and part of the insulator 402c are exposed. At that time, the thickness of part of the insulator 402c and the like is reduced by the etching in some cases.

Figure 27A:
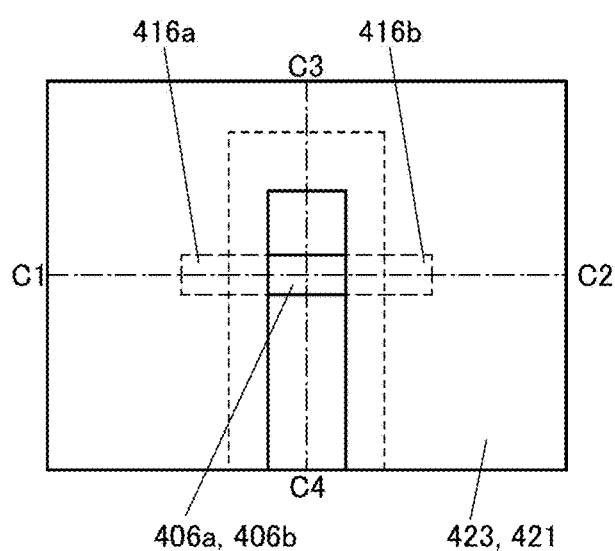
FIGS. 27A to 27C are a top view and cross-sectional views of the transistor of one embodiment of the present invention.
Figure 27C:
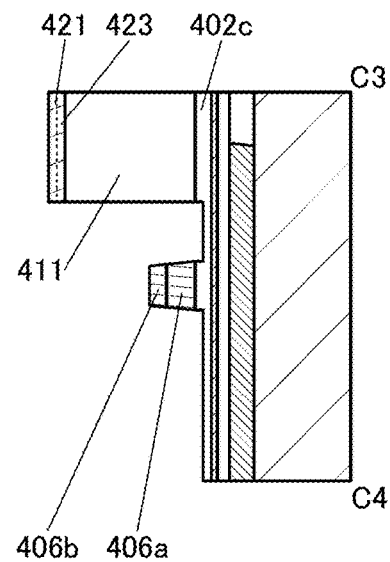
Figure 27B:
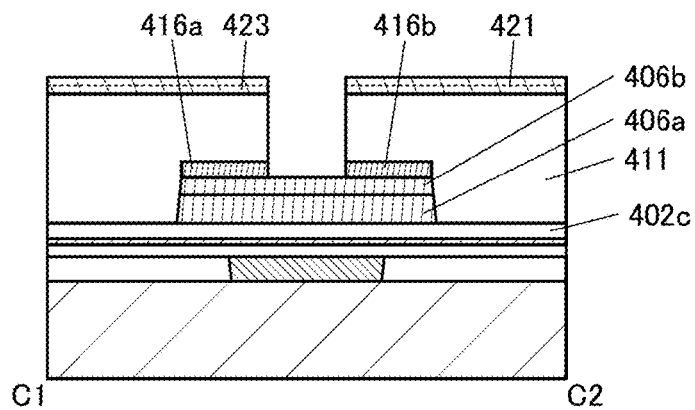

Subsequently, part of the conductor 416 is etched using the layer 423 and the insulator 411, whereby the conductor 416a and the conductor 416b are formed (see FIGS. 27A to 27C). Note that FIG. 27A is a top view, FIG. 27B is a cross-sectional view taken along dashed-dotted line C1-C2 in FIG. 27A, and FIG. 27C is a cross-sectional view taken along dashed-dotted line C3-C4 in FIG. 27A.

Next, the insulator 436c, the insulator 442, and the conductor 434 are formed in this order.

Here, the insulator 436c is not necessarily formed in some cases. In that case, a process relating to formation of the insulator 436c in the manufacturing methods that will be described below can be omitted.

It is preferable that the thickness of the insulator 436c and/or insulator 442 be set so that the insulator 436c and/or the insulator 442 do/does not completely fill the groove of the insulator 411. For example, in the case where the width of the groove of the insulator 411 is 12 nm, the total thickness of the insulator 436c and the insulator 442 is preferably less than 6 nm (the total thickness of the insulator 436c and the insulator 442 on both side surfaces of the groove of the insulator 411 is preferably less than 12 nm). Note that the thickness of the insulator 436c and/or the insulator 442 in a region which is in contact with the semiconductor 406b may be different from the thickness of the insulator 436c and/or the insulator 442 in a region in contact with the side surface of the groove of the insulator 411. In that case, the total thickness of the insulator 436c and the insulator 442 in the region in contact with the side surface of the groove of the insulator 411 is preferably smaller than the width of the groove of the insulator 411. Meanwhile, the conductor 434 preferably has a thickness large enough to fill the groove of the insulator 411 completely.

Next, the conductor 434, the insulator 442, and the insulator 436c are processed by a CMP method or the like to remove a portion above the top surface of the insulator 411; as a result, the conductor 404, the insulator 412, and the insulator 406c are formed. At that time, the thickness of the insulator 411 may be reduced. Instead of a CMP method, a dry etching method, an MP method, or the like may be used. Alternatively, two or more of these methods may be combined to be employed. Alternatively, part of the conductor 434, part of the insulator 442, and part of the insulator 436c may be etched using an etching mask.

Figure 28A:
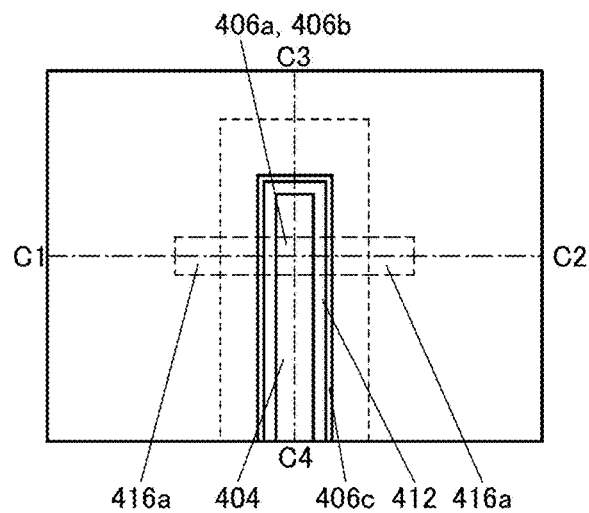
FIGS. 28A to 28C are a top view and cross-sectional views of the transistor of one embodiment of the present invention.
Figure 28C:
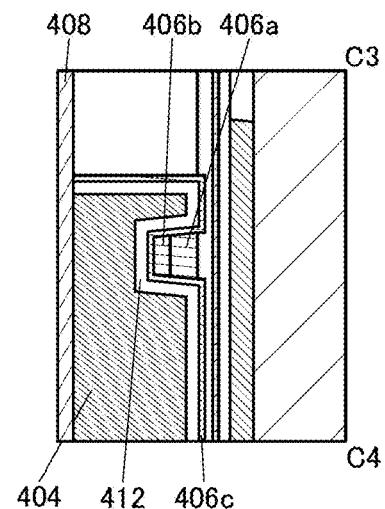
Figure 28B:
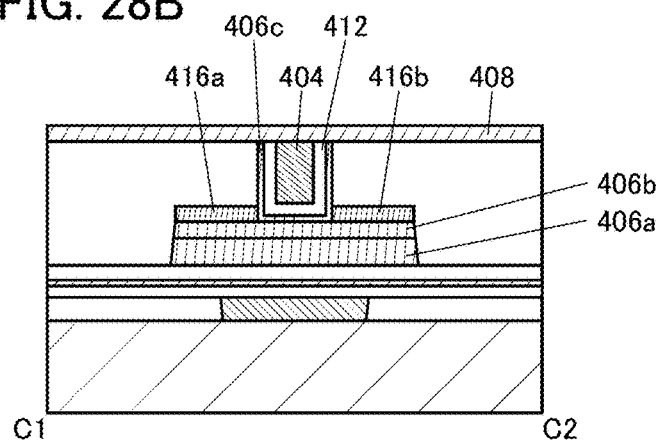

Then, an insulator 408 is formed. Thus, a transistor can be manufactured (see FIGS. 28A to 28C). Note that FIG. 28A is a top view, FIG. 28B is a cross-sectional view taken along dashed-dotted line C1-C2 in FIG. 28A, and FIG. 28C is a cross-sectional view taken along dashed-dotted line C3-C4 in FIG. 28A.

Formation of the insulator 408 is preferably performed under an atmosphere containing oxygen. In particular, formation of the insulator 408 is preferably performed by a sputtering method using an oxygen gas. Such a method enables excess oxygen to be added to, for example, the insulator 411 when the insulator 408 is formed.

Here, the insulator 408 is not necessarily formed in some cases.

After that, fourth heat treatment may be performed. For the method of the fourth heat treatment, the description of the method of the first heat treatment is referred to. The fourth heat treatment may remove impurities including hydrogen and the like. Furthermore, the fourth heat treatment may increase the crystallinity of the semiconductor 406b and/or the crystallinity of the insulator 406a. In the case where excess oxygen is added to the insulator 411 and the like at the time of formation of the insulator 408, the fourth heat treatment can diffuse the excess oxygen.

In the transistor illustrated in FIGS. 28A to 28C, the conductor 404 functions as a first gate electrode (also referred to as a front gate electrode), the insulator 412 functions as a first gate insulator (also referred to as a front gate insulator), the semiconductor 406b functions as a channel formation region, the conductor 416a functions as a source electrode, the conductor 416b functions as a drain electrode, the conductor 413 functions as a second gate electrode (also referred to as a back gate electrode), the insulators 402a, 402b, and 402c function as second gate insulators (also referred to as back gate insulators), and the insulator 408 functions as a barrier layer for preventing impurities from entering the transistor and/or has a function of preventing outward diffusion of excess oxygen.

The insulators 406a and 406c function as protective layers for the semiconductor 406b. For example, the insulators 406a and 406c, which are formed to surround the semiconductor 406b as illustrated in the cross-sectional view shown in FIG. 28C, can prevent formation of parasitic channel, carrier traps, and the like.

As illustrated in FIG. 28C, the transistor has a structure in which the semiconductor 406b and the like are electrically surrounded by the electric field of the conductor 404 functioning as a first gate electrode. A structure in which a semiconductor is electrically surrounded by an electric field of a gate electrode is referred to as an s-channel structure. Therefore, a channel is formed in the whole of the semiconductor 406b and the like (bulk) in some cases. In the s-channel structure, a large amount of current can flow between a source and a drain of the transistor, so that an on-state current can be increased. Furthermore, a current in an off state (off-state current) can be reduced.

It is preferable that the insulator 402a, the insulator 402b, and the insulator 402c include a layer or a region which traps charge, e.g., electrons (also referred to as a charge trap layer or a charge trap region). For example, the whole insulator 402b may be a charge trap layer, or a region in the vicinity of the interface between the insulator 402a and the insulator 402b or a region in the vicinity of the interface between the insulator 402b and the insulator 402c may be a charge trap region. Electrons can be injected to the charge trap layer or the charge trap region when a certain potential is applied to the conductor 413, for example. At that time, the amount of injected electrons can be adjusted by changing the level of the potential applied to the conductor 413 or a time for the application of the potential. The amount of electrons to be injected may be determined in accordance with required specifications. For example, the threshold voltage of the transistor can be increased by 0.3 V, 0.5 V, 0.8 V, 1 V, 1.5 V, or 2 V by adjusting the amount of electrons to be injected. As a result, a transistor having normally-off electrical characteristics can be obtained.

Note that the charge trap layer or the charge trap region is not necessarily provided below the semiconductor 406b. For example, the insulator 412 may have a stacked-layer structure, and the charge trap layer or the charge trap region may be formed in part of the insulator 412. In that case, electrons can be injected by application of a certain potential to the conductor 404.

In the transistor illustrated in FIGS. 28A to 28C, parasitic capacitance between the first gate electrode and the source and drain electrodes is small. Accordingly, the transistor can exhibit high frequency characteristics. Furthermore, the line width of the first gate electrode can be smaller than the resolution limit of the exposure apparatus; therefore, the transistor can be miniaturized.

<Method 4 for Manufacturing Transistor>

A method for manufacturing a transistor included in a semiconductor device of one embodiment of the present invention is described below with reference to FIGS. 29A to 29C, FIGS. 30A to 30C, FIGS. 31A to 31C, FIGS. 32A to 32C, FIGS. 33A to 33C, FIGS. 34A to 34C, FIGS. 35A to 35C, and FIGS. 36A to 36C. Note that the method for manufacturing a transistor illustrated in FIGS. 1A to 1C, FIGS. 2A to 2C, FIGS. 3A to 3C, FIGS. 4A to 4C, FIGS. 5A to 5C, FIGS. 6A to 6C, FIGS. 7A to 7C, FIGS. 8A to 8C, FIGS. 9A to 9C, and FIGS. 10A to 10C, the method for manufacturing a transistor illustrated in FIGS. 13A to 13C, FIGS. 14A to 14C, FIGS. 15A to 15C, FIGS. 16A to 16C, FIGS. 17A to 17C, FIGS. 18A to 18C, and FIGS. 19A to 19C, or the method for manufacturing a transistor illustrated in FIGS. 20A to 20C, FIGS. 21A to 21C, FIGS. 22A to 22C, FIGS. 23A to 23C, FIGS. 24A to 24C, FIGS. 25A to 25C, FIGS. 26A to 26C, FIGS. 27A to 27C, and FIGS. 28A to 28C can be referred to.

First, the substrate 400 is prepared.

Next, an insulator that is to be the insulator 401 is formed. Then, part of the insulator to be the insulator 401 is etched, whereby the insulator 401 having a groove is formed.

Next, a conductor that is to be the conductor 413 is formed to fill the groove of the insulator 401. Subsequently, the conductor to be the conductor 413 is processed by a CMP method or the like to remove a portion of the conductor 413 above the top surface of the insulator 401; as a result, the conductor 413 is formed. Instead of a CMP method, a dry etching method, an MP method, or the like may be used. Alternatively, two or more of these methods may be combined to be employed.

Note that the insulator to be the insulator 401 is not necessarily provided in some cases. In such cases, the conductor 413 may be formed by etching part of the conductor to be the conductor 413 by using an etching mask. Furthermore, the conductor to be the conductor 413 is not necessarily provided in some cases. In such cases, a process relating to formation of the conductor 413 in manufacturing methods that will be described below can be omitted.

Next, the insulator 402a, the insulator 402b, and the insulator 402c are formed in this order.

Note that one or more of the insulators 402a, 402b, and 402c are not necessarily formed in some cases. In such cases, a process relating to formation of one or more of the insulators 402a, 402b, and 402c in the manufacturing methods that will be described below can be omitted.

Next, first heat treatment is preferably performed. The first heat treatment can be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, impurities such as hydrogen and water can be removed from the oxide semiconductor film, for example.

Next, an insulator that is to be the insulator 406a, and a semiconductor that is to be the semiconductor 406b are formed in this order. Here, the insulator to be the insulator 406a is not necessarily formed in some cases. In such cases, a process relating to formation of the insulator 406a in the manufacturing methods that will be described below can be omitted.

Subsequently, part of the semiconductor to be the semiconductor 406b and part of the insulator to be the insulator 406a are etched to form the semiconductor 406b and the insulator 406a.

Note that the conductor 416 described in FIGS. 2A to 2C and the like may be used for etching of the semiconductor to be the semiconductor 406b and the insulator to be the insulator 406a. In that case, after formation of the semiconductor 406b and the insulator 406a, the conductor 416 may be removed. Use of the conductor 416 for etching of the semiconductor to be the semiconductor 406b and the insulator to be the insulator 406a can stabilize the shapes of the obtained semiconductor 406b and insulator 406a, as compared to the case of using a resist. That is, the obtained semiconductor 406b and insulator 406a can have minute shapes.

Figure 29A:
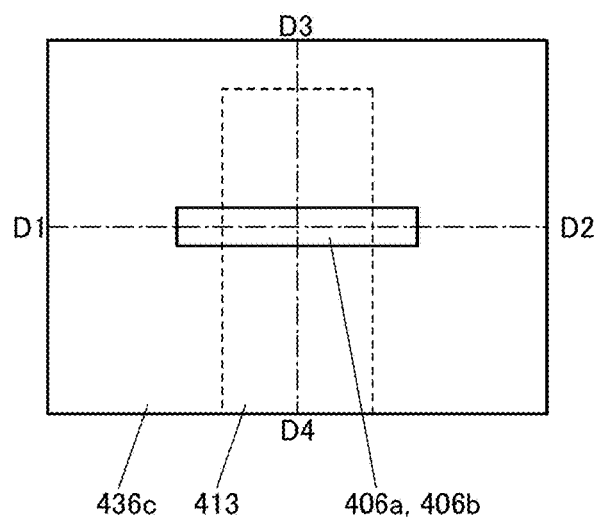
FIGS. 29A to 29C are a top view and cross-sectional views of a transistor of one embodiment of the present invention.
Figure 29C:
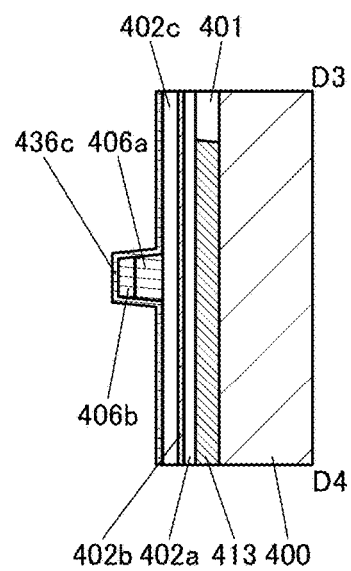
Figure 29B:
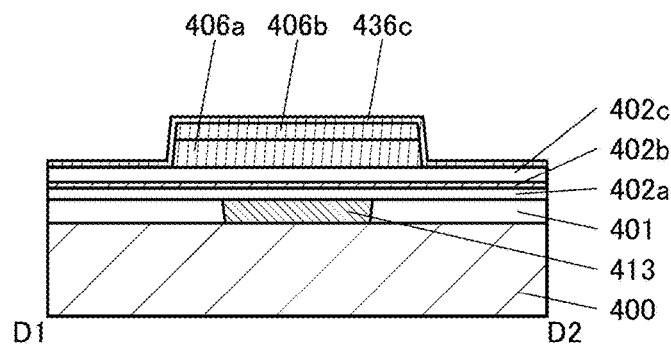

Next, the insulator 436c is formed (see FIGS. 29A to 29C). Note that FIG. 29A is a top view, FIG. 29B is a cross-sectional view taken along dashed-dotted line D1-D2 in FIG. 29A, and FIG. 29C is a cross-sectional view taken along dashed-dotted line D3-D4 in FIG. 29A.

After that, second heat treatment may be performed. For the method of the second heat treatment, the description of the method of the first heat treatment is referred to. The second heat treatment may remove impurities including hydrogen and the like that have been mixed at the time of etching. Furthermore, the second heat treatment may increase the crystallinity of the semiconductor 406b, the crystallinity of the insulator 406a, and/or the crystallinity of the insulator 406c.

Figure 30A:
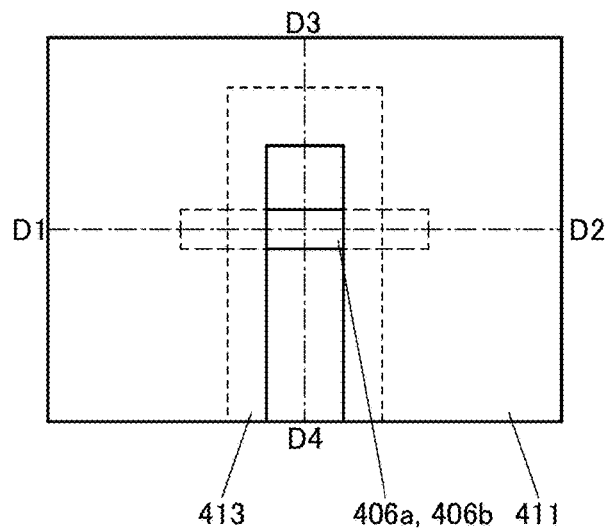
FIGS. 30A to 30C are a top view and cross-sectional views of the transistor of one embodiment of the present invention.
Figure 30C:
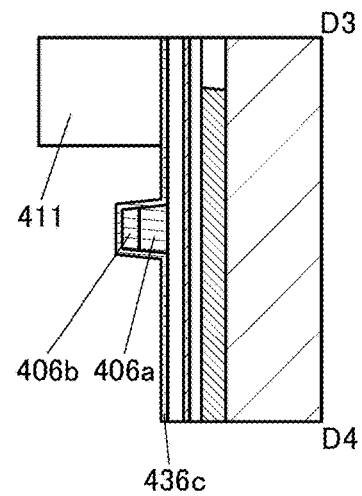
Figure 30B:
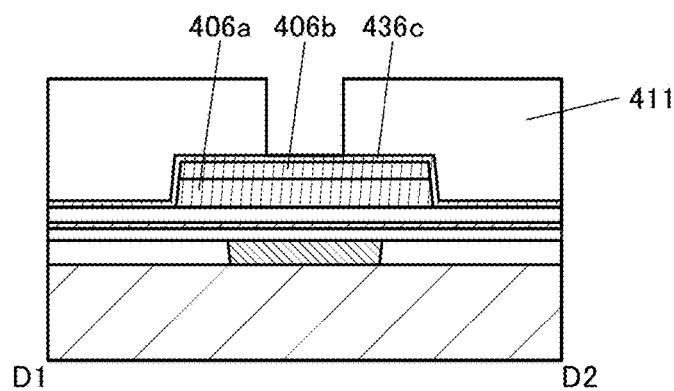

Next, the insulator 411 is formed (see FIGS. 30A to 30C). Note that FIG. 30A is a top view, FIG. 30B is a cross-sectional view taken along dashed-dotted line D1-D2 in FIG. 30A, and FIG. 30C is a cross-sectional view taken along dashed-dotted line D3-D4 in FIG. 30A.

For the method for forming the insulator 411, the description for FIGS. 3A to 3C, FIGS. 4A to 4C, FIGS. 5A to 5C, FIGS. 6A to 6C, and FIGS. 7A to 7C, or the description for FIGS. 20A to 20C, FIGS. 21A to 21C, FIGS. 22A to 22C, FIGS. 23A to 23C, FIGS. 24A to 24C, FIGS. 25A to 25C, and FIGS. 26A to 26C may be referred to. Note that the method for forming the insulator 411 is not limited thereto. For example, with reference to the description using FIGS. 14A to 14C, FIGS. 15A to 15C, and FIGS. 16A to 16C, the layer 428 may be formed on the surface of the insulator 411.

Next, third heat treatment may be performed. For the method of the third heat treatment, the description of the method of the first heat treatment is referred to. The third heat treatment may remove impurities including hydrogen and the like. Furthermore, the third heat treatment may increase the crystallinity of the semiconductor 406b and/or the crystallinity of the insulator 406a. Furthermore, the carrier density of the semiconductor 406b serving as the channel formation region and that of the vicinity thereof can be reduced in some cases.

Next, an insulator that is to be the insulator 412 and a conductor that is to be the conductor 404 are formed in this order.

It is preferable that the thickness of the insulator to be the insulator 412 be set so that the insulator to be the insulator 412 do not completely fill the groove of the insulator 411. For example, in the case where the width of the groove of the insulator 411 is 12 nm, the thickness of the insulator to be the insulator 412 is preferably less than 6 nm (the total thickness of the insulator to be the insulator 412 on both side surfaces of the groove of the insulator 411 is preferably less than 12 nm). Note that the thickness of the insulator to be the insulator 412 in a region which is in contact with the insulator 406c may be different from the thickness of the insulator to be the insulator 412 in a region in contact with the side surface of the groove of the insulator 411. In that case, the thickness of the insulator to be the insulator 412 in the region in contact with the side surface of the groove of the insulator 411 is preferably smaller than the width of the groove of the insulator 411. Meanwhile, the conductor to be the conductor 404 preferably has a thickness large enough to fill the groove of the insulator 411 completely.

Figure 31A:
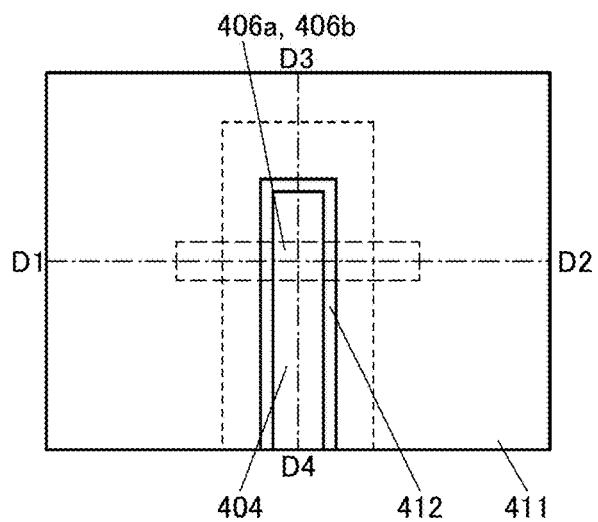
FIGS. 31A to 31C are a top view and cross-sectional views of the transistor of one embodiment of the present invention.
Figure 31C:
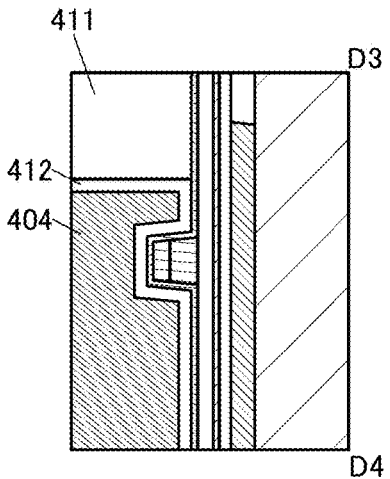
Figure 31B:
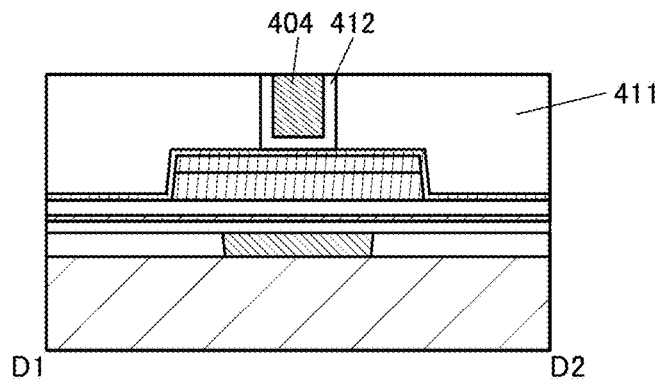

Subsequently, the conductor to be the conductor 404 and the insulator to be the insulator 412 are processed by a CMP method or the like to remove a portion above the top surface of the insulator 411; as a result, the conductor 404 and the insulator 412 are formed (see FIGS. 31A to 31C). At this time, the thickness of the insulator 411 is reduced in some cases. Note that FIG. 31A is a top view, FIG. 31B is a cross-sectional view taken along dashed-dotted line D1-D2 in FIG. 31A, and FIG. 31C is a cross-sectional view taken along dashed-dotted line D3-D4 in FIG. 31A. Instead of a CMP method, a dry etching method, an MP method, or the like may be used. Alternatively, two or more of these methods may be combined to be employed. Alternatively, part of the conductor to be the conductor 404 and part of the insulator to be the insulator 412 may be etched using an etching mask.

Figure 32A:
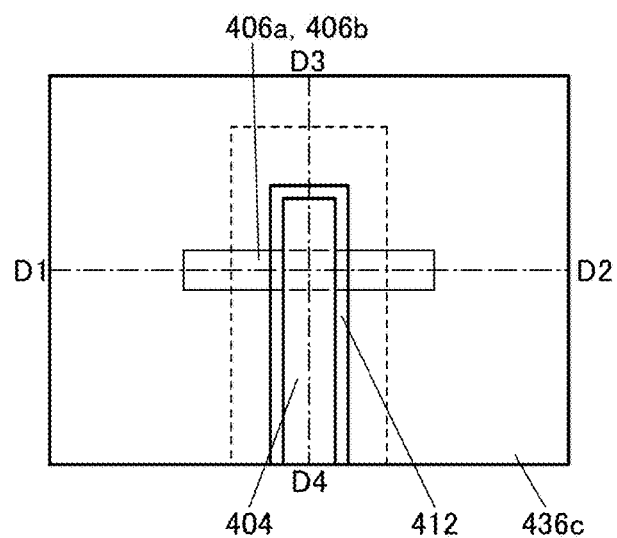
FIGS. 32A to 32C are a top view and cross-sectional views of the transistor of one embodiment of the present invention.
Figure 32C:
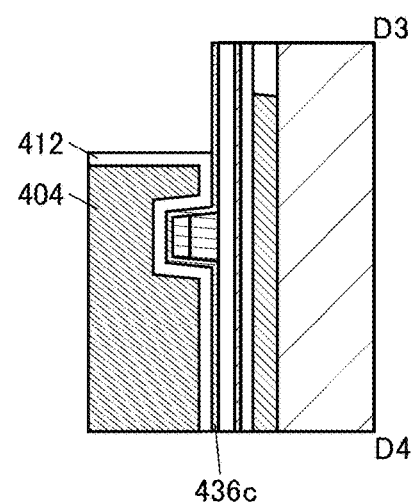
Figure 32B:
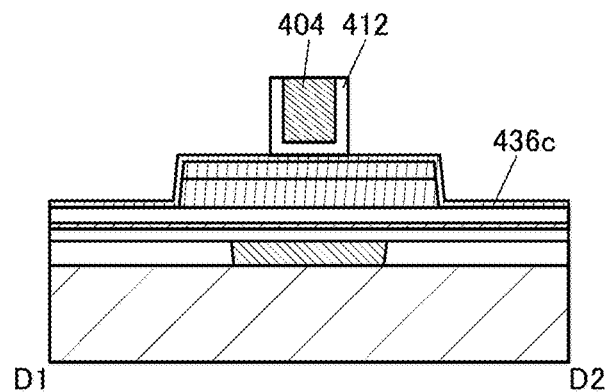

Next, the insulator 411 is etched until the insulator 436c is exposed (see FIGS. 32A to 32C). Note that FIG. 32A is a top view, FIG. 32B is a cross-sectional view taken along dashed-dotted line D1-D2 in FIG. 32A, and FIG. 32C is a cross-sectional view taken along dashed-dotted line D3-D4 in FIG. 32A.

An etching mask is not necessarily formed for etching of the insulator 411. For example, the insulator 411 is etched under the condition where the conductor 404 is not etched or is unlikely to be etched, whereby the conductor 404 can remain.

Figure 33A:
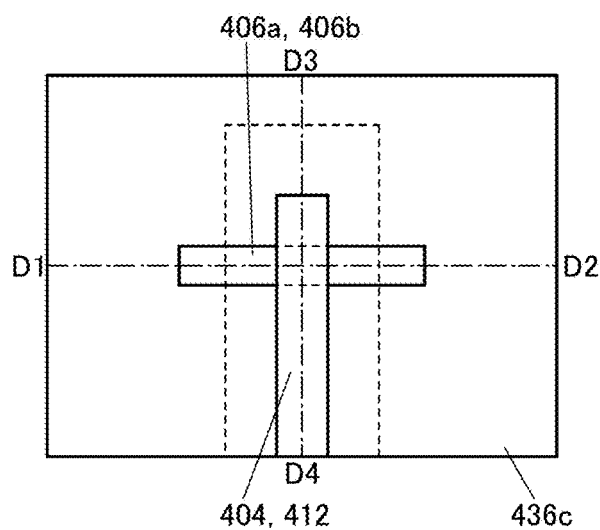
FIGS. 33A to 33C are a top view and cross-sectional views of the transistor of one embodiment of the present invention.
Figure 33C:
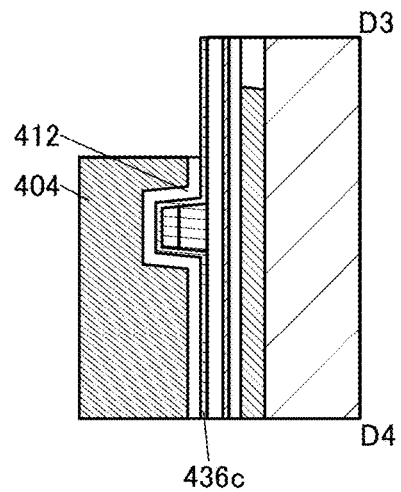
Figure 33B:
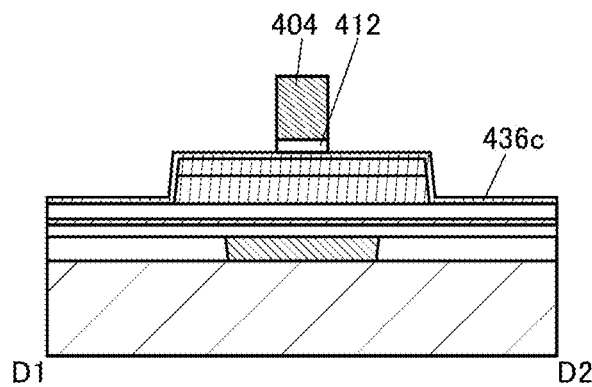
Figure 34A:
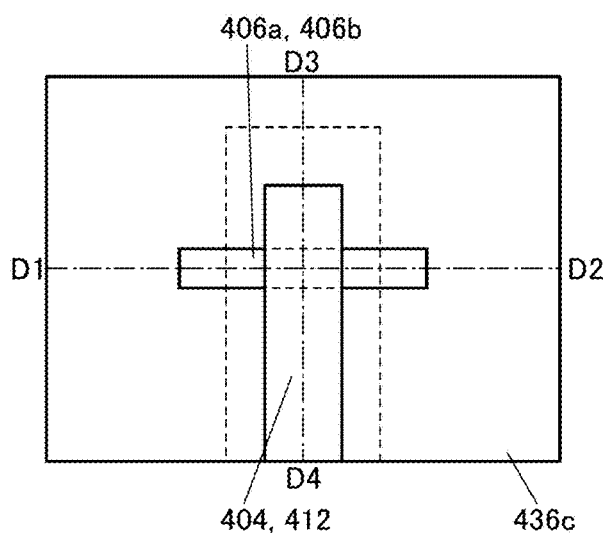
FIGS. 34A to 34C are a top view and cross-sectional views of the transistor of one embodiment of the present invention.
Figure 34C:
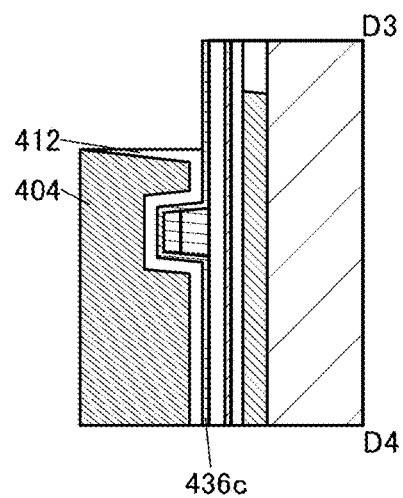
Figure 34B:
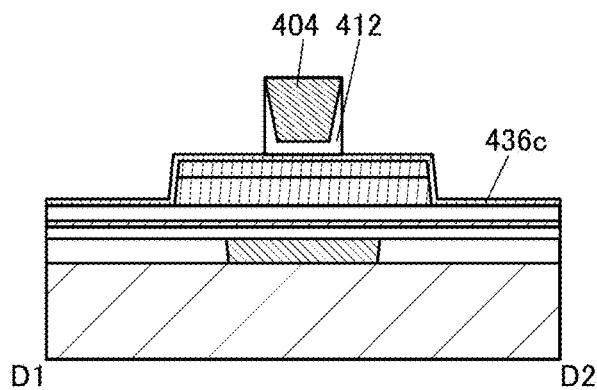

Although FIGS. 32A to 32C illustrate the case where the insulator 412 is not etched, part of the insulator 412 may be etched at the time of etching the insulator 411. For example, part of the insulator 412 which is formed on the side surface of the conductor 404 is etched in some cases. At the time of etching the insulator 411, the part of the insulator 412 which is formed on the side surface of the conductor 404 is completely or partly removed, or is reduced in thickness. For example, when the insulator 412 includes a region in which an angle formed by a plane parallel to the top surface (or rare surface) of the substrate 400 and a plane parallel to the side surface of the conductor 404 is less than or equal to 90° (such a shape is also referred to as a vertical shape or a forward taper shape), the part of the insulator 412 which is formed on the side surface of the conductor 404 is completely removed by etching of the insulator 411 in some cases (see FIGS. 33A to 33C). Note that FIG. 33A is a top view, FIG. 33B is a cross-sectional view taken along dashed-dotted line D1-D2 in FIG. 33A, and FIG. 33C is a cross-sectional view taken along dashed-dotted line D3-D4 in FIG. 33A. Meanwhile, when the insulator 412 includes a region in which the angle formed by the plane parallel to the top surface (or rare surface) of the substrate 400 and the plane parallel to the side surface of the conductor 404 is greater than 90° (such a shape is also referred to as an inverted tapered shape or an overhang shape), the part of the insulator 412 which is formed on the side surface of the conductor 404 is partly removed or is reduced in thickness by etching of the insulator 411 (see FIGS. 34A to 34C). Note that FIG. 34A is a top view, FIG. 34B is a cross-sectional view taken along dashed-dotted line D1-D2 in FIG. 34A, and FIG. 34C is a cross-sectional view taken along dashed-dotted line D3-D4 in FIG. 34A. Note that in order that the insulator 412 is not etched, the etching condition where the insulator 411 and the insulator 412 have etching selectivity may be employed.

Figure 35A:
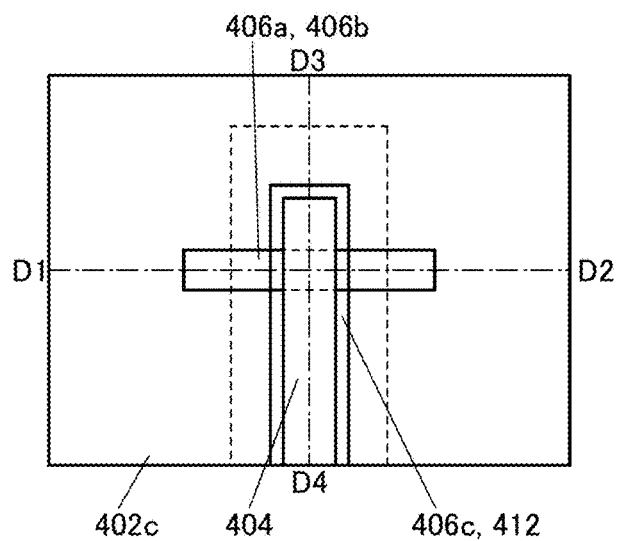
FIGS. 35A to 35C are a top view and cross-sectional views of the transistor of one embodiment of the present invention.
Figure 35C:
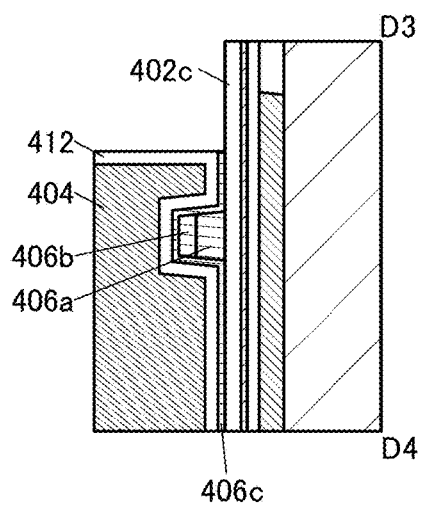
Figure 35B:
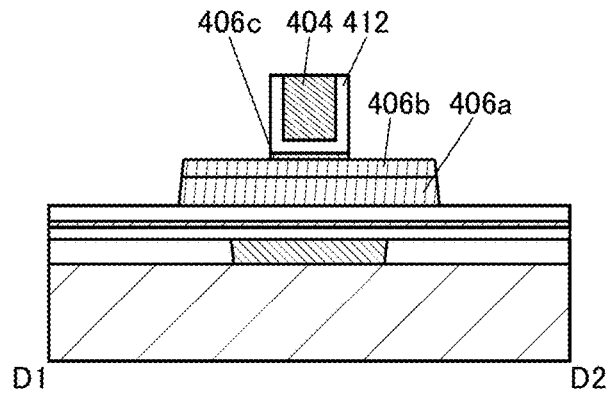

Next, part of the insulator 436c is etched, whereby the insulator 406c is formed (see FIGS. 35A to 35C). Note that FIG. 35A is a top view, FIG. 35B is a cross-sectional view taken along dashed-dotted line D1-D2 in FIG. 35A, and FIG. 35C is a cross-sectional view taken along dashed-dotted line D3-D4 in FIG. 35A. Note that the etching of the insulator 436c may be in the same process as the etching of the insulator 411 or may follow the etching of the insulator 411.

An etching mask is not necessarily formed for the etching of the insulator 436c. For example, when the insulator 436c is etched under the condition where the conductor 404 and/or the insulator 412 are/is not etched or unlikely to be etched, a region/regions located under the conductor 404 and/or the insulator 412 can remain. Note that an etching mask may be used for the etching of the insulator 436c. At that case, the insulator 406c can be formed to cover the insulator 406a and the semiconductor 406b, for example.

Figure 36A:
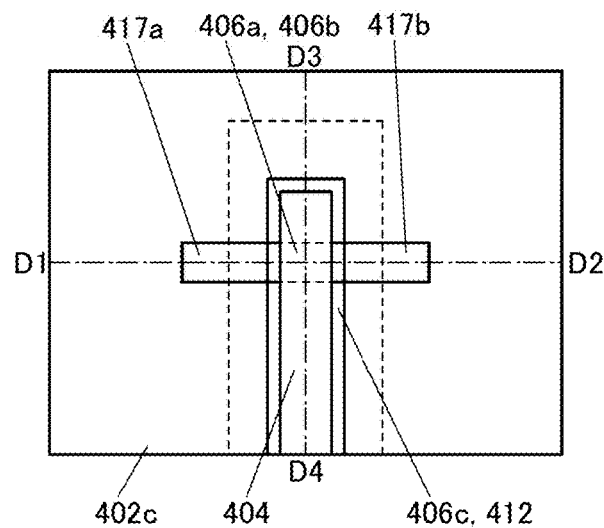
FIGS. 36A to 36C are a top view and cross-sectional views of the transistor of one embodiment of the present invention.
Figure 36C:
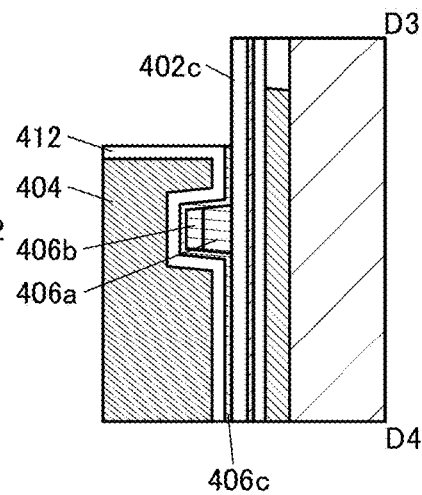
Figure 36B:
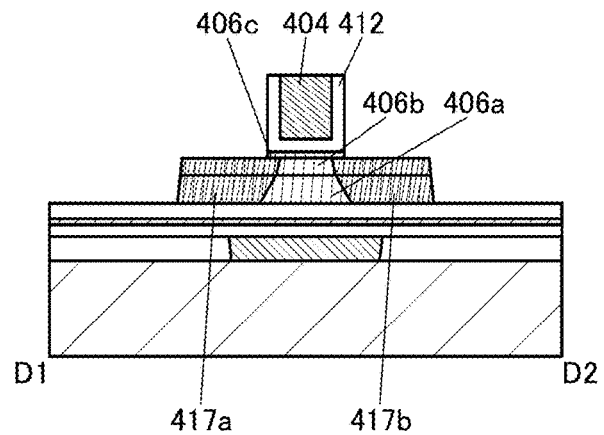

Next, a dopant is added to the insulator 406a and the semiconductor 406b, whereby a region 417a and a region 417b are formed (see FIGS. 36A to 36C). Note that FIG. 36A is a top view, FIG. 36B is a cross-sectional view taken along dashed-dotted line D1-D2 in FIG. 36A, and FIG. 36C is a cross-sectional view taken along dashed-dotted line D3-D4 in FIG. 36A. The region 417a and the region 417b can be formed in a self-aligned manner, using the conductor 404 and the insulator 412 as masks. The region 417a and the region 417b each have a region with lower resistance than the other regions. Note that the use of the groove of the insulator 411 makes it possible to prevent generation of defects such as breakage even when the conductor 404 has a high aspect ratio. That is, the conductor 404 can be formed to have a large thickness. For example, when the conductor 404 has a large thickness, a dopant can be prevented from penetrating the conductor 404.

Here, in the case where the insulator 412 is also formed on the side surface of the conductor 404, a region in which the conductor 404 does not overlap with the regions 417a and 417b and which corresponds to the thickness of the insulator 412 (the region is also referred to as an offset region) is formed in the insulator 406a and the semiconductor 406b. However, when the regions 417a and 417b are formed to extend in the horizontal direction, the off-set region is not formed in some cases. Furthermore, in the case where the transistor has a small channel length, the region 417a and the region 417b might be extended in the horizontal direction and the effective channel length might be zero; therefore, the effective channel length is preferably secured by adjusting the thickness of the insulator 412 or the like.

For the dopant addition, an ion implantation method by which an ionized source gas is subjected to mass separation and then added, an ion doping method by which an ionized source gas is added without mass separation, or the like can be used. In the case of performing mass separation, ion species to be added and its concentration can be controlled properly. On the other hand, in the case of not performing mass separation, ions at a high concentration can be added in a short time. Alternatively, an ion implantation method or an ion doping method in which atomic or molecular clusters are generated and ionized may be employed. Instead of the term "dopant," the term "ion," "donor," "acceptor," "impurity," or "element" may be used.

The dopant addition may be controlled by setting the addition conditions such as the acceleration voltage and the dose as appropriate. The dose of the dopant is, for example, greater than or equal to $1\times10^{12}$ ions/cm$^2$ and less than or equal to $1\times10^{16}$ ions/cm$^2$, and preferably greater than or equal to $1\times10^{13}$ ions/cm$^2$ and less than or equal to $1\times10^{15}$ ions/cm$^2$. The acceleration voltage at the time of addition of the dopant is higher than or equal to 2 kV and lower than or equal to 50 kV, preferably higher than or equal to 5 kV and lower than or equal to 30 kV.

The dopant may be added while heating at, for example, 200° C. or higher and 700° C. or lower, preferably 300° C. or higher and 500° C. or lower, and further preferably 350° C. or higher and 450° C. or lower.

Examples of th dopant include helium, neon, argon, krypton, xenon, nitrogen, fluorine, phosphorus, chlorine, arsenic, boron, magnesium, aluminum, silicon, titanium, vanadium, chromium, nickel, zinc, gallium, germanium, yttrium, zirconium, niobium, molybdenum, indium, tin, lanthanum, cerium, neodymium, hafnium, tantalum, and tungsten. Among these elements, helium, argon, krypton, xenon, nitrogen, phosphorus, and boron are preferable because these elements can be added with high controllability for the resistance by an ion implantation method, an ion doping method, or the like. Note that in order to reduce the extension of the regions 417a and 417b in the horizontal direction, a dopant which has a low diffusion coefficient in the semiconductor 406b is preferably used.

Heat treatment may be performed after the dopant addition. The heat treatment may be performed at higher than or equal to 250° C. and lower than or equal to 650° C., preferably higher than or equal to 350° C. and lower than or equal to 450° C. in a nitrogen atmosphere, or under reduced pressure or air (ultra dry air), for example.

For example, in the case where an oxide conductor, e.g., an oxide containing indium and zinc, an oxide containing indium and tin, or an oxide containing indium, gallium, and zinc is used for the conductor 404, excess oxygen can be added to the insulator to be the insulator 412, the insulator 411, and the like when the conductor that is to be the conductor 404 is formed. In general, when a deposition gas containing an oxidizing gas at a high proportion is used for forming an oxide containing indium, gallium, and zinc, the conductivity of the oxide is significantly low. Therefore, after the formation, the resistance of the oxide is preferably reduced by addition of a dopant or the like. To effectively reduce the resistance by addition of a dopant or the like, the oxide may have a stacked-layer structure in which a layer which is formed using a deposition gas with a high proportion of an oxidizing gas, and a layer which is formed using a deposition gas with a low proportion of an oxidizing gas or with no oxidizing gas are stacked in this order. Note that the addition of a dopant may be performed at the same time as formation of the regions 417a and 417b.

In the transistor illustrated in FIGS. 36A to 36C, the conductor 404 functions as a first gate electrode (also referred to as a front gate electrode), the insulator 412 functions as a first gate insulator (also referred to as a front gate insulator), the semiconductor 406b functions as a channel formation region, the region 417a functions as a source region, the region 417b functions as a drain region, the conductor 413 functions as a second gate electrode (also referred to as a back gate electrode), and the insulators 402a, 402b, and 402c function as second gate insulators (also referred to as back gate insulators). Through the above processes, the transistor can be manufactured.

In the transistor illustrated in FIGS. 36A to 36C, parasitic capacitance between the first gate electrode and the source and drain regions is small. Accordingly, the transistor can exhibit high frequency characteristics. Furthermore, the line width of the first gate electrode can be smaller than the resolution limit of the exposure apparatus; therefore, the transistor can be miniaturized.

The above-described methods for manufacturing a transistor are only examples, and they may be used in combination. Therefore, the method for manufacturing a transistor of one embodiment of the present invention can be composed by combining parts of the above-described methods.

<Circuit>

An example of a circuit of a semiconductor device of one embodiment of the present invention is described.

<CMOS Inverter>

Figure 37A:
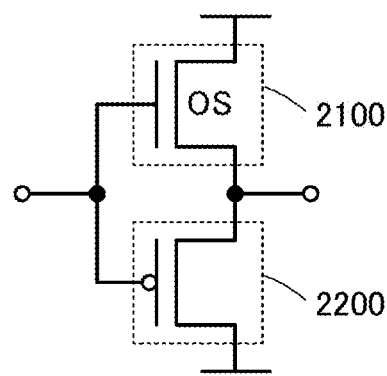
FIGS. 37A and 37B are circuit diagrams each illustrating a semiconductor device of one embodiment of the present invention.

A circuit diagram in FIG. 37A shows a configuration of what is called a CMOS inverter in which a p-channel transistor 2200 and an n-channel transistor 2100 are connected to each other in series and in which gates of them are connected to each other.

<Structure 1 of Semiconductor Device>

FIGS. 38A to 38C are cross-sectional views illustrating the semiconductor device of FIG. 37A. The semiconductor device shown in FIGS. 38A to 38C includes the transistor 2200 and the transistor 2100. The transistor 2100 is placed above the transistor 2200. Any of the above-described transistors can be used as the transistor 2100. Thus, the description regarding the above-mentioned transistors is referred to for the transistor 2100 as appropriate. Note that FIGS. 38A to 38C are cross-sectional views of different portions.

The transistor 2200 shown in FIGS. 38A to 38C is a transistor including a semiconductor substrate 450. The transistor 2200 includes a region 472*a* in the semiconductor substrate 450, a region 472*b* in the semiconductor substrate 450, an insulator 462, and a conductor 454.

In the transistor 2200, the regions 472*a* and 472*b* have functions of a source region and a drain region. The insulator 462 functions as a gate insulator. The conductor 454 functions as a gate electrode. Thus, the resistance of a channel formation region can be controlled by a potential applied to the conductor 454. In other words, conduction or non-conduction between the region 472*a* and the region 472*b* can be controlled by the potential applied to the conductor 454.

For the semiconductor substrate 450, a single-material semiconductor substrate of silicon, germanium, or the like or a compound semiconductor substrate of silicon carbide, silicon germanium, gallium arsenide, indium phosphide, zinc oxide, gallium oxide, or the like may be used, for example. A single crystal silicon substrate is preferably used as the semiconductor substrate 450.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting the n-type conductivity may be provided in a region where the transistor 2200 is formed. Alternatively, the semiconductor substrate 450 may be an i-type semiconductor substrate.

The top surface of the semiconductor substrate 450 preferably has a (110) plane. Thus, on-state characteristics of the transistor 2200 can be improved.

The regions 472*a* and 472*b* are regions including impurities imparting the p-type conductivity. Accordingly, the transistor 2200 has a structure of a p-channel transistor.

Note that the transistor 2200 is apart from an adjacent transistor by a region 460 and the like. The region 460 is an insulating region.

The semiconductor device illustrated in FIGS. 26A to 26C includes an insulator 464, an insulator 466, an insulator 468, an insulator 470, a conductor 480*a*, a conductor 480*b*, a conductor 480*c*, a conductor 478*a*, a conductor 478*b*, a conductor 478*c*, a conductor 476*a*, a conductor 476*b*, a conductor 474*a*, a conductor 474*b*, a conductor 474*c*, a conductor 496*a*, a conductor 496*b*, a conductor 496*c*, a conductor 496*d*, a conductor 498*a*, a conductor 498*b*, a conductor 498*c*, an insulator 482, an insulator 402, an insulator 492, the insulator 408, and an insulator 494.

The insulator 470 and the insulator 408 have barrier properties. This means that the semiconductor device illustrated in FIGS. 38A to 38C has a structure in which the transistor 2100 is surrounded by insulators having barrier properties. Note that one or both of the insulator 470 and the insulator 408 are not necessarily provided.

The insulator 464 is placed over the transistor 2200. The insulator 466 is placed over the insulator 464. The insulator 468 is placed over the insulator 466. The insulator 482 is placed over the insulator 468. The transistor 2100 is placed over the insulator 482. The insulator 492 is placed over the transistor 2100. The insulator 494 is placed over the insulator 492.

The insulator 464 includes an opening reaching the region 472*a*, an opening reaching the region 472*b*, and an opening reaching the conductor 454. In the openings, the conductor 480*a*, the conductor 480*b*, and the conductor 480*c* are provided.

The insulator 466 includes an opening reaching the conductor 480*a*, an opening reaching the conductor 480*b*, and an opening reaching the conductor 480*c*. In the openings, the conductor 478*a*, the conductor 478*b*, and the conductor 478*c* are provided.

The insulator 468 and the insulator 470 include an opening reaching the conductor 478*b* and an opening reaching the conductor 478*c*. In the openings, the conductor 476*a* and the conductor 476*b* are provided.

The insulator 482 includes an opening overlapping with a channel formation region of the transistor 2100, an opening reaching the conductor 476*a*, and an opening reaching the conductor 476*b*. In the openings, the conductor 474*a*, the conductor 474*b*, and the conductor 474*c* are provided.

The conductor 474*a* may function as a gate electrode of the transistor 2100. The electrical characteristics of the transistor 2100, such as the threshold voltage, may be controlled by application of a predetermined potential to the conductor 474*a*, for example. The conductor 474*a* may be electrically connected to the conductor 404 having a function of the gate electrode of the transistor 2100, for example. In that case, on-state current of the transistor 2100 can be increased. Furthermore, a punch-through phenomenon can be suppressed; thus, the electrical characteristics of the transistor 2100 in a saturation region can be stable.

The insulator 408 and the insulator 492 include the opening reaching the conductor 474*b* through the region 417*b* that is one of the source and the drain of the transistor 2100, the opening reaching the region 417*a* that is the other of the source and the drain of the transistor 2100, the opening reaching the conductor 404 that is the gate electrode of the transistor 2100, and the opening reaching the conductor 474*c*. In the openings, the conductor 496*a*, the conductor 496*b*, the conductor 496*c*, and the conductor 496*d* are provided. Note that in some cases, the openings are provided through any of components of the transistor 2100 or the like.

The insulator 494 includes an opening reaching the conductor 496*a*, an opening reaching the conductor 496*b* and the conductor 496d, and an opening reaching the conductor 496c. In the openings, the conductor 498a, the conductor 498b, and the conductor 498c are provided.

The insulators 464, 466, 468, 482, 492, and 494 may be formed using the same or different materials. The insulators 464, 466, 468, 482, 492, and 494 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulators 464, 466, 468, 482, 492, and 494 may each be formed using, for example, one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

At least one of the insulators 464, 466, 468, 482, 492, and 494 preferably includes an insulator having a barrier property.

An insulator with a function of blocking oxygen and impurities such as hydrogen may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

The conductors 480a, 480b, 480c, 478a, 478b, 478c, 476a, 476b, 474a, 474b, 474c, 496a, 496b, 496c, 496d, 498a, 498b, and 498c may be formed using the same material or different materials; for example, they may each be formed to have a single-layer structure or a stacked-layer structure including a conductor containing one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used. At least one of the conductors 480a, 480b, 480c, 478a, 478b, 478c, 476a, 476b, 474a, 474b, 474c, 496a, 496b, 496c, 496d, 498a, 498b, and 498c preferably includes a conductor having a barrier property.

Note that a semiconductor device in FIGS. 39A to 39C is the same as the semiconductor device in FIGS. 38A to 38C except for the structure of the transistor 2200. Therefore, the description of the semiconductor device in FIGS. 38A to 38C is referred to for the semiconductor devices in FIGS. 39A to 39C. In the semiconductor devices in FIGS. 39A to 39C, the transistor 2200 is a Fin-type transistor. The effective channel width is increased in the Fin-type transistor 2200, whereby the on-state characteristics of the transistor 2200 can be improved. In addition, since contribution of the electric field of the gate electrode can be increased, the off-state characteristics of the transistor 2200 can be improved. Note that FIGS. 39A to 39C are cross-sectional views of different portions.

Note that a semiconductor device in FIGS. 40A to 40C is the same as the semiconductor device in FIGS. 38A to 38C except for the structure of the transistor 2200. Therefore, the description of the semiconductor device in FIGS. 38A to 38C is referred to for the semiconductor device in FIGS. 40A to 40C. Specifically, in the semiconductor device in FIGS. 40A to 40C, the transistor 2200 is formed in an SOI substrate. In the structure in FIGS. 40A to 40C, a region 456 is apart from the semiconductor substrate 450 with an insulator 452 provided therebetween. Since the SOI substrate is used, a punch-through phenomenon and the like can be suppressed; thus, the off-state characteristics of the transistor 2200 can be improved. Note that the insulator 452 can be formed by turning part of the semiconductor substrate 450 into an insulator. For example, silicon oxide can be used as the insulator 452. Note that FIGS. 40A to 40C are cross-sectional views of different portions.

In each of the semiconductor devices shown in FIGS. 38A to 38C, FIGS. 39A to 39C, and FIGS. 40A to 40C, a p-channel transistor is formed utilizing a semiconductor substrate, and an n-channel transistor is formed above that; therefore, an occupation area of the element can be reduced. That is, the integration degree of the semiconductor device can be improved. In addition, the manufacturing process can be simplified compared to the case where an n-channel transistor and a p-channel transistor are formed utilizing the same semiconductor substrate; therefore, the productivity of the semiconductor device can be increased. Moreover, the yield of the semiconductor device can be improved. For the p-channel transistor, some complicated steps such as formation of lightly doped drain (LDD) regions, formation of a shallow trench structure, or distortion design can be omitted in some cases. Therefore, the productivity and yield of the semiconductor device can be increased in some cases, compared to a semiconductor device where an n-channel transistor is formed utilizing the semiconductor substrate.

<CMOS Analog Switch>

Figure 37B:
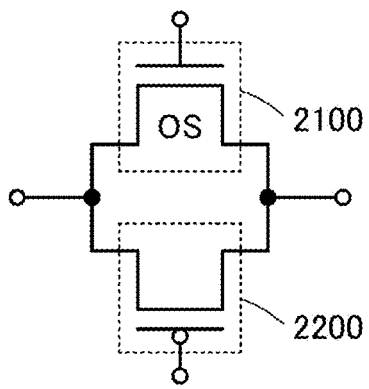

A circuit diagram in FIG. 37B shows a configuration in which sources of the transistors 2100 and 2200 are connected to each other and drains of the transistors 2100 and 2200 are connected to each other. With such a configuration, the transistors can function as what is called a CMOS analog switch.

<Memory Device 1>

Figure 41A:
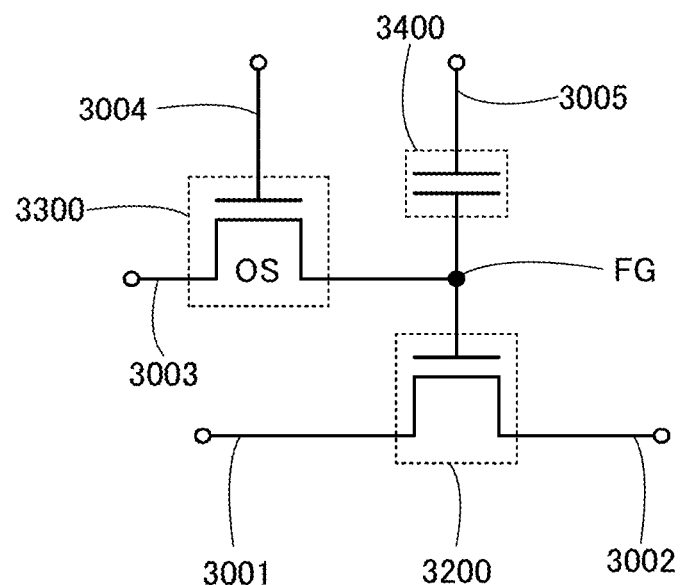
FIGS. 41A and 41B are circuit diagrams each illustrating a memory device of one embodiment of the present invention.
Figure 41B:
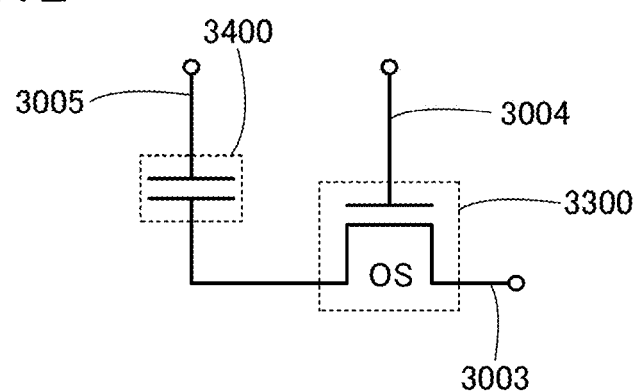

An example of a semiconductor device (memory device) which includes the transistor of one embodiment of the present invention, which can retain stored data even when not powered, and which has an unlimited number of write cycles is shown in FIGS. 41A and 41B.

The semiconductor device illustrated in FIG. 41A includes a transistor 3200 using a first semiconductor, a transistor 3300 using a second semiconductor, and a capacitor 3400. Note that the above-described transistor can be used as the transistor 3300.

Note that the transistor 3300 is preferably a transistor with a low off-state current. For example, a transistor including an oxide semiconductor can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 41A, a first wiring 3001 is electrically connected to a source of the transistor 3200. A second wiring 3002 is electrically connected to a drain of the transistor 3200. A third wiring 3003 is electrically connected to one of a source and a drain of the transistor 3300. A fourth wiring 3004 is electrically connected to a gate of the transistor 3300. A gate of the transistor 3200 and the other of the source and the drain of the transistor 3300 are electrically connected to one electrode of the capacitor 3400. A fifth wiring 3005 is electrically connected to the other electrode of the capacitor 3400.

The semiconductor device in FIG. 41A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined electric charge is supplied to the gate of the transistor 3200 (writing). Here, one of two kinds of electric charges providing different potential levels (hereinafter referred to as a low-level electric charge and a high-level electric charge) is supplied. After that, the potential of the fourth wiring 3004 is set to a potential at which the transistor 3300 is off, so that the transistor 3300 is turned off. Thus, the electric charge is held at the node FG (retaining).

Since the off-state current of the transistor 3300 is low, the electric charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of electric charge retained in the node FG. This is because in the case of using an n-channel transistor as the transistor 3200, an apparent threshold voltage $V_{th\_H}$ at the time when the high-level electric charge is given to the gate of the transistor 3200 is lower than an apparent threshold voltage $V_{th\_L}$ at the time when the low-level electric charge is given to the gate of the transistor 3200. Here, an apparent threshold voltage refers to the potential of the fifth wiring 3005 which is needed to make the transistor 3200 be in "on state." Thus, the potential of the fifth wiring 3005 is set to a potential $V_0$ which is between $V_{th\_H}$ and $V_{th\_L}$, whereby electric charge supplied to the node FG can be determined. For example, in the case where the high-level electric charge is supplied to the node FG in writing and the potential of the fifth wiring 3005 is $V_0$ ($>V_{th\_H}$), the transistor 3200 is brought into "on state." In the case where the low-level electric charge is supplied to the node FG in writing, even when the potential of the fifth wiring 3005 is $V_0$ ($<V_{th\_L}$), the transistor 3200 still remains in "off state." Thus, the data retained in the node FG can be read by determining the potential of the second wiring 3002.

Note that in the case where memory cells are arrayed, it is necessary that data of a desired memory cell be read in read operation. A configuration in which only data of a desired memory cell can be read by supplying a potential at which the transistor 3200 is brought into an "off state" regardless of the electric charge supplied to the node FG, that is, a potential lower than $V_{th\_H}$ to the fifth wiring 3005 of memory cells from which data is not read may be employed. Alternatively, a configuration in which only data of a desired memory cell can be read by supplying a potential at which the transistor 3200 is brought into an "on state" regardless of the electric charge supplied to the node FG, that is, a potential higher than $V_{th\_L}$ to the fifth wiring 3005 of memory cells from which data is not read may be employed.

<Structure 2 of Semiconductor Device>

Figure 42A:
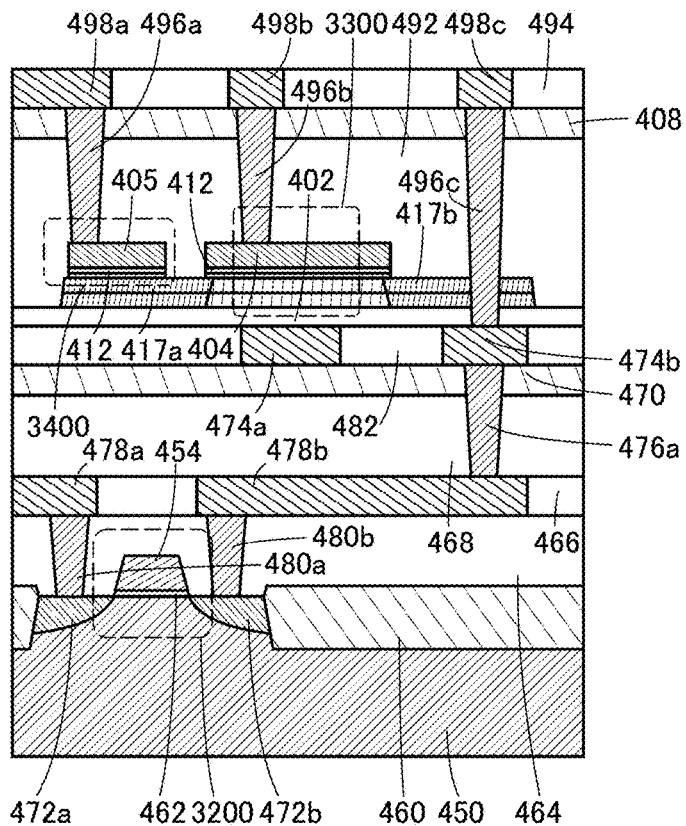
FIGS. 42A to 42C are cross-sectional views illustrating a semiconductor device of one embodiment of the present invention.
Figure 42B:
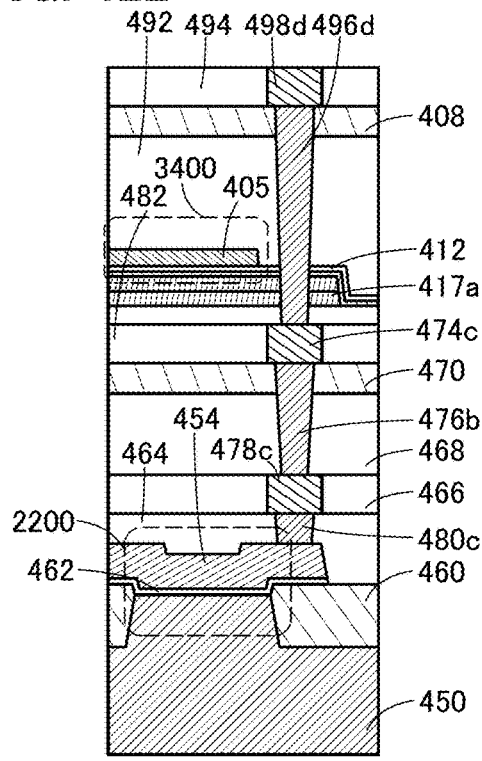
Figure 42C:
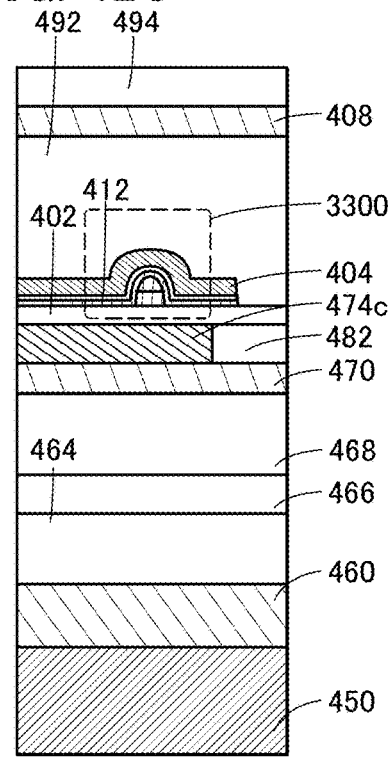

FIGS. 42A to 42C are cross-sectional views illustrating the semiconductor device of FIG. 41A. The semiconductor device shown in FIGS. 42A to 42C includes the transistor 3200, the transistor 3300, and the capacitor 3400. The transistor 3300 and the capacitor 3400 are placed above the transistor 3200. Note that for the transistor 3300, the description of the above transistor 2100 is referred to. Furthermore, for the transistor 3200, the description of the transistor 2200 in FIGS. 38A to 38C is referred to. Note that although the transistor 2200 is illustrated as a p-channel transistor in FIGS. 38A to 38C, the transistor 3200 may be an n-channel transistor. Note that FIGS. 42A to 42C are cross-sectional views of different portions.

The transistor 3200 illustrated in FIGS. 42A to 42C is a transistor including the semiconductor substrate 450. The transistor 3200 includes the region 472a in the semiconductor substrate 450, the region 472b in the semiconductor substrate 450, the insulator 462, and the conductor 454.

The semiconductor device illustrated in FIGS. 42A to 42C includes the insulator 464, the insulator 466, the insulator 468, the insulator 470, the conductor 480a, the conductor 480b, the conductor 480c, the conductor 478a, the conductor 478b, the conductor 478c, the conductor 476a, the conductor 476b, the conductor 474a, the conductor 474b, the conductor 474c, the conductor 496a, the conductor 496b, the conductor 496c, the conductor 496d, the conductor 498a, the conductor 498b, the conductor 498c, a conductor 498d, the insulator 482, the insulator 402, the insulator 492, the insulator 408, and the insulator 494.

The insulator 470 and the insulator 408 have barrier properties. This means that the semiconductor device illustrated in FIGS. 42A to 42C has a structure in which the transistor 3300 is surrounded by insulators having barrier properties. Note that one or both of the insulator 470 and the insulator 408 are not necessarily provided.

The insulator 464 is provided over the transistor 3200. The insulator 466 is provided over the insulator 464. The insulator 468 is provided over the insulator 466. The insulator 482 is provided over the insulator 468. The transistor 3300 is provided over the insulator 482. The insulator 492 is provided over the transistor 3300. The insulator 494 is provided over the insulator 492.

The insulator 464 has an opening reaching the region 472a, an opening reaching the region 472b, and an opening reaching the conductor 454. In the openings, the conductor 480a, the conductor 480b, and the conductor 480c are provided.

The insulator 466 includes an opening reaching the conductor 480a, an opening reaching the conductor 480b, and an opening reaching the conductor 480c. In the openings, the conductor 478a, the conductor 478b, and the conductor 478c are provided.

The insulator 468 and the insulator 470 include an opening reaching the conductor 478b and an opening reaching the conductor 478c. In the openings, the conductor 476a and the conductor 476b are provided.

The insulator 482 includes an opening overlapping with a channel formation region of the transistor 3300, an opening reaching the conductor 476a, and an opening reaching the conductor 476b. In the openings, the conductor 474a, the conductor 474b, and the conductor 474c are provided.

The conductor 474a may function as a bottom gate electrode of the transistor 3300. Alternatively, for example, electrical characteristics such as the threshold voltage of the transistor 3300 may be controlled by application of a constant potential to the conductor 474a. Further alternatively, for example, the conductor 474a and the conductor 404 that is a top gate electrode of the transistor 3300 may be electrically connected to each other. Thus, the on-state current of the transistor 3300 can be increased. A punch-through phenomenon can be suppressed; thus, stable electrical characteristics in a saturation region of the transistor 3300 can be obtained.

The insulator 408 and the insulator 492 include the opening reaching the conductor 474b through the region 417b that is one of the source and the drain of the transistor 3300, an opening reaching the conductor 405 that overlaps with the region 417a that is the other of the source and the drain of the transistor 3300, with the insulator 412 positioned therebetween, an opening reaching the conductor 404 that is the gate electrode of the transistor 3300, and the opening reaching the conductor 474c through the region 417a that is the other of the source and the drain of the transistor 3300. In the openings, the conductor 496a, the conductor 496b, the conductor 496c, and the conductor 496d are provided. Note that in some cases, an opening provided in a component of the transistor 3300 or the like is positioned between openings provided in other components.

The insulator 494 includes an opening reaching the conductor 496a, an opening reaching the conductor 496b, an opening reaching the conductor 496c, and an opening reaching the conductor 496d. In the openings, the conductor 498a, the conductor 498b, the conductor 498c, and the conductor 498d are provided.

At least one of the insulators 464, 466, 468, 482, 492, and 494 preferably includes an insulator having a barrier property.

The conductor 498d may be formed to have a single-layer structure or a stacked-layer structure using a conductor containing, for example, one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used. The conductor 498d preferably includes a conductor having a barrier property.

The source or drain of the transistor 3200 is electrically connected to the region 417b that is one of the source and the drain of the transistor 3300 through the conductor 480b, the conductor 478b, the conductor 476a, the conductor 474b, and the conductor 496c. The conductor 454 that is the gate electrode of the transistor 3200 is electrically connected to the region 417a that is the other of the source and the drain of the transistor 3300 through the conductor 480c, the conductor 478c, the conductor 476b, the conductor 474c, and the conductor 496d.

The capacitor 3400 includes an electrode electrically connected to the other of the source and the drain of the transistor 3300, the conductor 405, and the insulator 412. The insulator 412 is preferably used in some cases because the insulator 412 of the capacitor 3400 can be formed in the same step as the insulator 412 functioning as a gate insulator of the transistor 3300, leading to an increase in productivity. A layer formed in the same step as the conductor 404 functioning as the gate electrode of the transistor 3300 is preferably used as the conductor 405 in some cases, leading to an increase in productivity. The conductor 405 and the conductor 404 may be formed in different steps.

For the structures of other components, the description of FIGS. 38A to 38C and the like can be referred to as appropriate.

Figure 43A:
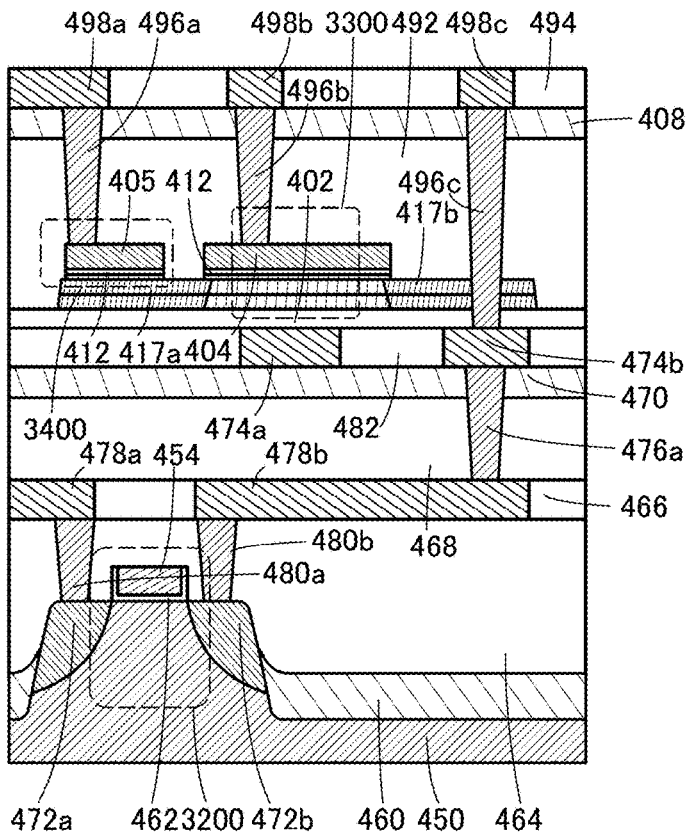
FIGS. 43A to 43C are cross-sectional views illustrating a semiconductor device of one embodiment of the present invention.
Figure 43B:
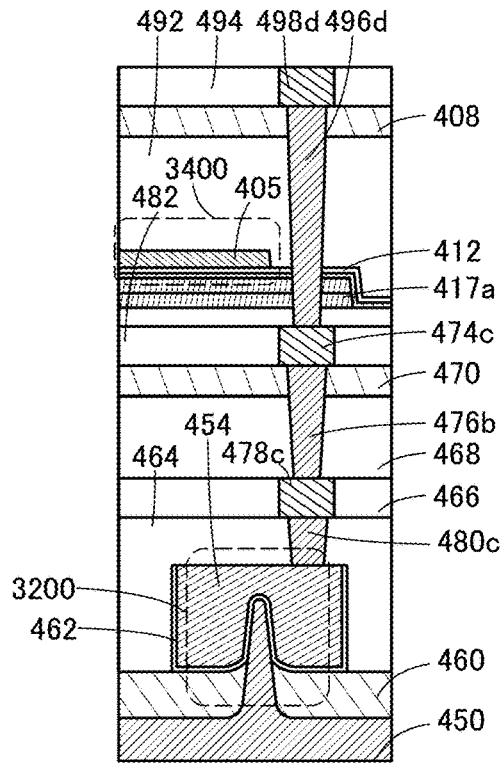
Figure 43C:
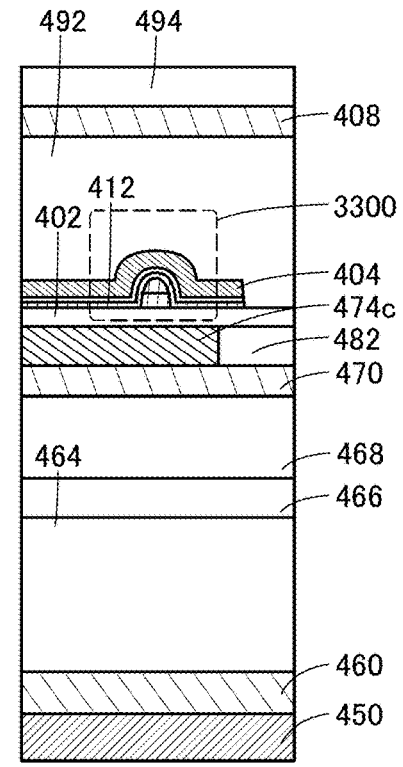

A semiconductor device in FIGS. 43A to 43C is the same as the semiconductor device in FIGS. 42A to 42C except for the structure of the transistor 3200. Therefore, the description of the semiconductor device in FIGS. 42A to 42C is referred to for the semiconductor devices in FIGS. 43A to 43C. Specifically, in the semiconductor devices in FIGS. 43A to 43C, the transistor 3200 is a Fin-type transistor. For the Fin-type transistor 3200, the description of the transistor 2200 in FIGS. 39A to 39C is referred to. Note that although the transistor 2200 is illustrated as a p-channel transistor in FIGS. 39A to 39C, the transistor 3200 may be an n-channel transistor. Note that FIGS. 43A to 43C are cross-sectional views of different portions.

Figure 44A:
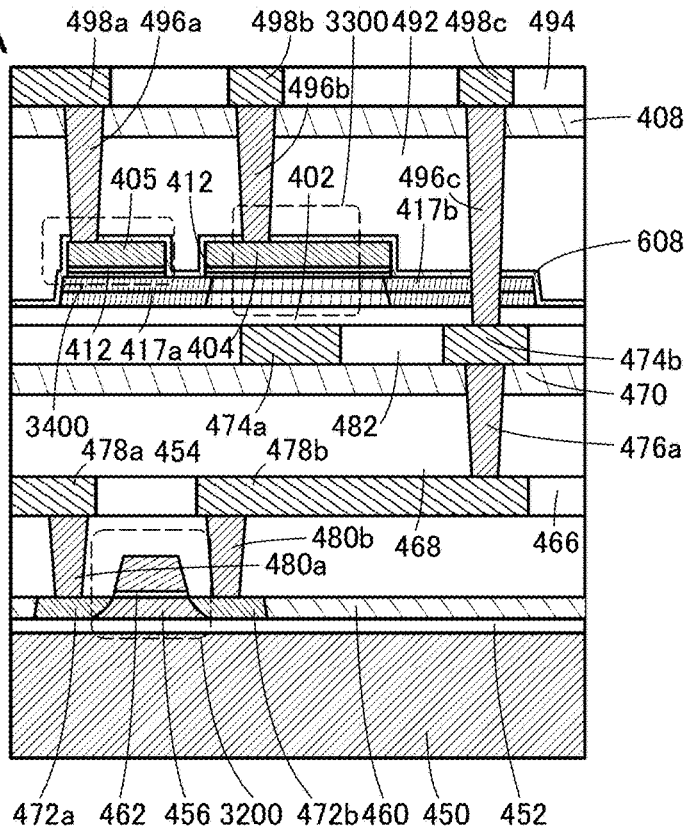
FIGS. 44A to 44C are cross-sectional views illustrating a semiconductor device of one embodiment of the present invention.
Figure 44B:
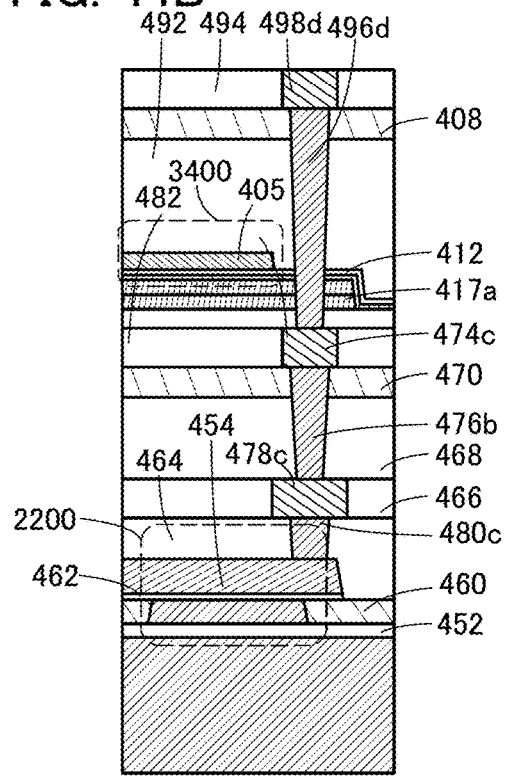
Figure 44C:
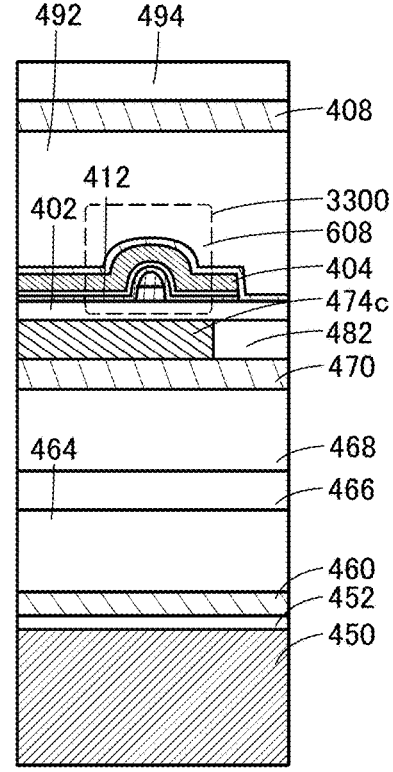

A semiconductor device in FIGS. 44A to 44C is the same as the semiconductor device in FIGS. 42A to 42C except for the structure of the transistor 3200. Therefore, the description of the semiconductor device in FIGS. 42A to 42C is referred to for the semiconductor device in FIGS. 44A to 44C. Specifically, in the semiconductor device in FIGS. 44A to 44C, the transistor 3200 is provided in the semiconductor substrate 450 that is an SOI substrate. For the transistor 3200, which is provided in the semiconductor substrate 450 (SOI substrate), the description of the transistor 2200 in FIGS. 40A to 40C is referred to. Note that although the transistor 2200 is illustrated as a p-channel transistor in FIGS. 40A to 40C, the transistor 3200 may be an n-channel transistor. Note that FIGS. 44A to 44C are cross-sectional views of different portions.

<Memory Device 2>

The semiconductor device in FIG. 41B is different from the semiconductor device in FIG. 41A in that the transistor 3200 is not provided. Also in this case, data can be written and retained in a manner similar to that of the semiconductor device in FIG. 41A.

Reading of data in the semiconductor device in FIG. 41B is described. When the transistor 3300 is brought into an on state, the third wiring 3003 which is in a floating state and the capacitor 3400 are brought into conduction, and the electric charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the electric charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor including an oxide semiconductor and having a low off-state current, the semiconductor device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

<Imaging Device>

An imaging device of one embodiment of the present invention will be described below.

Figure 45A:
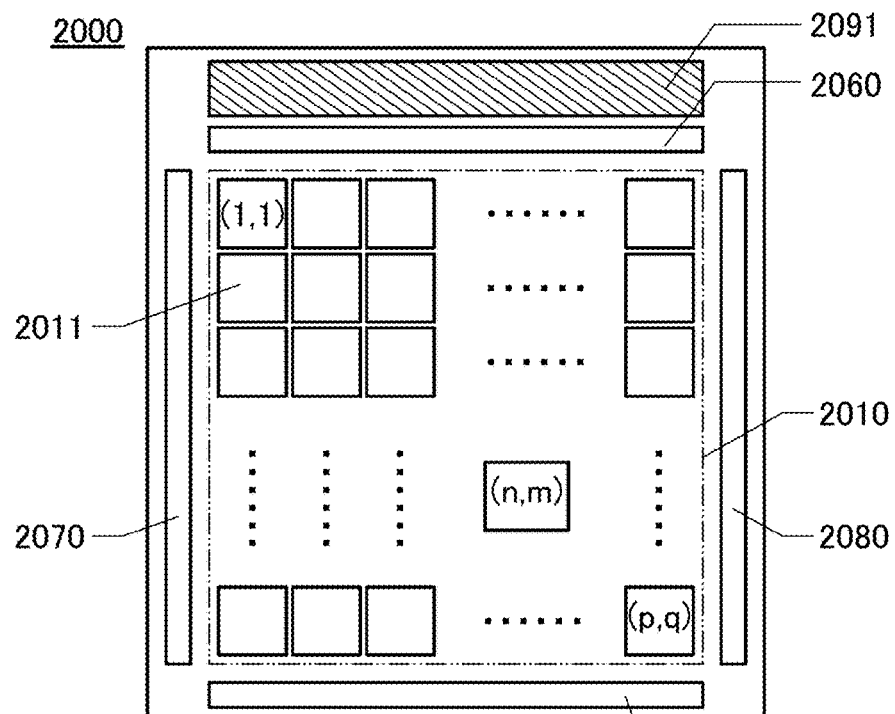
FIGS. 45A and 45B are top views each illustrating a semiconductor device of one embodiment of the present invention.

FIG. 45A is a plan view illustrating an example of an imaging device 2000 of one embodiment of the present invention. The imaging device 2000 includes a pixel portion 2010 and peripheral circuits for driving the pixel portion 2010 (a peripheral circuit 2060, a peripheral circuit 2070, a peripheral circuit 2080, and a peripheral circuit 2090). The pixel portion 2010 includes a plurality of pixels 2011 arranged in a matrix with p rows and q columns (p and q are each an integer of 2 or more). The peripheral circuit 2060, the peripheral circuit 2070, the peripheral circuit 2080, and the peripheral circuit 2090 are each connected to the plurality of pixels 2011, and a signal for driving the plurality of pixels 2011 is supplied. In this specification and the like, in some cases, a "peripheral circuit" or a "driver circuit" indicate all of the peripheral circuits 2060, 2070, 2080, and 2090. For example, the peripheral circuit 2060 can be regarded as part of the peripheral circuit.

The imaging device 2000 preferably includes a light source 2091. The light source 2091 can emit detection light P1.

The peripheral circuit includes at least one of a logic circuit, a switch, a buffer, an amplifier circuit, and a converter circuit. The peripheral circuit may be formed over a substrate where the pixel portion 2010 is formed. A semiconductor device such as an IC chip may be used as part or the whole of the peripheral circuit. Note that as the peripheral circuit, one or more of the peripheral circuits 2060, 2070, 2080, and 2090 may be omitted.

Figure 45B:
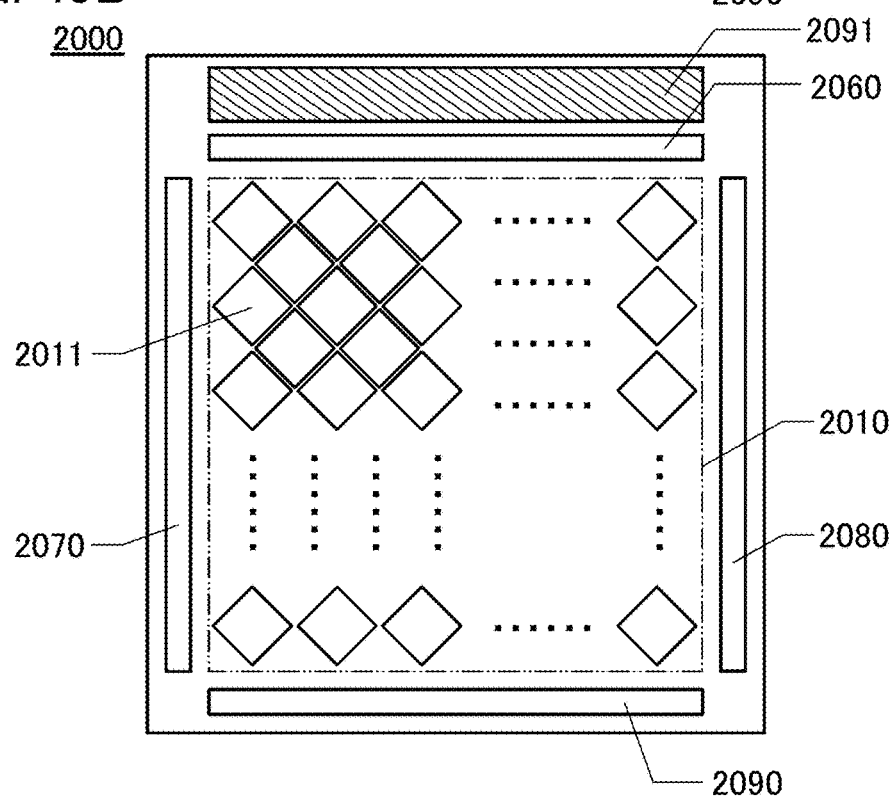

As illustrated in FIG. 45B, the pixels 2011 may be provided to be inclined in the pixel portion 2010 included in the imaging device 2000. When the pixels 2011 are obliquely arranged, the distance between pixels (pitch) can be shortened in the row direction and the column direction. Accordingly, the quality of an image taken with the imaging device 2000 can be improved.

Configuration Example 1 of Pixel

The pixel 2011 included in the imaging device 2000 is formed with a plurality of subpixels 2012, and each subpixel 2012 is combined with a filter (color filter) which transmits light in a specific wavelength band, whereby data for achieving color image display can be obtained.

Figure 46A:
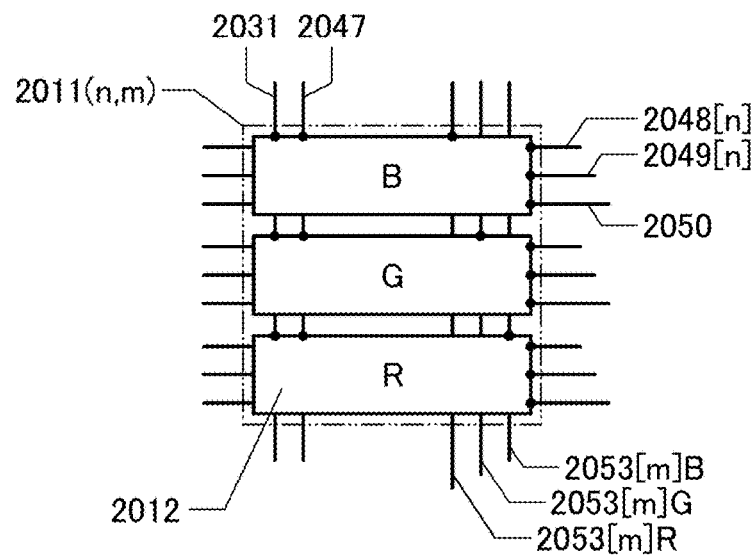
FIGS. 46A and 46B are block diagrams each illustrating a semiconductor device of one embodiment of the present invention.

FIG. 46A is a top view showing an example of the pixel 2011 with which a color image is obtained. The pixel 2011 illustrated in FIG. 46A includes a subpixel 2012 provided with a color filter that transmits light in a red (R) wavelength band (also referred to as a subpixel 2012R), a subpixel 2012 provided with a color filter that transmits light in a green (G) wavelength band (also referred to as a subpixel 2012G), and a subpixel 2012 provided with a color filter that transmits light in a blue (B) wavelength band (also referred to as a subpixel 2012B). The subpixel 2012 can function as a photosensor.

The subpixel 2012 (the subpixel 2012R, the subpixel 2012G, and the subpixel 2012B) is electrically connected to a wiring 2031, a wiring 2047, a wiring 2048, a wiring 2049, and a wiring 2050. In addition, the subpixel 2012R, the subpixel 2012G, and the subpixel 2012B are connected to respective wirings 2053 which are independently provided. In this specification and the like, for example, the wiring 2048 and the wiring 2049 that are connected to the pixel 2011 in the n-th row are referred to as a wiring 2048[n] and a wiring 2049[n]. For example, the wiring 2053 connected to the pixel 2011 in the m-th column is referred to as a wiring 2053[m]. Note that in FIG. 46A, the wirings 2053 connected to the subpixel 2012R, the subpixel 2012G, and the subpixel 2012B in the pixel 2011 in the m-th column are referred to as a wiring 2053[m]R, a wiring 2053[m]G, and a wiring 2053[m]B. The subpixels 2012 are electrically connected to the peripheral circuit through the above wirings.

Figure 46B:
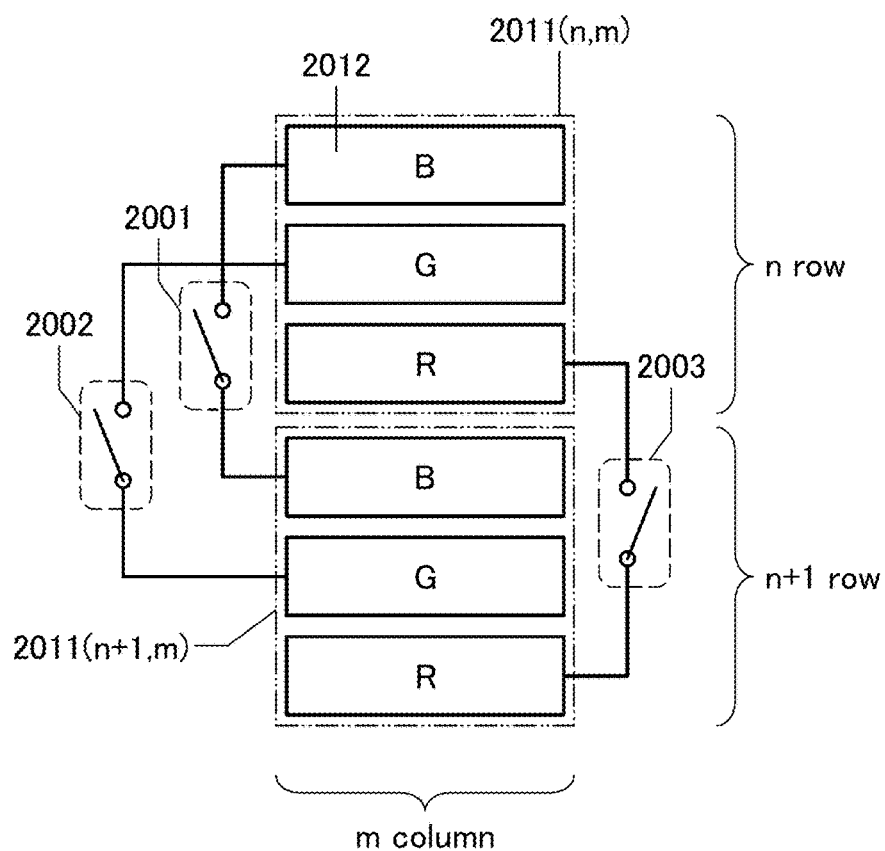

The imaging device 2000 has a structure in which the subpixel 2012 is electrically connected to the subpixel 2012 in an adjacent pixel 2011 which is provided with a color filter transmitting light in the same wavelength band as the subpixel 2012, via a switch. FIG. 46B shows a connection example of the subpixels 2012: the subpixel 2012 in the pixel 2011 arranged in the n-th (n is an integer greater than or equal to 1 and less than or equal to p) row and the m-th (m is an integer greater than or equal to 1 and less than or equal to q) column and the subpixel 2012 in the adjacent pixel 2011 arranged in an (n+1)-th row and the m-th column. In FIG. 46B, the subpixel 2012R arranged in the n-th row and the m-th column and the subpixel 2012R arranged in the (n+1)-th row and the m-th column are connected to each other via a switch 2003. The subpixel 2012G arranged in the n-th row and the m-th column and the subpixel 2012G arranged in the (n+1)-th row and the m-th column are connected to each other via a switch 2002. The subpixel 2012B arranged in the n-th row and the m-th column and the subpixel 2012B arranged in the (n+1)-th row and the m-th column are connected to each other via a switch 2001.

The color filter used in the subpixel 2012 is not limited to red (R), green (G), and blue (B) color filters, and color filters that transmit light of cyan (C), yellow (Y), and magenta (M) may be used. By provision of the subpixels 2012 that sense light in three different wavelength bands in one pixel 2011, a full-color image can be obtained.

The pixel 2011 including the subpixel 2012 provided with a color filter transmitting yellow (Y) light may be provided, in addition to the subpixels 2012 provided with the color filters transmitting red (R), green (G), and blue (B) light. The pixel 2011 including the subpixel 2012 provided with a color filter transmitting blue (B) light may be provided, in addition to the subpixels 2012 provided with the color filters transmitting cyan (C), yellow (Y), and magenta (M) light. When the subpixels 2012 sensing light in four different wavelength bands are provided in one pixel 2011, the reproducibility of colors of an obtained image can be increased.

For example, in FIG. 46A, in regard to the subpixel 2012 sensing light in a red wavelength band, the subpixel 2012 sensing light in a green wavelength band, and the subpixel 2012 sensing light in a blue wavelength band, the pixel number ratio (or the light receiving area ratio) thereof is not necessarily 1:1:1. For example, the Bayer arrangement in which the pixel number ratio (the light receiving area ratio) is set at red:green:blue=1:2:1 may be employed. Alternatively, the pixel number ratio (the light receiving area ratio) of red and green to blue may be 1:6:1.

Although the number of subpixels 2012 provided in the pixel 2011 may be one, two or more subpixels are preferably provided. For example, when two or more subpixels 2012 sensing light in the same wavelength band are provided, the redundancy is increased, and the reliability of the imaging device 2000 can be increased.

When an infrared (IR) filter that transmits infrared light and absorbs or reflects visible light is used as the filter, the imaging device 2000 that senses infrared light can be achieved.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 2011 may be provided with a lens. An arrangement example of the pixel 2011, a filter 2054, and a lens 2055 is described with cross-sectional views in FIGS. 47A and 47B. With the lens 2055, the photoelectric conversion element can receive incident light efficiently. Specifically, as illustrated in FIG. 47A, light 2056 enters a photoelectric conversion element 2020 through the lens 2055, the filter 2054 (a filter 2054R, a filter 2054G, and a filter 2054B), a pixel circuit 2030, and the like which are provided in the pixel 2011.

As indicated by a region surrounded with dashed double-dotted lines, however, part of the light 2056 indicated by arrows might be blocked by some wirings 2057. Thus, a preferable structure is such that the lens 2055 and the filter 2054 are provided on the photoelectric conversion element 2020 side as illustrated in FIG. 47B, whereby the photoelectric conversion element 2020 can efficiently receive the light 2056. When the light 2056 enters the photoelectric conversion element 2020 from the photoelectric conversion element 2020 side, the imaging device 2000 with high sensitivity can be provided.

Figure 47A:
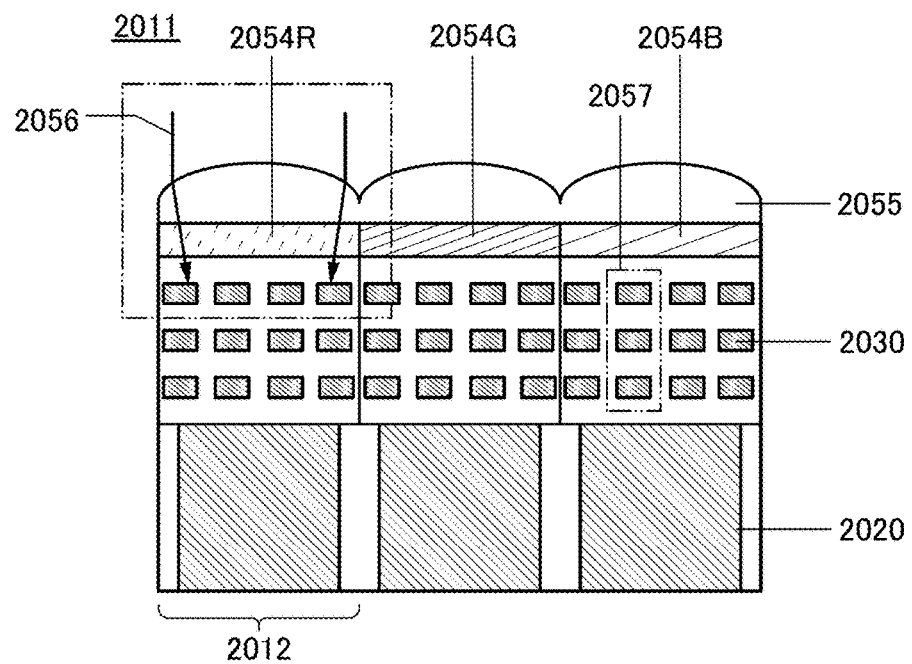
FIGS. 47A and 47B are cross-sectional views each illustrating a semiconductor device of one embodiment of the present invention.
Figure 47B:
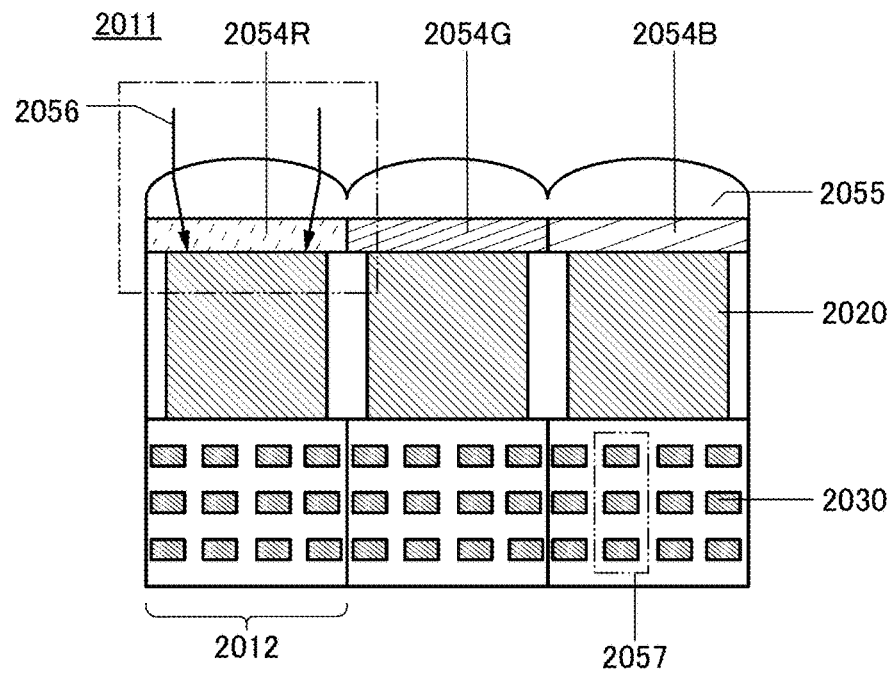

As the photoelectric conversion element 2020 illustrated in FIGS. 47A and 47B, a photoelectric conversion element in which a p-n junction or a p-i-n junction is formed may be used.

The photoelectric conversion element 2020 may be formed using a substance that has a function of absorbing a radiation and generating electric charges. Examples of the substance that has a function of absorbing a radiation and generating electric charges include selenium, lead iodide, mercury iodide, gallium arsenide, cadmium telluride, and cadmium zinc alloy.

For example, when selenium is used for the photoelectric conversion element 2020, the photoelectric conversion element 2020 can have a light absorption coefficient in a wide wavelength band, such as visible light, ultraviolet light, infrared light, X-rays, and gamma rays.

One pixel 2011 included in the imaging device 2000 may include the subpixel 2012 with a first filter in addition to the subpixel 2012 illustrated in FIGS. 46A and 46B.

Configuration Example 2 of Pixel

An example of a pixel including a transistor including silicon and a transistor including an oxide semiconductor is described below.

Figure 48A:
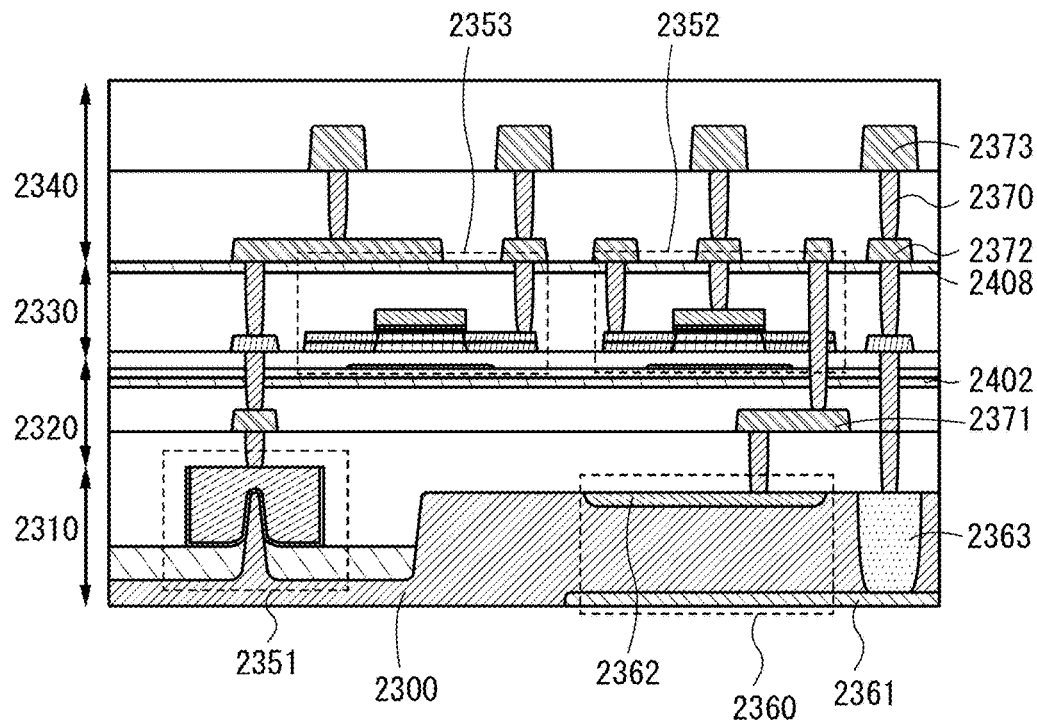
FIGS. 48A and 48B are cross-sectional views each illustrating a semiconductor device of one embodiment of the present invention.
Figure 48B:
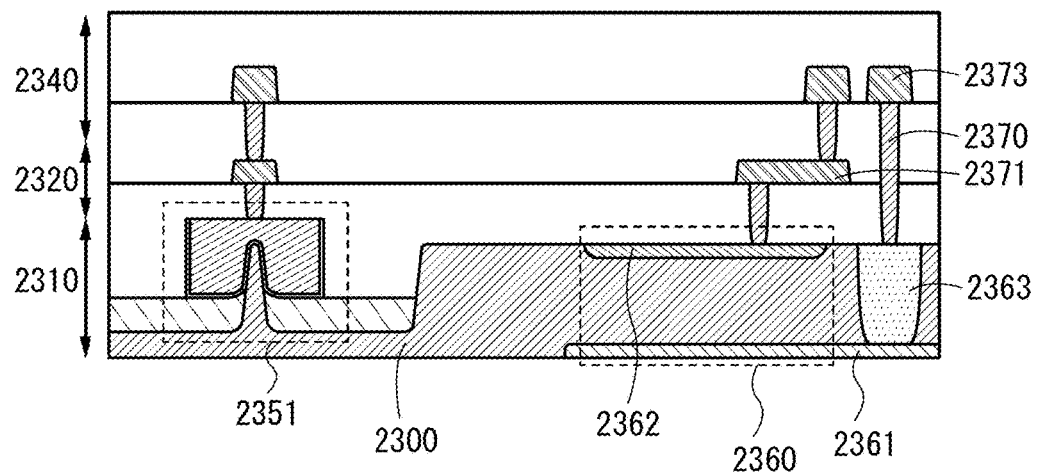

FIGS. 48A and 48B are each a cross-sectional view of an element included in an imaging device. The imaging device illustrated in FIG. 48A includes a transistor 2351 including silicon over a silicon substrate 2300, transistors 2352 and 2353 which include an oxide semiconductor and are stacked over the transistor 2351, and a photodiode 2360 provided in a silicon substrate 2300. The transistors and the photodiode 2360 are electrically connected to various plugs 2370 and wirings 2371. A cathode 2362 of the photodiode 2360 is electrically connected to the wiring 2371 through a plug. In addition, an anode 2361 of the photodiode 2360 is electrically connected to the plug 2370 through a low-resistance region 2363.

The imaging device includes a layer 2310 including the transistor 2351 provided on the silicon substrate 2300 and the photodiode 2360 provided in the silicon substrate 2300, a layer 2320 which is in contact with the layer 2310 and includes the wirings 2371, a layer 2330 which is in contact with the layer 2320 and includes the transistors 2352 and 2353, and a layer 2340 which is in contact with the layer 2330 and includes a wiring 2372 and a wiring 2373.

In the example of cross-sectional view in FIG. 48A, a light-receiving surface of the photodiode 2360 is provided on the side opposite to a surface of the silicon substrate 2300 where the transistor 2351 is formed. With this structure, a light path can be secured without an influence of the transistors and the wirings. Thus, a pixel with a high aperture ratio can be formed. Note that the light-receiving surface of the photodiode 2360 can be the same as the surface where the transistor 2351 is formed.

In the case where a pixel is formed with use of only transistors including an oxide semiconductor, the layer 2310 may include the transistor including an oxide semiconductor. Alternatively, the layer 2310 may be omitted, and the pixel may include only transistors including an oxide semiconductor.

In the case where a pixel is formed with use of only transistors including silicon, the layer 2330 may be omitted. An example of a cross-sectional view in which the layer 2330 is not provided is shown in FIG. 48B. In the case where the layer 2330 is not provided, the wiring 2372 of the layer 2340 can be omitted.

Note that the silicon substrate 2300 may be an SOI substrate. Furthermore, the silicon substrate 2300 can be replaced with a substrate made of germanium, silicon germanium, silicon carbide, gallium arsenide, aluminum gallium arsenide, indium phosphide, gallium nitride, or an organic semiconductor.

Here, an insulator 2402 is provided between the layer 2310 including the transistor 2351 and the photodiode 2360 and the layer 2330 including the transistors 2352 and 2353. However, there is no limitation on the position of the insulator 2402.

Hydrogen in an insulator provided in the vicinity of a channel formation region of the transistor 2351 terminates dangling bonds of silicon; accordingly, the reliability of the transistor 2351 can be improved. In contrast, hydrogen in the insulator provided in the vicinity of the transistor 2352, the transistor 2353, and the like becomes one of factors generating a carrier in the oxide semiconductor. Thus, the hydrogen may cause a reduction of the reliability of the transistor 2352, the transistor 2353, and the like. For this reason, in the case where the transistor including an oxide semiconductor is provided over the transistor including silicon, it is preferable that the insulator 2402 having a barrier property be provided between the transistors. Each of the transistor 2352 and the transistor 2353 is preferably surrounded by an insulator having a barrier property in all directions. In addition, an insulator 2408 having a barrier property is preferably provided over the transistor 2352 and the transistor 2353 to cover the transistors. When the hydrogen is confined below the insulator 2402, the reliability of the transistor 2351 can be improved. In addition, the hydrogen can be prevented from being diffused from a part below the insulator 2402 to a part above the insulator 2402; thus, the reliability of the transistor 2352, the transistor 2353, and the like can be increased.

The semiconductor device illustrated in FIG. 48A has a structure in which the transistor 2352 and the transistor 2353 are surrounded by insulators having barrier properties. Note that the transistor 2352 and the transistor 2353 are not necessarily surrounded by insulators having barrier properties.

In the cross-sectional view in FIG. 48A, the photodiode 2360 in the layer 2310 and the transistor in the layer 2330 can be formed so as to overlap with each other. Thus, the degree of integration of pixels can be increased. In other words, the resolution of the imaging device can be increased.

Figure 49A:
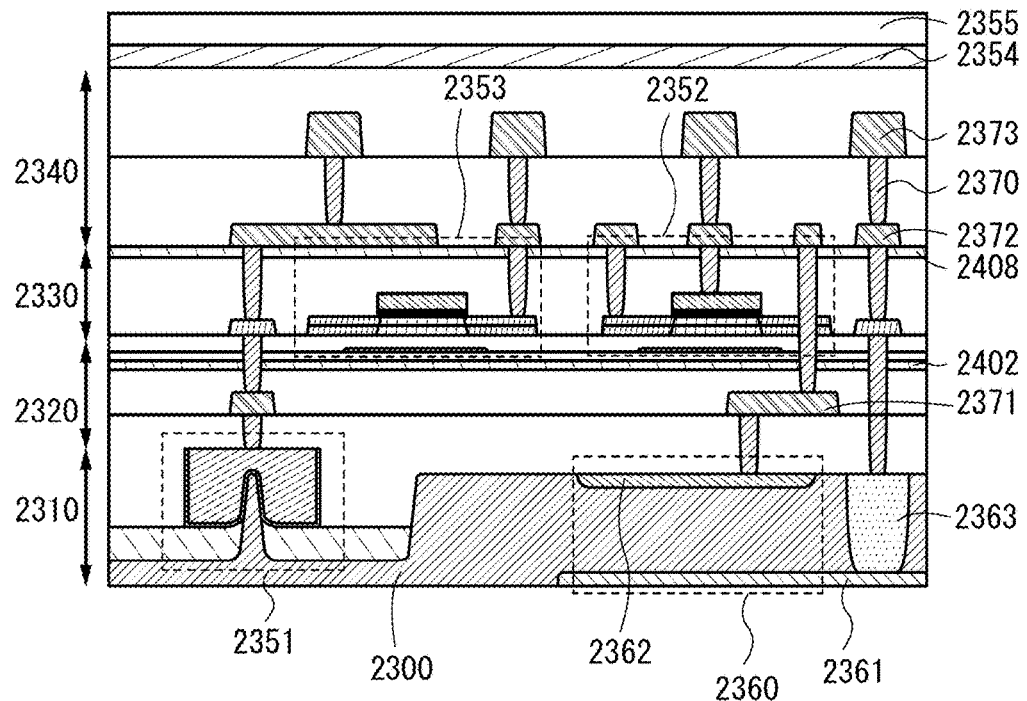
FIGS. 49A and 49B are cross-sectional views each illustrating a semiconductor device of one embodiment of the present invention.
Figure 49B:
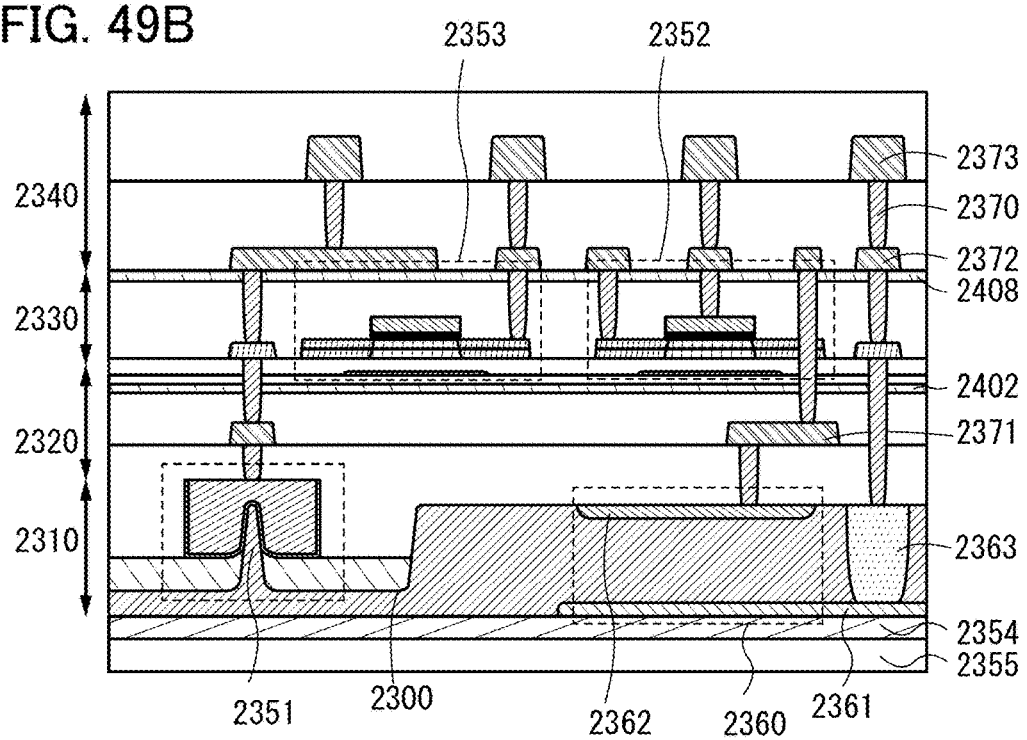

A filter 2354 and/or a lens 2355 may be provided over or under the pixel as shown in FIGS. 49A and 49B. For the filter 2354, refer to the description of the filter 2054. For the lens 2355, refer to for the description of the lens 2055.

As illustrated in FIG. 50A1 and FIG. 50B1, part or the whole of the imaging device can be bent. FIG. 50A1 illustrates a state in which the imaging device is bent in the direction of a dashed-dotted line X1-X2. FIG. 50A2 is a cross-sectional view illustrating a portion indicated by the dashed-dotted line X1-X2 in FIG. 50A1. FIG. 50A3 is a cross-sectional view illustrating a portion indicated by a dashed-dotted line Y1-Y2 in FIG. 50A1.

FIG. 50B1 illustrates a state where the imaging device is bent in the direction of a dashed-dotted line X3-X4 and the direction of a dashed-dotted line Y3-Y4. FIG. 50B2 is a cross-sectional view illustrating a portion indicated by the dashed-dotted line X3-X4 in FIG. 50B1. FIG. 50B3 is a cross-sectional view illustrating a portion indicated by the dashed-dotted line Y3-Y4 in FIG. 50B1.

The bent imaging device enables the curvature of field and astigmatism to be reduced. Thus, the optical design of lens and the like, which is used in combination of the imaging device, can be facilitated. For example, the number of lenses used for aberration correction can be reduced; accordingly, a reduction of size or weight of electronic devices using the imaging device, and the like, can be achieved. In addition, the quality of a captured image can be improved.

<FPGA>

One embodiment of the present invention can also be applied to an LSI such as a field programmable gate array (FPGA).

Figure 51A:
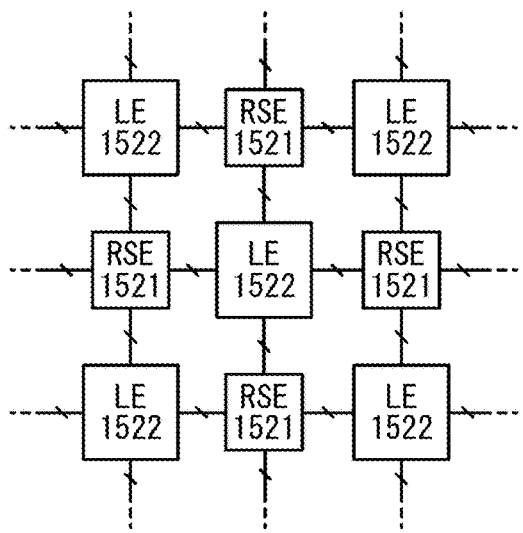
FIGS. 51A to 51E are circuit diagrams each illustrating a semiconductor device of one embodiment of the present invention.

FIG. 51A illustrates an example of a block diagram of an FPGA. The FPGA includes a routing switch element 1521 and a logic element 1522. The logic element 1522 can switch functions of a logic circuit, such as a function of a combination circuit or a function of a sequential circuit, in accordance with configuration data stored in a configuration memory.

Figure 51B:
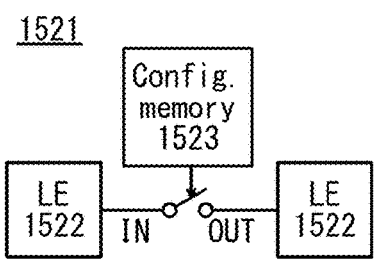

FIG. 51B is a schematic view illustrating a function of the routing switch element 1521. The routing switch element 1521 can switch a connection between the logic elements 1522 in accordance with configuration data stored in a configuration memory 1523. Note that although FIG. 51B illustrates one switch which switches a connection between a terminal IN and a terminal OUT, in an actual FPGA, a plurality of switches are provided between a plurality of the logic elements 1522.

Figure 51C:
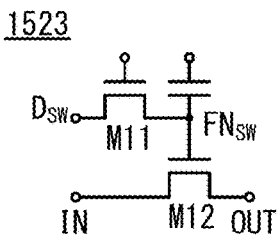

FIG. 51C illustrates a configuration example of a circuit serving as the configuration memory 1523. The configuration memory 1523 includes a transistor M11 that is a transistor including an oxide semiconductor and a transistor M12 that is a transistor including silicon. Configuration data $D_{SW}$ is supplied to a node $FN_{SW}$ through the transistor M11. A potential of the configuration data $D_{SW}$ can be retained by turning off the transistor M11. The on and off states of the transistor M12 can be switched depending on the potential of the retained configuration data $D_{SW}$, so that the connection between the terminal IN and the terminal OUT can be switched.

Figure 51D:
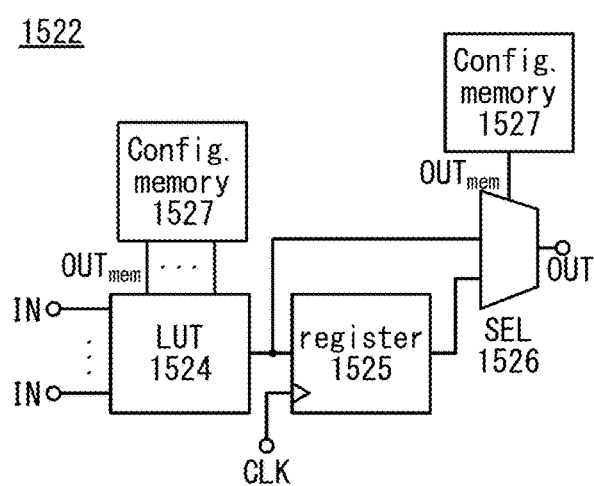

FIG. 51D is a schematic view illustrating a function of the logic element 1522. The logic element 1522 can switch a potential of a terminal $OUT_{mem}$ in accordance with configuration data stored in a configuration memory 1527. A lookup table 1524 can switch functions of a combination circuit that processes a signal of the terminal IN in accordance with the potential of the terminal $OUT_{mem}$. The logic element 1522 includes a register 1525 that is a sequential circuit and a selector 1526 that switches signals of the terminal OUT. The selector 1526 can select to output a signal of the lookup table 1524 or to output a signal of the register 1525 in accordance with the potential of the terminal $OUT_{mem}$, which is output from the configuration memory 1527.

Figure 51E:
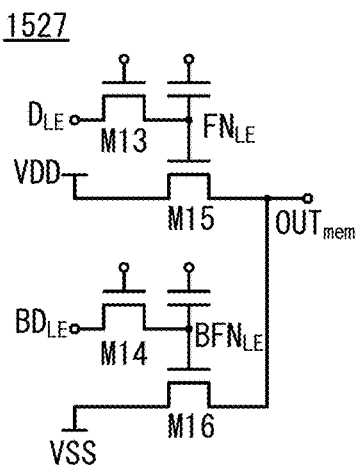

FIG. 51E illustrates a configuration example of a circuit serving as the configuration memory 1527. The configuration memory 1527 includes a transistor M13 and a transistor M14 that are transistors including an oxide semiconductor, and a transistor M15 and a transistor M16 that are transistors including silicon. Configuration data $D_{LE}$ is supplied to a node $FN_{LE}$ through the transistor M13. Configuration data $BD_{LE}$ is supplied to a node $BFN_{LE}$ through the transistor M14. The configuration data $BD_{LE}$ corresponds to a potential of the configuration data $D_{LE}$ whose logic is inverted. The potential of the configuration data $D_{LE}$ and the potential of the configuration data $BD_{LE}$ can be retained by turning off the transistor M13 and the transistor M14, respectively. The on and off states of one of the transistors M15 and M16 are switched in accordance with the retained potential of the configuration data $D_{LE}$ or the configuration data $BD_{LE}$, so that a potential VDD or a potential VSS can be supplied to the terminal $OUT_{mem}$.

For the configuration illustrated in FIGS. 51A to 51E, any of the above-described transistors, logic circuits, memory devices, and the like can be used. For example, transistors including silicon are used as the transistors M12, M15, and M16, and transistors including an oxide semiconductor are used as the transistors M11, M13, and M14. In that case, the transistors including silicon are formed over a silicon substrate and then, the transistors including an oxide semiconductor are formed over the transistors including silicon, in which case the chip size of the FPGA can be reduced. Furthermore, the combination of the low off-state current of the transistors including an oxide semiconductor and the high on-state current of the transistors including silicon enables the FPGA to have small power consumption and high operation speed.

<CPU>

A CPU including a semiconductor device such as any of the above-described transistors or the above-described memory device will be described below.

Figure 52:
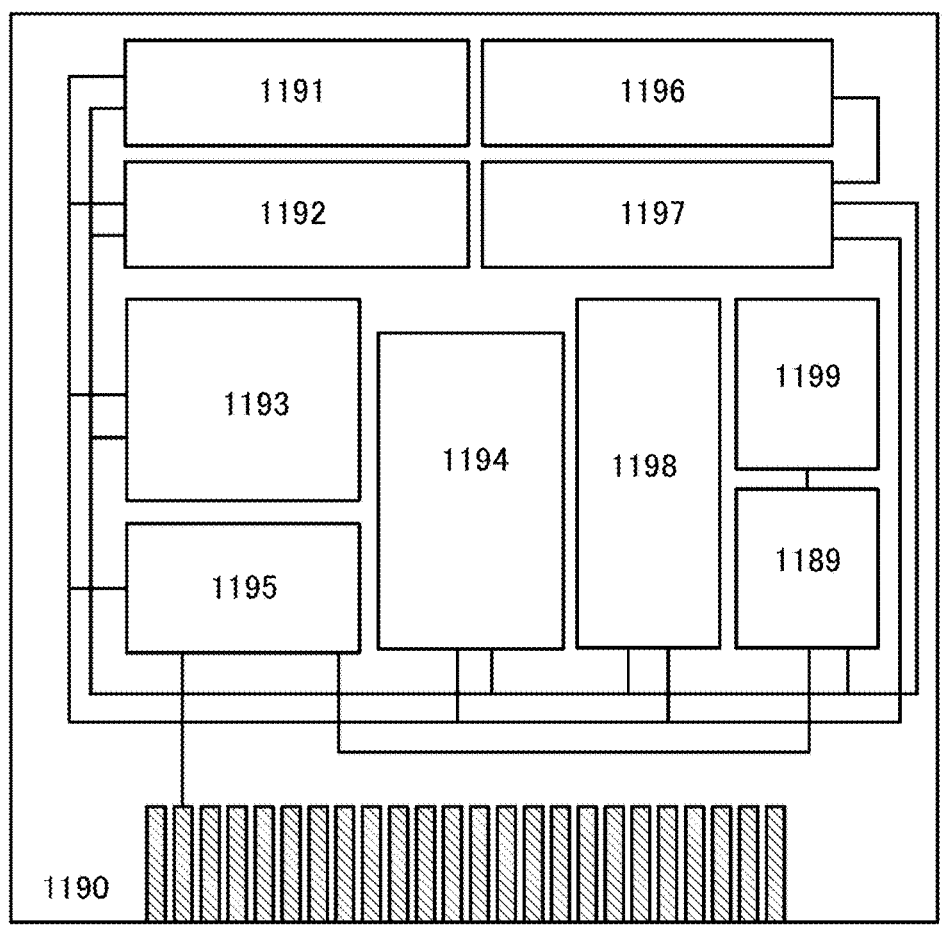
FIG. 52 is a block diagram illustrating a semiconductor device of one embodiment of the present invention.

FIG. 52 is a block diagram illustrating a configuration example of a CPU including any of the above-described transistors as a component.

The CPU illustrated in FIG. 52 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 52 is just an example in which the configuration has been simplified, and an actual CPU may have a variety of configurations depending on the application. For example, the CPU may have the following configuration: a structure including the CPU illustrated in FIG. 52 or an arithmetic circuit is considered as one core; a plurality of such cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 52, a memory cell is provided in the register 1196. For the memory cell of the register 1196, any of the above-described transistors, the above-described memory device, or the like can be used.

In the CPU illustrated in FIG. 52, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retention by the flip-flop is selected, a power supply voltage is supplied to the memory cell in the register 1196. When data retention by the capacitor is selected, the data is rewritten in the capacitor, and supply of a power supply voltage to the memory cell in the register 1196 can be stopped.

Figure 53:
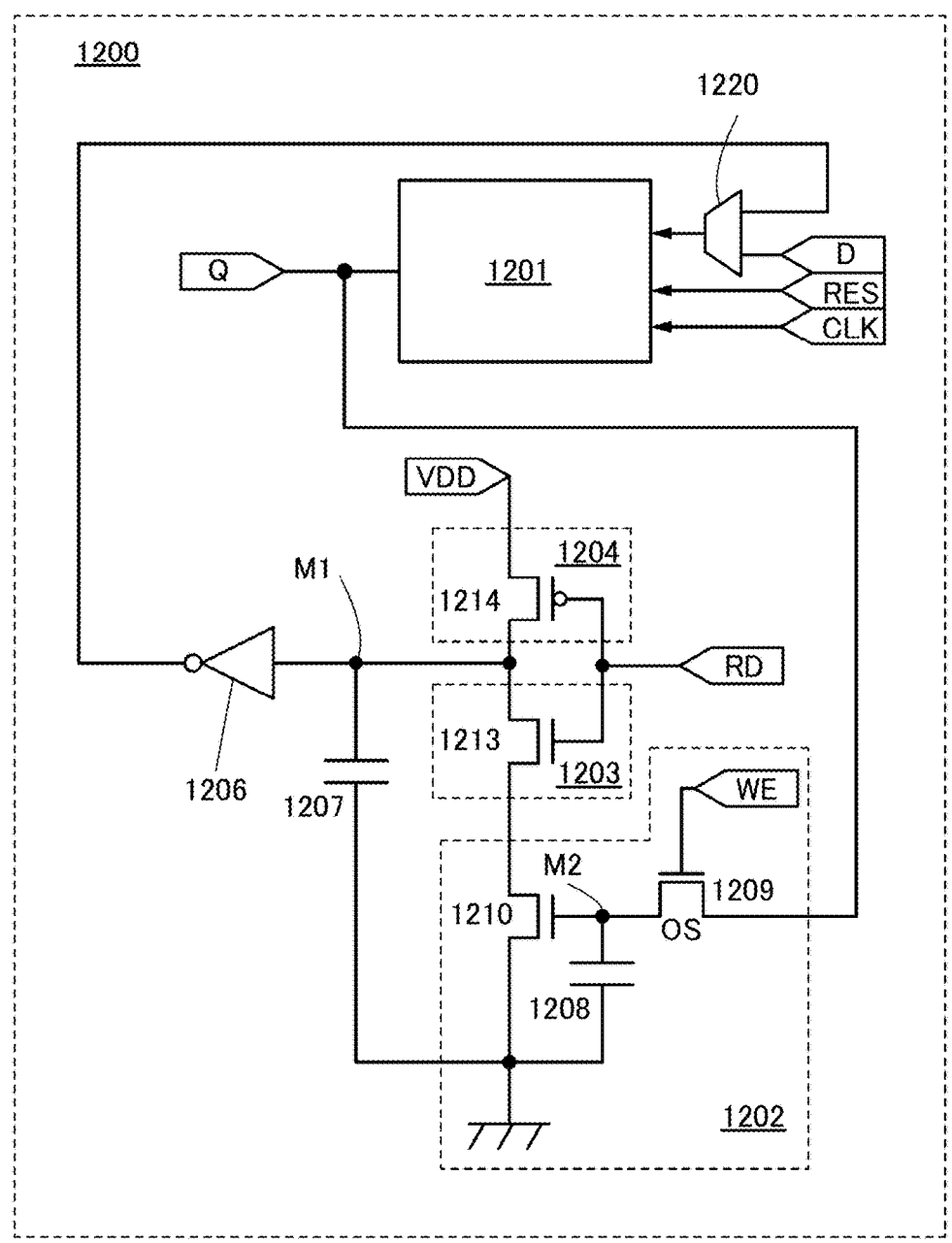
FIG. 53 is a circuit diagram illustrating a semiconductor device of one embodiment of the present invention.

FIG. 53 is an example of a circuit diagram of a memory element 1200 that can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD).

The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 53 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 53, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 53, the transistors included in the memory element 1200 except the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor may be included besides the transistor 1209, and a transistor in which a channel is formed in a film formed using a semiconductor other than an oxide semiconductor or in the substrate 1190 can be used for the rest of the transistors.

As the circuit 1201 in FIG. 53, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the one corresponding to the state (the on state or the off state) of the transistor 1210 is determined in accordance with the signal retained by the capacitor 1208 and the signal can be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP), a programmable logic device (PLD), or a custom LSI, and a radio frequency (RF) device.

<Display Device>

A display device of one embodiment of the present invention is described below with reference to FIGS. 54A to 54C and FIGS. 56A and 56B.

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules:

a module provided with a connector such as an FPC or TCP; a module in which a printed wiring board is provided at the end of TCP; and a module in which an integrated circuit (IC) is mounted directly on a display element by a COG method.

Figure 54A:
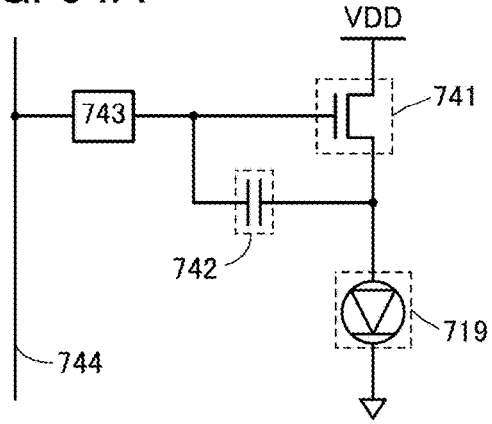
FIGS. 54A to 54C are a circuit diagram, a top view, and a cross-sectional view illustrating a semiconductor device of one embodiment of the present invention.
Figure 54B:
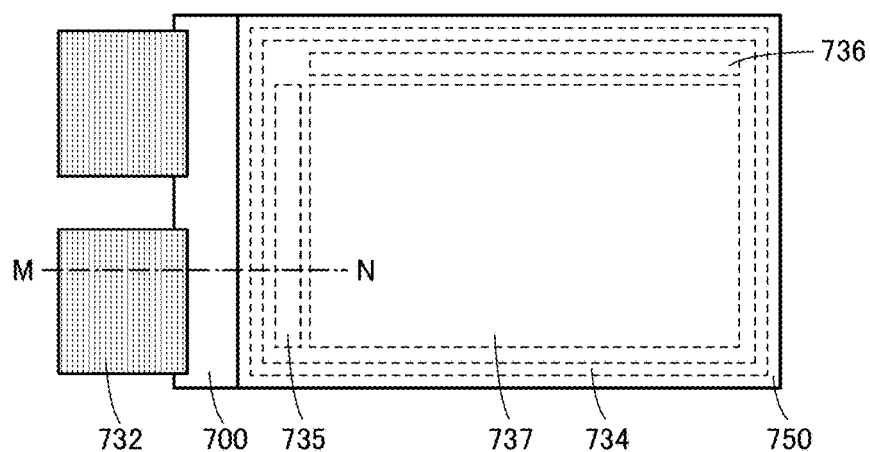
Figure 54C:
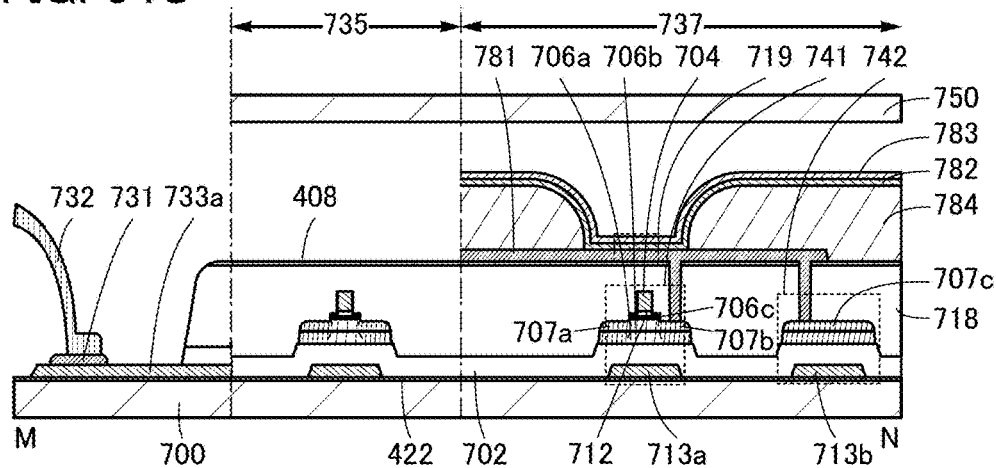

FIGS. 54A to 54C illustrate an example of an EL display device of one embodiment of the present invention. FIG. 54A is a circuit diagram of a pixel in an EL display device. FIG. 54B is a plan view showing the whole of the EL display device.

FIG. 54A illustrates an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Furthermore, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be more than one, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Furthermore, it can be determined that one embodiment of the present invention whose function is specified is disclosed in this specification and the like in some cases. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 54A includes a switching element 743, a transistor 741, a capacitor 742, and a light-emitting element 719.

Note that FIG. 54A and the like each illustrate an example of a circuit structure; therefore, a transistor can be provided additionally. In contrast, for each node in FIG. 54A, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A drain of the transistor 741 is supplied with a power supply potential VDD. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, any of the above-described transistors can be used, for example.

FIG. 54B is a plan view of the EL display device. The EL display device includes a substrate 700, a substrate 750, the insulator 422, the insulator 408, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 54C is a cross-sectional view of the EL display device taken along part of dashed-dotted line M-N in FIG. 54B.

FIG. 54C illustrates a structure in which the transistor 741 includes a conductor 713a over the substrate 700, an insulator 702 over the conductor 713a, an insulator 706a and a semiconductor 706b that are over the insulator 702 and overlap with the conductor 713a, an insulator 706c over the semiconductor 706b, an insulator 712 over the insulator 706c, and a conductor 704 that is over the insulator 712 and overlaps with the semiconductor 706b. The insulator 706a and the semiconductor 706b have a region 707a and a region 707b. Note that this structure of the transistor 741 is just an example; a structure different from that illustrated in FIG. 54C may be employed.

Thus, in the transistor 741 illustrated in FIG. 54C, the conductor 713a functions as a gate electrode, the insulator 702 functions as a gate insulator, the region 707a functions as a source, the region 707b functions as a drain, the insulator 712 functions as a gate insulator, and the conductor 704 functions as a gate electrode. Note that in some cases, electrical characteristics of the semiconductor 706b change if light enters the semiconductor 706b. To prevent this, it is preferable that one or more of the conductor 713a, the region 707a, the region 707b, and the conductor 704 have a light-blocking property.

In the structure illustrated in FIG. 54C, the capacitor 742 includes a conductor 713b over the substrate 700, the insulator 702 over the conductor 713b, and an electrode 707c over the insulator 702.

In the capacitor 742, the conductor 713b functions as one electrode, and the electrode 707c functions as the other electrode.

The electrode 707c is formed on the same surface as the insulator 706a and the semiconductor 706b of the transistor 741. Thus, the capacitor 742 can be formed using a film of the transistor 741. The conductor 713a and the conductor 713b are preferably conductors of the same kind because the conductor 713a and the conductor 713b can be formed through the same step.

An insulator 718 is provided over the transistor 741 and the capacitor 742. Here, the insulator 718 may have an opening portion reaching the region 707b that functions as the source of the transistor 741. A conductor 781 is provided over the insulator 718. The conductor 781 may be electrically connected to the transistor 741 through the opening in the insulator 718.

A partition wall 784 having an opening reaching the conductor 781 is provided over the conductor 781. A light-emitting layer 782 in contact with the conductor 781 through the opening provided in the partition wall 784 is provided over the partition wall 784. A conductor 783 is provided over the light-emitting layer 782. A region where the conductor 781, the light-emitting layer 782, and the conductor 783 overlap with one another functions as the light-emitting element 719.

The insulator 422 and the insulator 408 have barrier properties. This means that the display device illustrated in FIGS. 54A to 54C has a structure in which the transistor 741 is surrounded by insulators having barrier properties. Note that one or more of the insulator 422 and the insulator 408 are not necessarily provided.

Note that a transistor, a capacitor, a wiring layer, and the like may be stacked to make the EL display device highly integrated.

Figure 55:
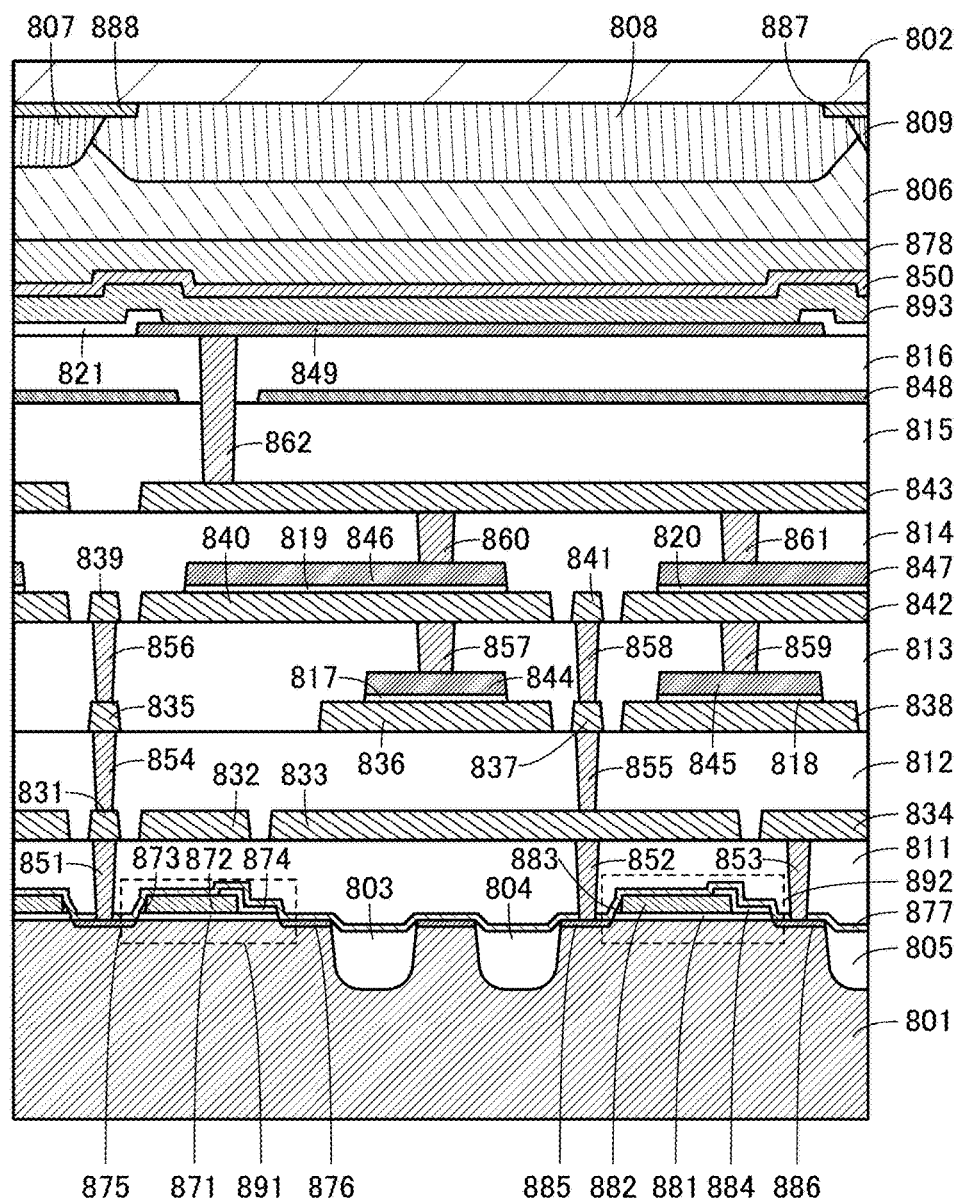
FIG. 55 is a cross-sectional view of a semiconductor device of one embodiment of the present invention.

FIG. 55 is a cross-sectional view illustrating a pixel of an EL display device fabricated over a semiconductor substrate.

The EL display device shown in FIG. 55 includes a semiconductor substrate 801, a substrate 802, an insulator 803, an insulator 804, an insulator 805, an adhesive layer 806, a filter 807, a filter 808, a filter 809, an insulator 811, an insulator 812, an insulator 813, an insulator 814, an insulator 815, an insulator 816, an insulator 817, an insulator 818, an insulator 819, an insulator 820, an insulator 821, a conductor 831, a conductor 832, a conductor 833, a conductor 834, a conductor 835, a conductor 836, a conductor 837, a conductor 838, a conductor 839, a conductor 840, a conductor 841, a conductor 842, a conductor 843, a conductor 844, a conductor 845, a conductor 846, a conductor 847, a conductor 848, a conductor 849, a conductor 850, a conductor 851, a conductor 852, a conductor 853, a conductor 854, a conductor 855, a conductor 856, a conductor 857, a conductor 858, a conductor 859, a conductor 860, a conductor 861, a conductor 862, an insulator 871, a conductor 872, an insulator 873, an insulator 874, a region 875, a region 876, an insulator 877, an insulator 878, an insulator 881, a conductor 882, an insulator 883, an insulator 884, a region 885, a region 886, a layer 887, a layer 888, and a light-emitting layer 893.

A transistor 891 includes the semiconductor substrate 801, the insulator 871, the conductor 872, the insulator 873, the insulator 874, and the region 875 and the region 876. The semiconductor substrate 801 functions as a channel formation region. The insulator 871 has a function of a gate insulator. The conductor 872 has a function of a gate electrode. The insulator 873 has a function of a sidewall insulator. The insulator 874 has a function of a sidewall insulator. The region 875 has a function of a source region and/or a drain region. The region 876 has a function of a source region and/or a drain region.

The conductor 872 includes a region overlapping with part of the semiconductor substrate 801 with the insulator 871 therebetween. The region 875 and the region 876 are regions where impurities are added to the semiconductor substrate 801. In the case where the semiconductor substrate 801 is a silicon substrate, the region 875 and the region 876 may each be a region including a silicide, such as tungsten silicide, titanium silicide, cobalt silicide, or nickel silicide. The region 875 and the region 876 can be formed in a self-aligned manner using the conductor 872, the insulator 873, the insulator 874, and the like, and the region 875 and the region 876 are accordingly located in the semiconductor substrate 801 such that a channel formation region is provided between the region 875 and the region 876.

Since the transistor 891 includes the insulator 873, the region 875 can be distanced from the channel formation region. Owing to the insulator 873, the transistor 891 can be prevented from being broken or degraded by an electric field generated in the region 875. Since the transistor 891 includes the insulator 874, the region 876 can be distanced from the channel formation region. Owing to the insulator 874, the transistor 891 can be prevented from being broken or degraded by an electric field generated in the region 876. Note that in the transistor 891, the distance between the region 876 and a channel formation region is longer than the distance between the region 875 and a channel formation region. This structure can enable both high on-state current and high reliability in the case where a potential difference between the region 876 and a channel formation region is likely to be larger than a potential difference between the region 875 and a channel formation region in operation of the transistor 891.

A transistor 892 includes the semiconductor substrate 801, the insulator 881, the conductor 882, the insulator 883, the insulator 884, the region 885, and the region 886. The semiconductor substrate 801 has a function of a channel formation region. The insulator 881 has a function of a gate insulator. The conductor 882 has a function of a gate electrode. The insulator 883 has a function of a sidewall insulator. The insulator 884 has a function of a sidewall insulator. The region 885 has a function of a source region and/or a drain region. The region 886 has a function of a source and/or a drain region.

The conductor 882 includes a region overlapping with part of the semiconductor substrate 801 with the insulator 881 therebetween. The region 885 and the region 886 are regions where impurities are added to the semiconductor substrate 801. In the case where the semiconductor substrate 801 is a silicon substrate, the region 885 and the region 886 are a region including a silicide. The region 885 and the region 886 can be formed in a self-aligned manner using the conductor 882, the insulator 883, the insulator 884, and the like, and the region 885 and the region 886 are accordingly located in the semiconductor substrate 801 such that a channel formation region is provided between the region 885 and the region 886.

Since the transistor 892 includes the insulator 883, the region 885 can be distanced from the channel formation region. Owing to the insulator 883, the transistor 892 can be prevented from being broken or degraded by an electric field generated in the region 885. Since the transistor 892 includes the insulator 884, the region 886 can be distanced from the channel formation region. Owing to the insulator 884, the transistor 892 can be prevented from being broken or degraded by an electric field generated in the region 886. Note that in the transistor 892, the distance between the region 886 and a channel formation region is longer than the distance between the region 885 and a channel formation region. This structure can enable both high on-state current and high reliability in the case where a potential difference between the region 886 and a channel formation region is likely to be larger than a potential difference between the region 885 and a channel formation region in operation of the transistor 892.

The insulator 877 is located so as to cover the transistor 891 and the transistor 892 and has a function of a protective film for the transistor 891 and the transistor 892. The insulator 803, the insulator 804, and the insulator 805 have a function of separating elements. For example, the transistor 891 and the transistor 892 are isolated from each other with the insulator 803 and the insulator 804 therebetween.

Each of the conductor 851, the conductor 852, the conductor 853, the conductor 854, the conductor 855, the conductor 856, the conductor 857, the conductor 858, the conductor 859, the conductor 860, the conductor 861, and the conductor 862 has a function of electrically connecting elements, an element and a wiring, and wirings, and the like; therefore these conductors can also be referred to as a wiring or a plug.

Each of the conductor 831, the conductor 832, the conductor 833, the conductor 834, the conductor 835, the conductor 836, the conductor 837, the conductor 838, the conductor 839, the conductor 840, the conductor 841, the conductor 842, the conductor 843, the conductor 844, the conductor 845, the conductor 846, the conductor 847, the conductor 849, and the conductor 850 has a function of a wiring, an electrode, and/or a light-blocking layer.

For example, the conductor 836 and the conductor 844 each have a function of an electrode of a capacitor including the insulator 817; the conductor 838 and the conductor 845 each have a function of an electrode of a capacitor including the insulator 818; the conductor 840 and the conductor 846 each have a function of an electrode of a capacitor including the insulator 819; and the conductor 842 and the conductor 847 each have a function of an electrode of a capacitor including the insulator 820. Note that the conductor 836 and the conductor 838 may be electrically connected to each other. The conductor 844 and the conductor 845 may be electrically connected to each other. The conductor 840 and the conductor 842 may be electrically connected to each other. The conductor 846 and the conductor 847 may be electrically connected to each other.

Each of the insulator 811, the insulator 812, the insulator 813, the insulator 814, the insulator 815, and the insulator 816 has a function of an interlayer insulator. The top surfaces of the insulator 811, the insulator 812, the insulator 813, the insulator 814, the insulator 815, and the insulator 816 are preferably flat.

The conductor 831, the conductor 832, the conductor 833, and the conductor 834 are provided over the insulator 811. The conductor 851 is provided in an opening in the insulator 811. The conductor 851 electrically connects the conductor 831 and the region 875. The conductor 852 is provided in an opening in the insulator 811. The conductor 852 electrically connects the conductor 833 and the region 885. The conductor 853 is provided in an opening in the insulator 811. The conductor 853 electrically connects the conductor 834 and the region 886.

The conductor 835, the conductor 836, the conductor 837, and the conductor 838 are provided over the insulator 812. The insulator 817 is provided over the conductor 836. The conductor 844 is provided over the insulator 817. The insulator 818 is provided over the conductor 838. The conductor 845 is provided over the insulator 818. The conductor 854 is provided in an opening in the insulator 812. The conductor 854 electrically connects the conductor 835 and the conductor 831. The conductor 855 is provided in an opening in the insulator 812. The conductor 855 electrically connects the conductor 837 and the conductor 833.

The conductor 839, the conductor 840, the conductor 841, and the conductor 842 are provided over the insulator 813. The insulator 819 is provided over the conductor 840. The conductor 846 is provided over the insulator 819. The insulator 820 is provided over the conductor 842. The conductor 847 is provided over the insulator 820. The conductor 856 is provided in an opening in the insulator 813. The conductor 856 electrically connects the conductor 839 and the conductor 835. The conductor 857 is provided in an opening in the insulator 813. The conductor 857 electrically connects the conductor 840 and the conductor 844. The conductor 858 is provided in an opening in the insulator 813. The conductor 858 electrically connects the conductor 841 and the conductor 837. The conductor 859 is provided in an opening in the insulator 813. The conductor 859 electrically connects the conductor 842 and the conductor 845.

The conductor 843 is provided over the insulator 814. The conductor 860 is provided in an opening in the insulator 814. The conductor 860 electrically connects the conductor 843 and the conductor 846. The conductor 861 electrically connects the conductor 843 and the conductor 847.

The conductor 848 is provided over the insulator 815 and may be electrically floating. Note that the conductor 848 is not limited to a conductor as long as it has a function of a light-blocking layer: for example, the conductor 848 may be an insulator or a semiconductor having a light-blocking property.

The conductor 849 is provided over the insulator 816. The insulator 821 is provided over the insulator 816 and the conductor 849. The insulator 821 includes an opening exposing the conductor 849. The light-emitting layer 893 is provided over the conductor 849 and the insulator 821. The conductor 850 is provided over the light-emitting layer 893.

The light-emitting layer 893 emits light by a potential difference between the conductor 849 and the conductor 850; thus, the conductor 849, the conductor 850, and the light-emitting layer 893 form a light-emitting element. Note that the insulator 821 has a function of a partition wall.

The insulator 878 is provided over the conductor 850. The insulator 878 covers the light-emitting element and has a function of a protective insulator. The insulator 878 may have a barrier property or may form a structure in which the light-emitting element is surrounded by insulators having barrier properties, for example.

A substrate having a light-transmitting property can be used as the substrate 802. For example, the substrate 750 can be referred to for the substrate 802. The layer 887 and the layer 888 are provided on the substrate 802. The layer 887 and the layer 888 each have a function of a light-blocking layer. A resin, a metal, or the like can be used for the light-blocking layer. The layer 887 and the layer 888 can improve the contrast and reduce color bleeding in the EL display device.

Each of the filter 807, the filter 808, and the filter 809 has a function of a color filter. The filter 2054 can be referred to for the filter 807, the filter 808, and the filter 809, for example. The filter 808 has a region overlapping with the layer 888, the substrate 802, and the layer 887. The filter 807 has a region overlapping with the filter 808 on the layer 888. The filter 809 has a region overlapping with the filter 808 on the layer 887. The filter 807, the filter 808, and the filter 809 may have different thicknesses, in which case light might be extracted more efficiently from the light-emitting element.

An adhesive layer 806 is provided between the insulator 878 and the filter 807, the filter 808, and the filter 809.

Because the EL display device in FIG. 55 has a stacked-layer structure of the transistor, the capacitor, the wiring layer, and the like, the pixel area can be reduced. A highly integrated EL display device can be provided.

So far, examples of the EL display device are described. Next, an example of a liquid crystal display device is described.

Figure 56A:
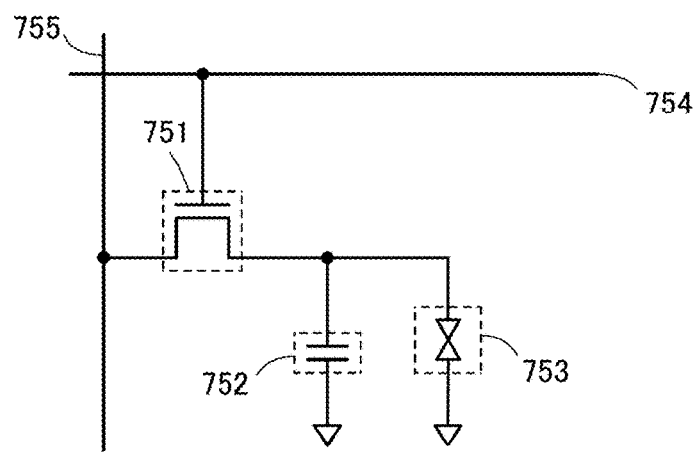
FIGS. 56A and 56B are a circuit diagram and a cross-sectional view illustrating a semiconductor device of one embodiment of the present invention.

FIG. 56A is a circuit diagram illustrating a configuration example of a pixel of a liquid crystal display device. A pixel shown in FIGS. 56A and 56B includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring to which a common potential is supplied.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the other electrode of the liquid crystal element 753.

Figure 56B:
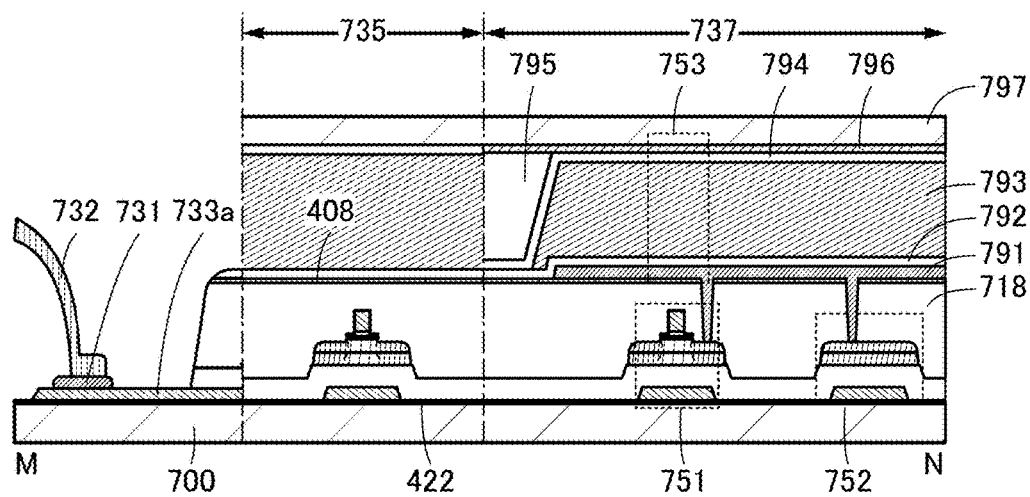

Note that the description of the liquid crystal display device is made on the assumption that the plan view of the liquid crystal display device is similar to that of the EL display device. FIG. 56B is a cross-sectional view of the liquid crystal display device taken along dashed-dotted line M-N in FIG. 54B. In FIG. 56B, the FPC 732 is connected to the wiring 733a via the terminal 731. Note that the wiring 733a may be formed using the same kind of conductor as the conductor of the transistor 751 or using the same kind of semiconductor as the semiconductor of the transistor 751.

For the transistor 751, the description of the transistor 741 is referred to. For the capacitor 752, the description of the capacitor 742 is referred to. Note that the structure of the capacitor 752 in FIG. 56B corresponds to, but is not limited to, the structure of the capacitor 742 in FIG. 54C.

Note that in the case where an oxide semiconductor is used as the semiconductor of the transistor 751, the off-state current of the transistor 751 can be extremely low. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

The insulator 718 is provided over the transistor 751 and the capacitor 752. The insulator 718 has an opening reaching the transistor 751. A conductor 791 is provided over the insulator 718. The conductor 791 is electrically connected to the transistor 751 through the opening in the insulator 718.

The insulator 422 and the insulator 408 have barrier properties. This means that the display device illustrated in FIGS. 56A and 56B has a structure in which the transistor 751 is surrounded by insulators having barrier properties. Note that one or more of the insulator 422 and the insulator 408 are not necessarily provided.

An insulator 792 functioning as an alignment film is provided over the conductor 791. A liquid crystal layer 793 is provided over the insulator 792. An insulator 794 functioning as an alignment film is provided over the liquid crystal layer 793. A spacer 795 is provided over the insulator 794. A conductor 796 is provided over the spacer 795 and the insulator 794. A substrate 797 is provided over the conductor 796.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of an EL element; a light-emitting diode (LED) for white, red, green, blue, or the like; a transistor (a transistor that emits light depending on current); an electron emitter; a liquid crystal element; electronic ink; an electrophoretic element; a plasma display panel (PDP); a display element using micro electro mechanical systems (MEMS) such as a grating light valve (GLV), a digital micromirror device (DMD), a digital micro shutter (DMS), an interferometric modulator display (IMOD) element, a MEMS shutter display element, an optical-interference-type MEMS display element, or a piezoelectric ceramic display; an electrowetting element; a display element including a carbon nanotube; and quantum dots. Other than the above, display media whose contrast, luminance, reflectivity, transmittance, or the like is changed by electrical or magnetic effect may be included.

Note that examples of display devices having EL elements include an EL display. Examples of a display device including an electron emitter include a field emission display (FED), an SED-type flat panel display (SED: surface-conduction electron-emitter display), and the like. Examples of display devices containing quantum dots in each pixel include a quantum dot display. The quantum dots are placed in a display element, in a backlight, or between the backlight and the display element. With the use of the quantum dots, a display device with high color purity can be fabricated. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

Note that in the case of using an LED chip, graphene or graphite may be provided under an electrode or a nitride semiconductor of the LED chip. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED chip can be formed. Note that an AlN layer may be provided between the n-type GaN semiconductor including crystals and graphene or graphite. The GaN semiconductors included in the LED chip may be formed by MOCVD. Note that when the graphene is provided, the GaN semiconductors included in the LED chip can also be formed by a sputtering method.

In a display device including MEMS, a dry agent may be provided in a space where a display element is sealed (or between an element substrate over which the display element is placed and a counter substrate opposed to the element substrate, for example). The dry agent can remove moisture and thus can prevent malfunction or degradation of the MEMS or the like.

<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 57A to 57F illustrate specific examples of these electronic devices.

Figure 57A:
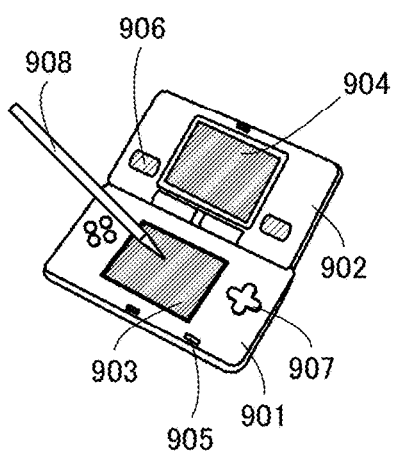
FIGS. 57A to 57F are perspective views each illustrating an electronic device of one embodiment of the present invention.

FIG. 57A illustrates a portable game console including a housing 901, a housing 902, a display portion 903, a display portion 904, a microphone 905, a speaker 906, an operation key 907, a stylus 908, and the like. Although the portable game console in FIG. 57A has the two display portions 903 and 904, the number of display portions included in a portable game console is not limited to this.

Figure 57B:
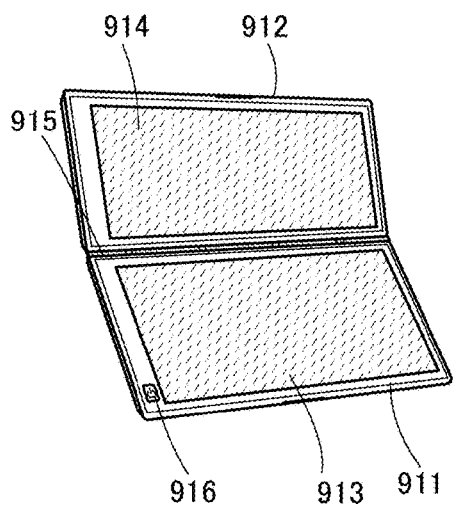

FIG. 57B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched in accordance with the angle at the joint 915 between the first housing 911 and the second housing 912. A display device with a position input function may be used as at least one of the first display portion 913 and the second display portion 914. Note that the position input function can be added by providing a touch panel in a display device. Alternatively, the position input function can be added by providing a photoelectric conversion element called a photosensor in a pixel portion of a display device.

Figure 57C:
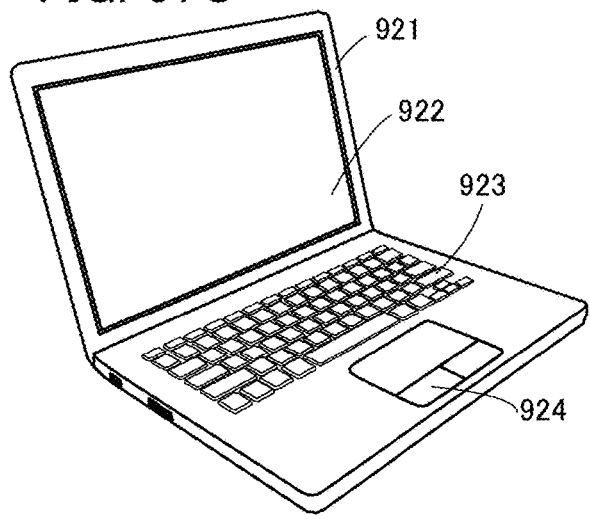

FIG. 57C illustrates a notebook personal computer, which includes a housing 921, a display portion 922, a keyboard 923, a pointing device 924, and the like.

Figure 57D:
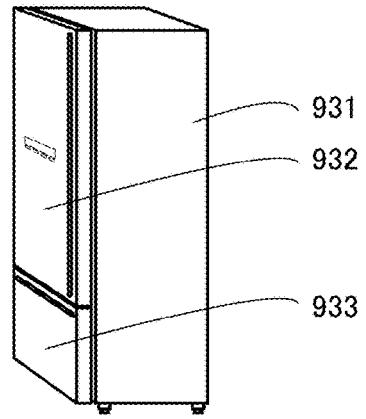

FIG. 57D illustrates an electric refrigerator-freezer, which includes a housing 931, a door for a refrigerator 932, a door for a freezer 933, and the like.

Figure 57E:
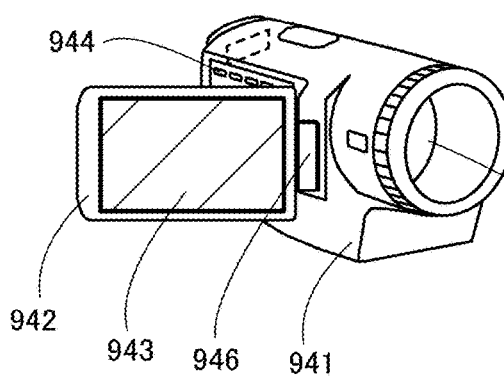

FIG. 57E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 57F:
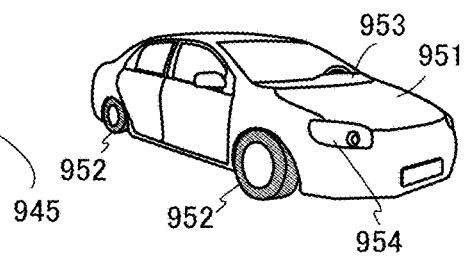

FIG. 57F illustrates a car including a car body 951, wheels 952, a dashboard 953, lights 954, and the like.

<Electronic Device with Curved Display Region or Curved Light-Emitting Region>

Electronic devices with curved display regions or curved light-emitting regions, which are embodiments of the present invention, will be described below with reference to FIGS. 58A1, 58A2, 58A3, 58B1, 58B2, 58C1, and 58C2. Here, information devices, in particular, portable information devices (portable devices) are described as examples of the electronic devices. The portable information devices include, for example, mobile phone devices (e.g., phablets and smartphones) and tablet terminals (slate PCs).

FIG. 58A1 is a perspective view illustrating the outward form of a portable device 1300A. FIG. 58A2 is a top view illustrating the portable device 1300A. FIG. 58A3 illustrates a usage state of the portable device 1300A.

FIGS. 58B1 and 58B2 are perspective views illustrating the outward form of a portable device 1300B.

FIGS. 58C1 and 58C2 are perspective views illustrating the outward form of a portable device 1300C.

<Portable Device>

The portable device 1300A has one or more of a telephone function, an email creating and reading function, a notebook function, an information browsing function, and the like.

A display portion of the portable device 1300A is provided along plural surfaces of a housing. In that case, for example, a flexible display device may be provided along the inner side of the housing. Accordingly, text data, image data, or the like can be displayed on a first region 1311 and/or a second region 1312.

Note that images used for three operations can be displayed on the first region 1311 (see FIG. 58A1), for example. Furthermore, text data or the like can be displayed on the second region 1312 as indicated by dashed rectangles in the drawing (see FIG. 58A2).

In the case where the second region 1312 is on the upper portion of the portable device 1300A, a user can easily see text data or image data displayed on the second region 1312 of the portable device 1300A while the portable device 1300A is placed in a breast pocket of the user's clothes (see FIG. 58A3). The user can see, for example, the phone number, name, or the like of the caller of an incoming call, from above the portable device 1300A.

The portable device 1300A may include an input device or the like between the display device and the housing, in the display device, or over the housing. As the input device, for example, a touch sensor, a light sensor, or an ultrasonic sensor may be used. In the case where the input device is provided between the display device and the housing or over the housing, for example, a matrix switch type, resistive type, ultrasonic surface acoustic wave type, infrared type, electromagnetic induction type, or electrostatic capacitance type touch panel may be used. In the case where the input device is provided in the display device, an in-cell sensor, an on-cell sensor, or the like may be used.

The portable device 1300A can be provided with a vibration sensor or the like and a memory device that stores a program for shifting a mode into an incoming call rejection mode based on vibration sensed by the vibration sensor or the like. In that case, the user can shift the mode into the incoming call rejection mode by tapping the portable device 1300A over his/her clothes to apply vibration.

The portable device 1300B includes a display portion including the first region 1311 and the second region 1312 and a housing 1310 that supports the display portion.

The housing 1310 has a plurality of bend portions, and the longest bend portion of the housing 1310 is between the first region 1311 and the second region 1312.

The portable device 1300B can be used with the second region 1312 provided along the longest bend portion facing sideward.

The portable device 1300C includes a display portion including the first region 1311 and the second region 1312 and the housing 1310 that supports the display portion.

The housing 1310 has a plurality of bend portions, and the second longest bend portion in the housing 1310 is between the first region 1311 and the second region 1312.

The portable device 1300C can be used with the second region 1312 facing upward.

This application is based on Japanese Patent Application serial no. 2015-134341 filed with Japan Patent Office on Jul. 3, 2015, the entire contents of which are hereby incorporated by reference.

What is claimed is:

1. A method for manufacturing a semiconductor device including a semiconductor, a first insulator, a second insulator, a third insulator, a first conductor, and an opening, the method comprising the steps of:
   forming the first insulator over the semiconductor;
   forming a first layer over the first insulator;
   forming a second layer over the first layer;
   forming an etching mask over the second layer;
   forming a third layer by etching the second layer using the etching mask until the first layer is exposed;
   forming a selective growth layer on a top surface and a side surface of the third layer;
   forming a fourth layer by etching the first layer using the third layer and the selective growth layer until the first insulator is exposed; and
   forming the second insulator by etching the first insulator using the third layer, the selective growth layer, and the fourth layer until the semiconductor is exposed,
   wherein the second insulator is provided over the semiconductor,
   wherein the opening overlaps with part of the semiconductor and penetrates the second insulator,
   wherein the third insulator includes a region in contact with a side surface and a bottom surface of the opening, and
   wherein the first conductor overlaps with the semiconductor with the second insulator positioned between the first conductor and the fourth layer.

2. The method for manufacturing a semiconductor device according to claim 1, wherein the second layer includes silicon.

3. The method for manufacturing a semiconductor device according to claim 1, wherein the selective growth layer is formed using a source gas including silicon and halogen.

4. The method for manufacturing a semiconductor device according to claim 1, wherein the semiconductor includes an oxide semiconductor.

5. The method for manufacturing a semiconductor device according to claim 1, wherein the semiconductor includes silicon.

6. A method for manufacturing a semiconductor device including a semiconductor, a first insulator, a second insulator, a third insulator, a first conductor, a second conductor, a third conductor, and an opening, the method comprising the steps of:
   forming the first insulator over the semiconductor and a first conductor;
   forming a first layer over the semiconductor and the first conductor;
   forming a second layer over the first layer;
   forming an etching mask over the second layer;
   forming a third layer by etching the second layer using the etching mask until the first layer is exposed;
   forming a selective growth layer on a top surface and a side surface of the third layer;
   forming a fourth layer by etching the first layer using the third layer and the selective growth layer until the first insulator is exposed; and
   forming a second insulator, a second conductor, and a third conductor by etching the first insulator and the first conductor using the third layer, the selective growth layer, and the fourth layer until the semiconductor is exposed,
   wherein the second insulator is provided over the semiconductor,
   wherein the opening overlaps with part of the semiconductor and penetrates the first second insulator,
   wherein the third insulator includes a region in contact with a side surface and a bottom surface of the opening,
   wherein the second conductor and the third conductor each overlap the semiconductor with the second insulator positioned between the first conductor and the second conductor, and the fourth layer, and
   wherein the second conductor and the third conductor are each provided between the semiconductor and the second insulator.

7. The method for manufacturing a semiconductor device according to claim 6, wherein the second layer includes silicon.

8. The method for manufacturing a semiconductor device according to claim 6, wherein the selective growth layer is formed using a source gas including silicon and halogen.

9. The method for manufacturing a semiconductor device according to claim 6, wherein the semiconductor includes an oxide semiconductor.

10. The method for manufacturing a semiconductor device according to claim 6, wherein the semiconductor includes silicon.

* * * * *

UNITED STATES PATENT AND TRADEMARK OFFICE
CERTIFICATE OF CORRECTION

PATENT NO. : 9,917,209 B2
APPLICATION NO. : 15/192312
DATED : March 13, 2018
INVENTOR(S) : Yuta Endo et al.

It is certified that error appears in the above-identified patent and that said Letters Patent is hereby corrected as shown below:

Column 76, Line 35, in Claim 6, remove "first" before "second insulator".

Signed and Sealed this
Thirty-first Day of July, 2018

Andrei Iancu
*Director of the United States Patent and Trademark Office*